(12) United States Patent
Sinha et al.

(10) Patent No.: US 12,408,317 B2
(45) Date of Patent: Sep. 2, 2025

(54) SRAM MACRO DESIGN ARCHITECTURE

(71) Applicant: Apple Inc., Cupertino, CA (US)

(72) Inventors: Saurabh P. Sinha, Austin, TX (US);
Shahzad Nazar, Fremont, CA (US);
Xin Miao, Saratoga, CA (US); Emre Alptekin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 182 days.

(21) Appl. No.: 18/448,634

(22) Filed: Aug. 11, 2023

(65) Prior Publication Data
US 2024/0107738 A1   Mar. 28, 2024

Related U.S. Application Data

(60) Provisional application No. 63/376,800, filed on Sep. 23, 2022, provisional application No. 63/376,802, (Continued)

(51) Int. Cl.
| H10B 10/00 | (2023.01) |
| H01L 23/528 | (2006.01) |
| H10D 30/63 | (2025.01) |
| H10D 64/23 | (2025.01) |
| H10D 64/27 | (2025.01) |

(Continued)

(52) U.S. Cl.
CPC ........ H10B 10/125 (2023.02); H01L 23/5286 (2013.01); H10B 10/18 (2023.02); H10D 30/63 (2025.01); H10D 64/252 (2025.01); H10D 64/518 (2025.01); H10D 84/85 (2025.01); H10D 84/856 (2025.01); H10D 89/10 (2025.01); *H10B 10/12* (2023.02)

(58) Field of Classification Search
CPC ...... H10B 10/125; H10B 10/18; H10B 10/12; H01L 23/5286; H10D 30/63; H10D 64/252; H10D 64/518; H10D 84/85; H10D 84/856; H10D 89/10; H10D 30/43; H10D 84/0186; H10D 84/038; H10D 88/00; G06F 30/394
USPC ....................................................... 257/351
See application file for complete search history.

(56) References Cited

U.S. PATENT DOCUMENTS

| 5,391,895 A | 2/1995 | Dreifus |
| 6,853,572 B1 | 2/2005 | Sabharwal |

(Continued)

FOREIGN PATENT DOCUMENTS

| CN | 114695343 A | 7/2022 |
| JP | 4-256357 A | 9/1992 |

(Continued)

OTHER PUBLICATIONS

G. V. Luong, et al. "Strained Silicon Complementary TFET SRAM: Experimental Demonstration and Simulations," IEEE Journal of the Electron Devices Society, vol. 6, Apr. 11, 2018, pp. 1033-1040.
(Continued)

*Primary Examiner* — Tong-Ho Kim
(74) *Attorney, Agent, or Firm* — Kowert, Hood, Munyon, Rankin & Goetzel, P.C.; Gareth M. Sampson; Dean M. Munyon

(57) ABSTRACT

A memory device layout that implements SRAM cells with stacked transistors is disclosed. The memory utilizes both topside metal routing and backside metal routing for routing of bitlines between bit cells with stacked transistors and logic cells coupled to the bit cells.

20 Claims, 41 Drawing Sheets

Related U.S. Application Data filed on Sep. 23, 2022, provisional application No. 63/376,796, filed on Sep. 23, 2022, provisional application No. 63/376,799, filed on Sep. 23, 2022.

(51) Int. Cl.
  *H10D 84/85*      (2025.01)
  *H10D 89/10*      (2025.01)

(56) References Cited

U.S. PATENT DOCUMENTS

| | | | |
|---|---|---|---|
| 8,395,220 | B2 | 3/2013 | Chang et al. |
| 9,178,056 | B2 | 11/2015 | Takaishi |
| 9,543,246 | B2 | 1/2017 | Takaishi |
| 9,899,426 | B2 | 2/2018 | Yang et al. |
| 10,003,759 | B2 | 6/2018 | Fan |
| 10,462,402 | B2 | 10/2019 | Fan |
| 10,734,384 | B1 | 8/2020 | Li et al. |
| 10,840,146 | B1 | 11/2020 | Paul et al. |
| 10,854,276 | B2 | 12/2020 | Kawamura et al. |
| 10,861,852 | B2 | 12/2020 | Li et al. |
| 11,056,489 | B2 | 7/2021 | Do |
| 11,158,368 | B2 | 10/2021 | Vincent et al. |
| 11,296,070 | B2 | 4/2022 | Peng et al. |
| 11,417,651 | B2 | 8/2022 | Li et al. |
| 11,437,283 | B2 | 9/2022 | Lilak et al. |
| 11,444,089 | B2 | 9/2022 | Liaw |
| 11,482,270 | B1 | 10/2022 | Dokania et al. |
| 11,538,814 | B2 | 12/2022 | Hwang et al. |
| 2007/0146008 | A1 | 6/2007 | Tak et al. |
| 2015/0055402 | A1* | 2/2015 | Chen ............ G11C 8/08 365/156 |
| 2015/0085567 | A1* | 3/2015 | Wang ............ G11C 8/08 438/106 |
| 2017/0309527 | A1 | 10/2017 | Cheng et al. |
| 2018/0197787 | A1 | 7/2018 | Anderson et al. |
| 2019/0065656 | A1 | 2/2019 | Chakraborty et al. |
| 2019/0108874 | A1 | 4/2019 | Sinangil et al. |
| 2019/0287957 | A1 | 9/2019 | Anderson et al. |
| 2021/0035967 | A1* | 2/2021 | Liebmann ............ H10D 88/00 |
| 2021/0193669 | A1 | 6/2021 | Ahmed et al. |
| 2021/0265471 | A1 | 8/2021 | Zhou |
| 2021/0313288 | A1 | 10/2021 | Oh |
| 2022/0037528 | A1 | 2/2022 | Chuang et al. |
| 2022/0181258 | A1 | 6/2022 | Liebmann et al. |
| 2022/0208260 | A1 | 6/2022 | Chiang et al. |
| 2022/0336456 | A1 | 10/2022 | Hong et al. |
| 2022/0352179 | A1 | 11/2022 | Yang et al. |
| 2022/0352384 | A1 | 11/2022 | Oota et al. |
| 2023/0320055 | A1 | 10/2023 | Anderson et al. |
| 2024/0008239 | A1 | 1/2024 | Sharma et al. |
| 2024/0105617 | A1 | 3/2024 | Miao et al. |
| 2024/0105709 | A1 | 3/2024 | Sinha et al. |
| 2024/0105727 | A1 | 3/2024 | Miao et al. |
| 2024/0107738 | A1 | 3/2024 | Sinha et al. |

FOREIGN PATENT DOCUMENTS

| | | |
|---|---|---|
| JP | H 04256357 A | 9/1992 |
| JP | 2011-159802 A | 8/2011 |
| JP | 2014-170940 A | 9/2014 |
| KR | 1020080079371 A | 9/2008 |
| KR | 1020210041110 A | 4/2021 |
| KR | 1020220121861 A | 9/2022 |
| TW | 578304 B | 3/2004 |
| TW | 200830432 A | 7/2008 |
| TW | 201330181 A | 7/2013 |
| TW | I478313 B | 3/2015 |
| TW | 201631506 A | 9/2016 |
| TW | 201822343 A | 6/2018 |
| TW | 201937694 A | 9/2019 |
| TW | 202002245 A | 1/2020 |
| TW | 202207228 A | 2/2022 |
| TW | 202209645 A | 3/2022 |
| TW | 202213636 A | 4/2022 |
| TW | I766686 B | 6/2022 |
| TW | 202234595 A | 9/2022 |
| WO | 2020/255656 A1 | 12/2020 |
| WO | 2021/070367 A1 | 4/2021 |

OTHER PUBLICATIONS

Office Action in Taiwanese Appl. No. 112135214 mailed May 9, 2024, 5 pages.

J. Ryckaert et al., The Complementary FET (CFET) for CMOS scaling beyond N3, 2018 IEEE Symposium on VLSI Technology, pp. 141-142.

Office Action in Korean Patent Application No. 10-2023-0122246 mailed Sep. 24, 2024, 4 pages.

* cited by examiner

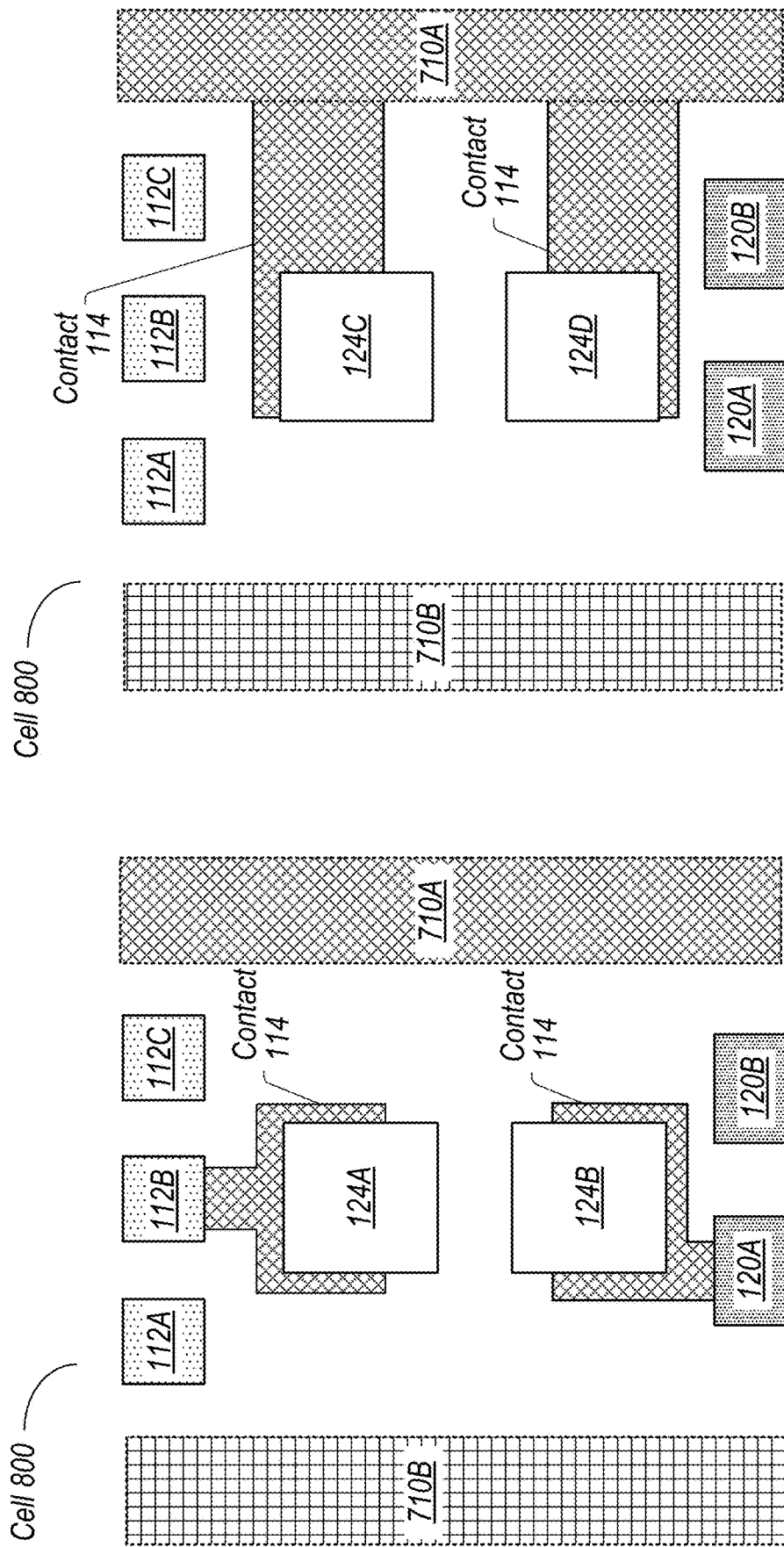

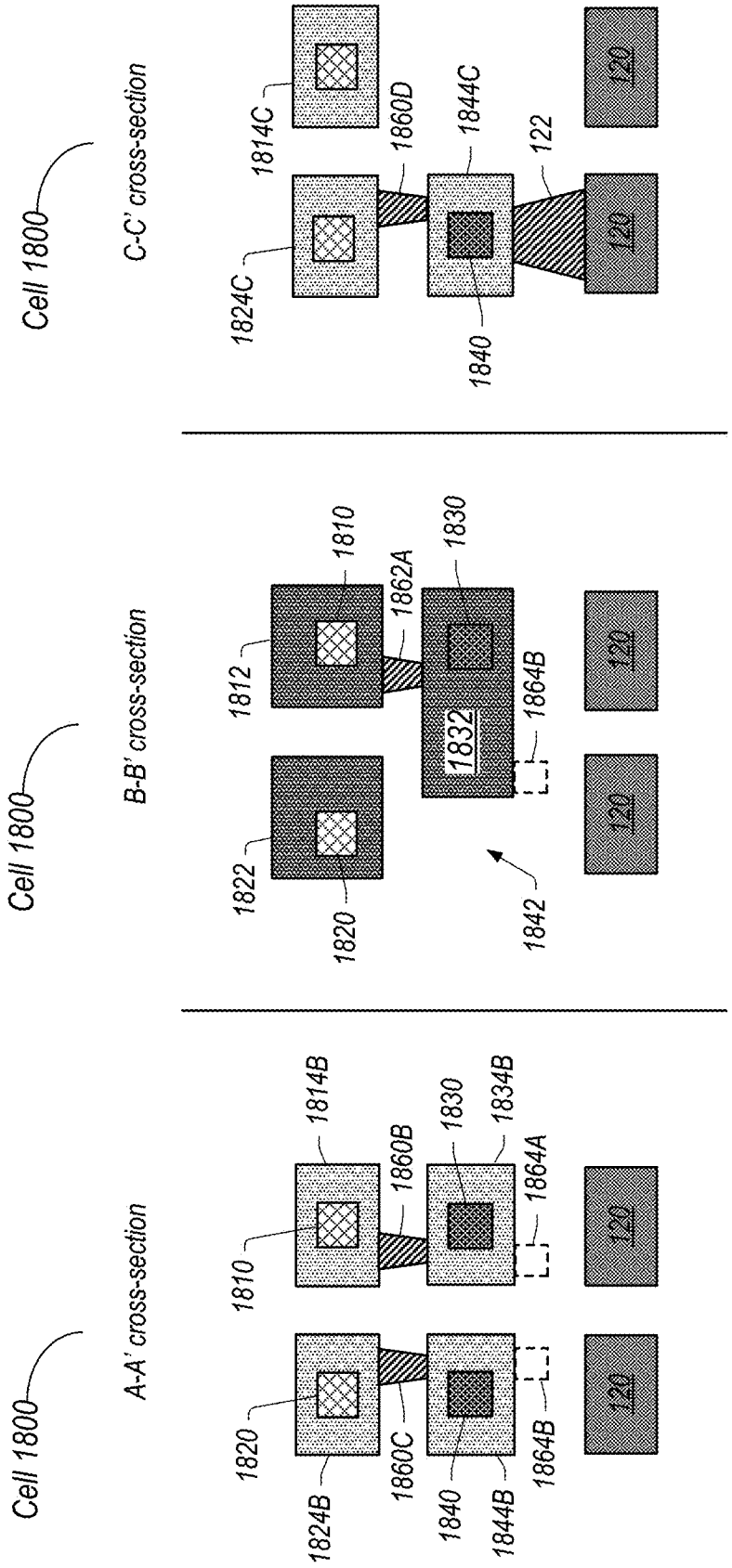

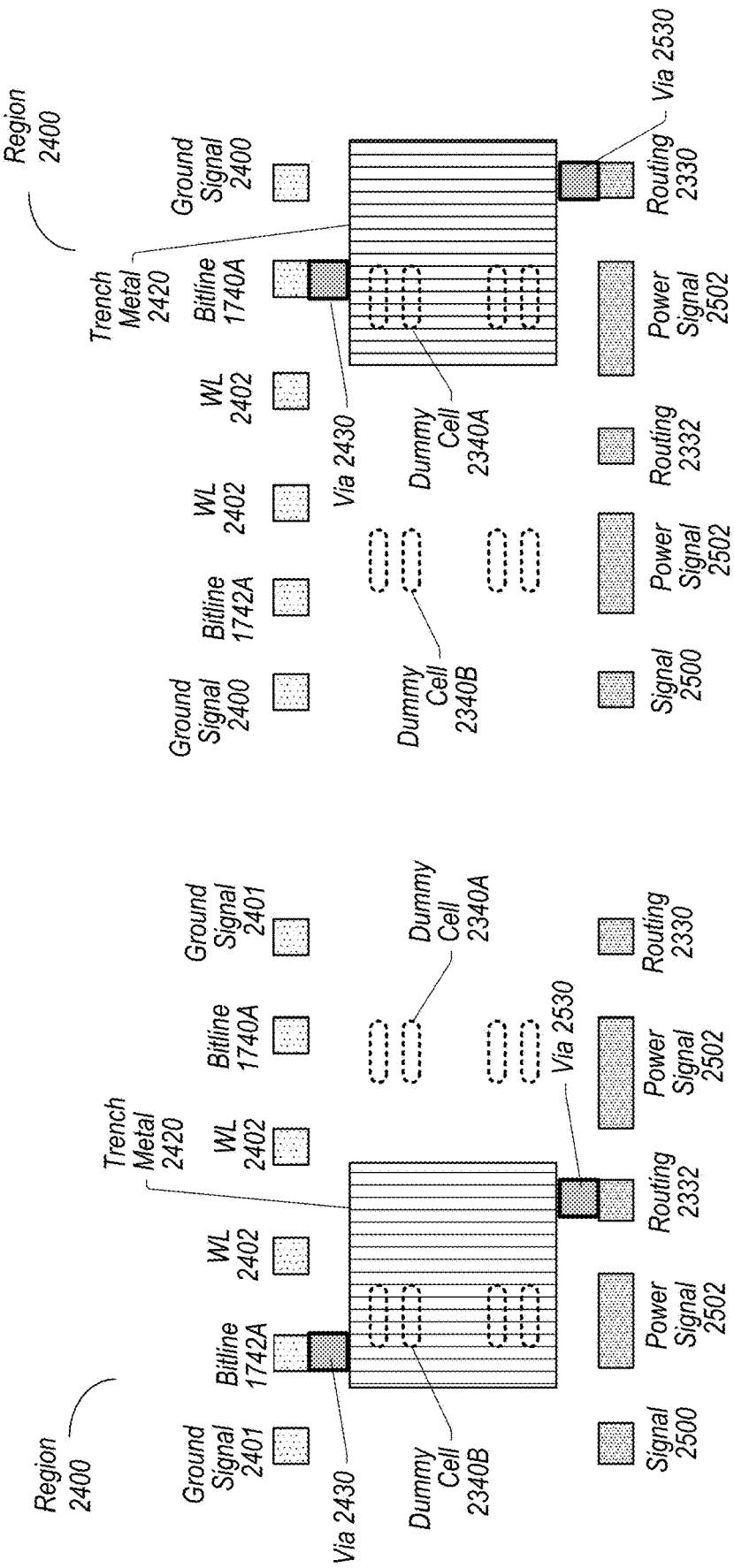

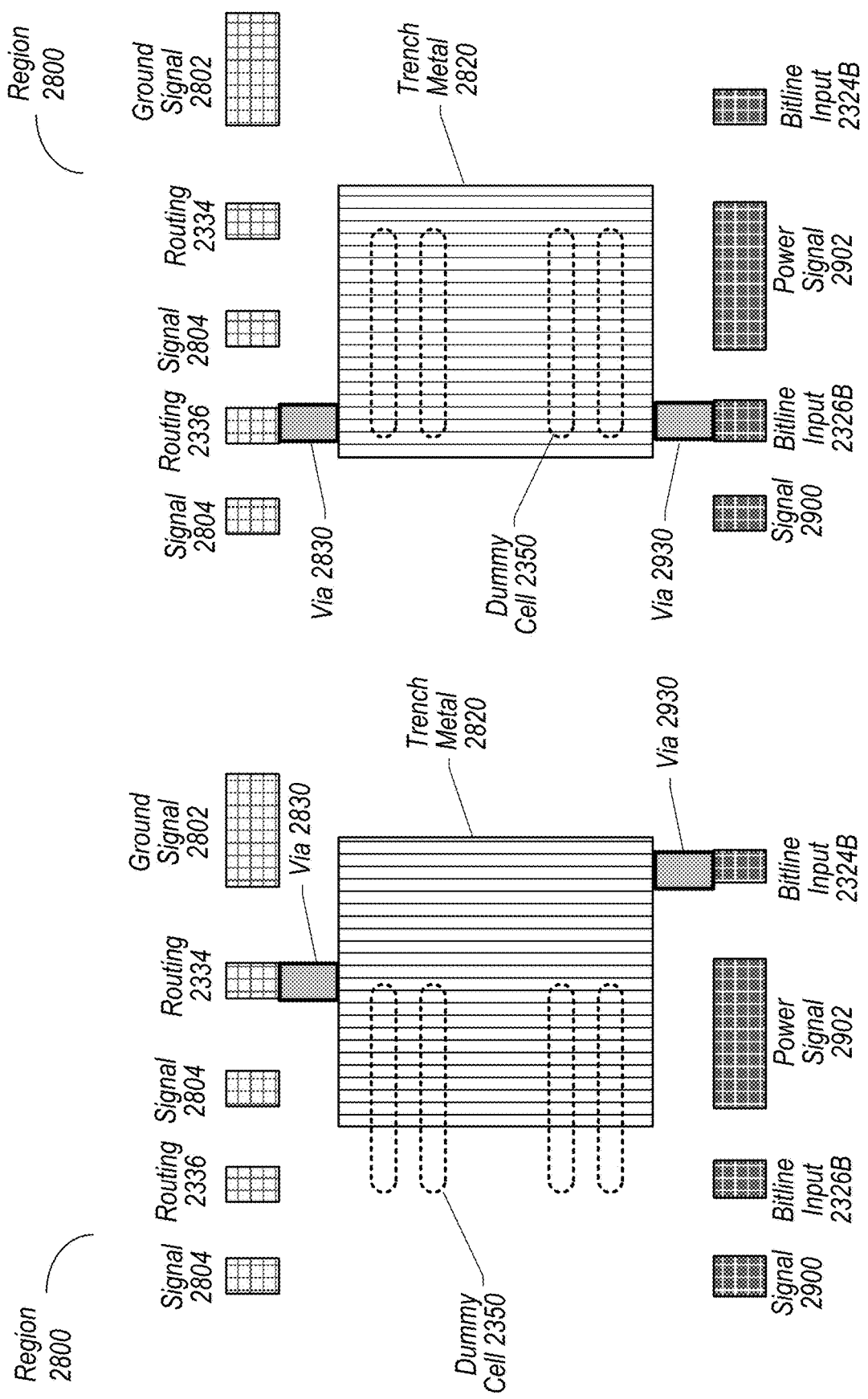

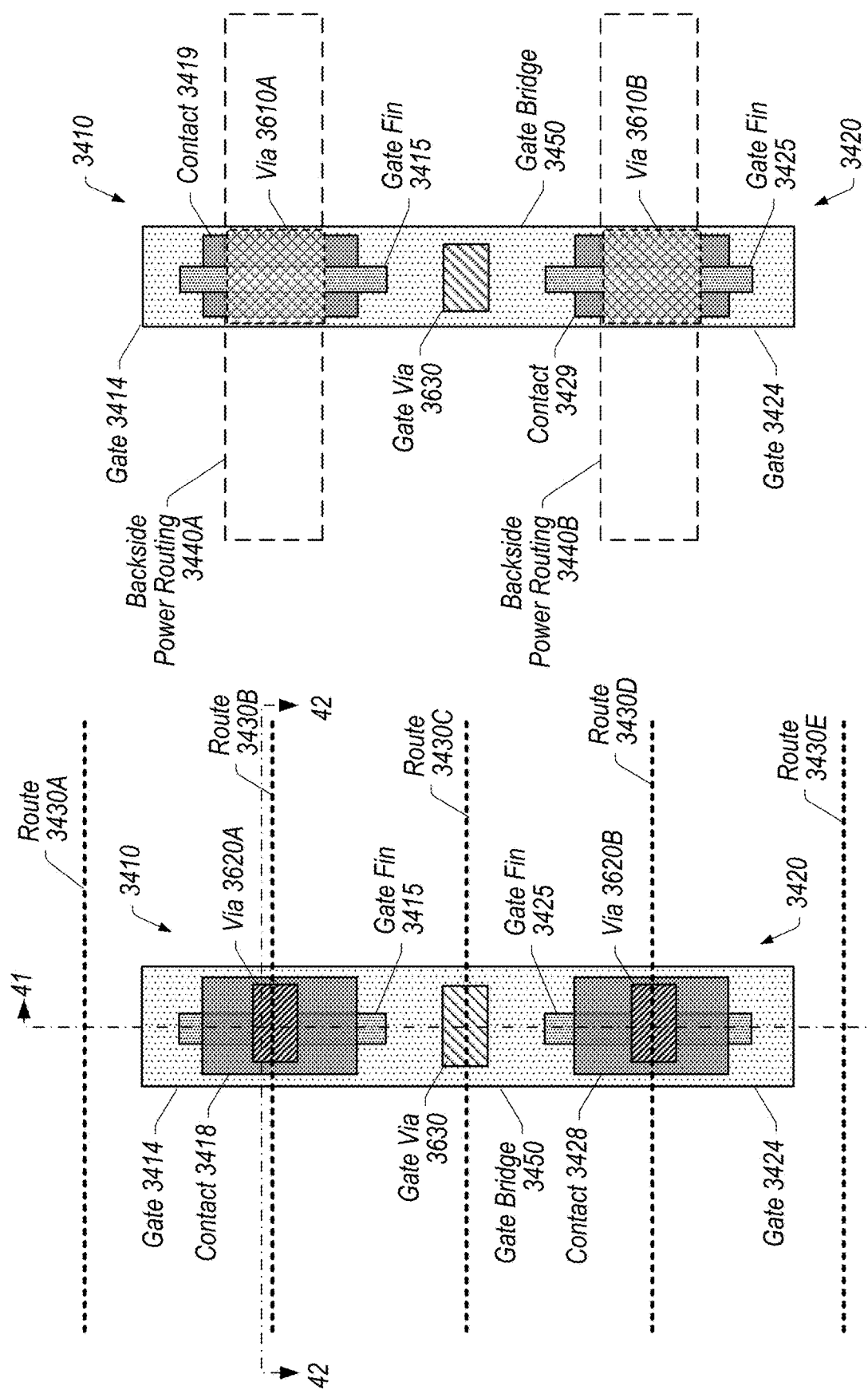

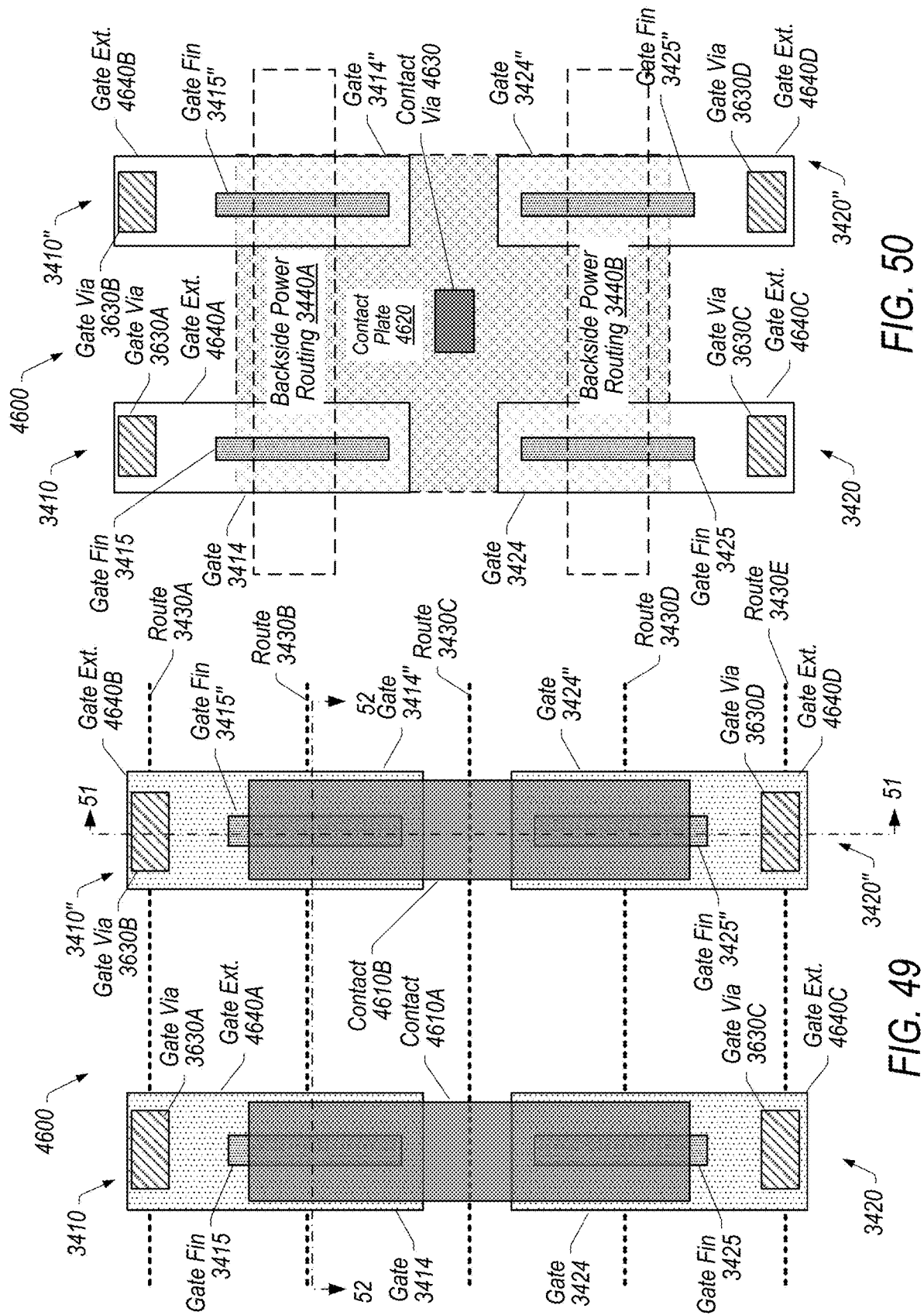

SRAM MACRO DESIGN ARCHITECTURE

PRIORITY CLAIM

The present application claims priority to U.S. Provisional App. Ser. No. 63/376,796, entitled "Stacked FET Standard Cell Architecture," filed Sep. 23, 2022, U.S. Provisional App. Ser. No. 63/376,799, entitled "Stacked SRAM Cell Architecture," filed Sep. 23, 2022, U.S. Provisional App. Ser. No. 63/376,800, entitled "SRAM Macro Design Architecture," filed Sep. 23, 2022, U.S. Provisional App. Ser. No. 63/376,802, entitled "Vertical Transistors With Backside Power Delivery," filed Sep. 23, 2022; the disclosures of each of the above-referenced applications are incorporated by reference herein in their entireties.

BACKGROUND

Technical Field

Embodiments described herein relate to power and signal routing for semiconductor devices. More particularly, embodiments described herein relate to SRAM cells and routing of bitlines to/from SRAM cells through both topside and backside layers.

Description of the Related Art

Standard cells are groups of transistors, passive structures, and interconnect structures that can provide logic functions, storage functions, etc. Current trends in standard cell methodology are towards reducing the size of standard cells while increasing the complexity (e.g., circuit density and number of components or transistors) within standard cells. As standard cell designs become smaller, however, it becomes more difficult to provide access (e.g., connections) to components within the standard cells and within design/manufacturing constraints of standard cells.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 8 is a cross-sectional representation of a cell showing connections to source regions, according to some embodiments.

FIG. 9 is a cross-section representation of a cell showing connections to drain regions, according to some embodiments.

FIG. 22 depicts a cross-sectional representation of a memory cell along the line A-A' shown in both FIGS. 20 and 21.

FIG. 23 depicts a cross-sectional representation of a memory cell along the line B-B' shown in both FIGS. 20 and 21.

FIG. 24 depicts a cross-sectional representation of a memory cell along the line C-C' shown in both FIGS. 20 and 21.

FIG. 28 depicts a cross-sectional representation of the region having dummy cells along the line A-A' shown in both FIGS. 26 and 27.

FIG. 29 depicts a cross-sectional representation of the region having dummy cells along the line B-B' shown in both FIGS. 26 and 27.

FIG. 32 depicts a cross-sectional representation of the region having a dummy cell along the line A-A' shown in both FIGS. 30 and 31.

FIG. 33 depicts a cross-sectional representation of the region having a dummy cell along the line B-B' shown in both FIGS. 30 and 31.

FIG. 39 depicts a topside plan view representation of an inverter cell construction, according to some embodiments.

FIG. 40 depicts a backside plan view representation of an inverter cell construction, according to some embodiments.

FIG. 49 depicts a topside plan view representation of a MUX cell construction, according to some embodiments.

FIG. 50 depicts a backside plan view representation of a MUX cell construction, according to some embodiments.

Figure 1:
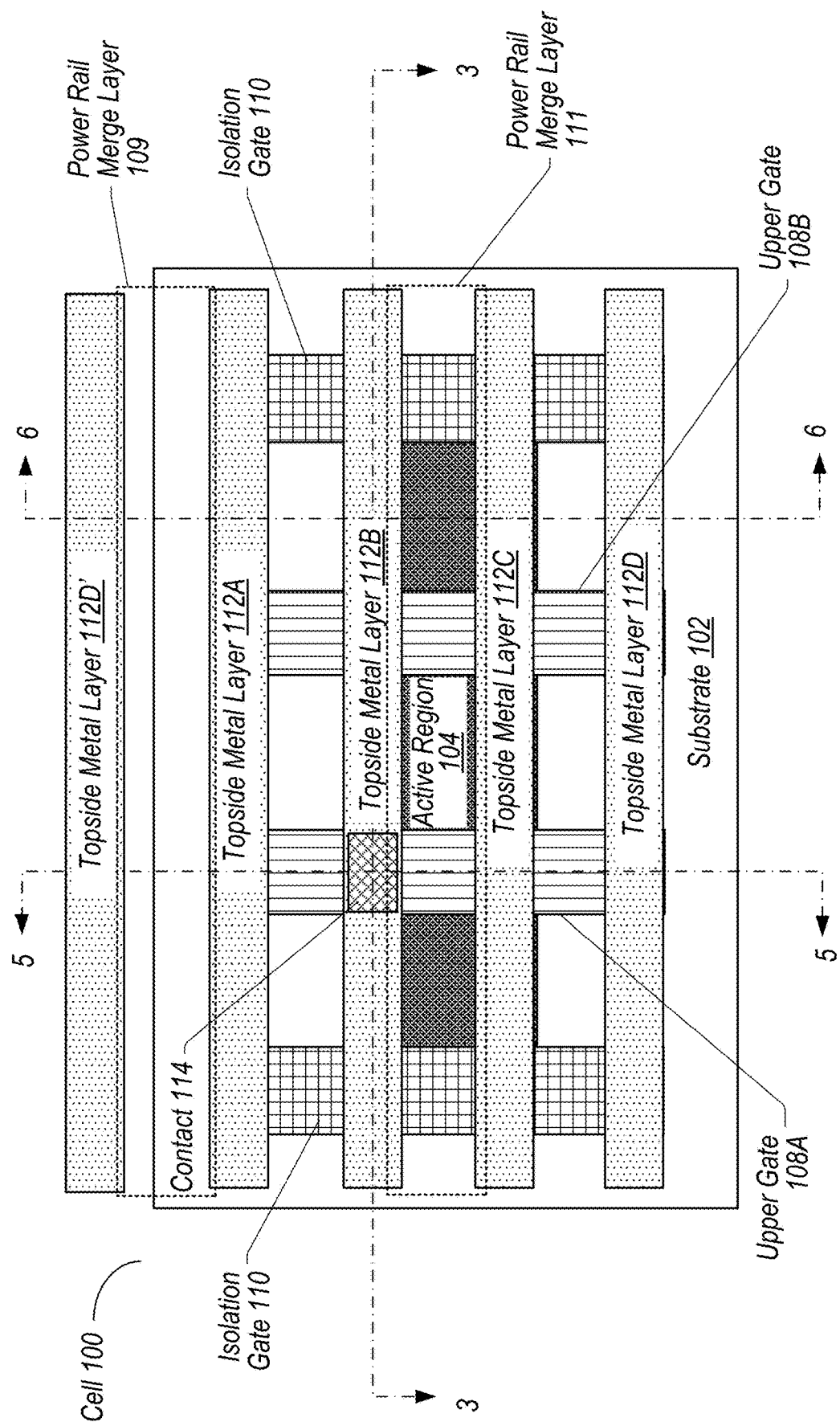
FIG. 1 depicts a topside plan view representation of a standard cell, according to some embodiments.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

As used herein, the term "standard cell" refers to a group of transistor structures, passive structures, and interconnect structures formed on a substrate to provide logic or storage functions that are standard for a variety of implementations. For example, an individual standard cell may be one cell in a library of multiple cells from which various suitable cells may be selected to implement a specific cell design. Integrated circuit cells may also include custom circuit design cells that are individually designed for a particular implementation. Embodiments of circuit design cells described herein may be implemented in various implementations of logic integrated circuits or memory integrated circuits.

Many current designs of cells provide connections and routing for power or signals to transistors or other structures in areas above the transistors. For example, the connections and routing for power or signals may be provided in topside layers of the device. As used herein, the term "topside" refers to areas in a device that are vertically above an active layer of the device (e.g., above a transistor region of the device when viewed in a typical cross-sectional view). For example, topside may refer to components such as contacts or layers that are above a transistor region in a vertical dimension, as depicted in the figures and described herein. In some instances, the term "frontside" may be used interchangeably with the term "topside".

Some recent developments for designs of standard cells move connections and routing for power connections to metal layers below the transistors. For example, the connections and routing for power may be provided in the backside layers of the device. As used herein, the term "backside" refers to areas in a device that are vertically below an active layer of the device (e.g., below a transistor region of the device when viewed in a typical cross-sectional view). For example, backside may refer to components such as contacts or layers that are below a transistor region in a vertical dimension, as depicted in the figures and described herein. It is noted that as used herein, backside elements located below an active layer may be situated above, within, or below a silicon substrate on which the active layer is manufactured. That is, as used herein, "backside" is relative to the active layer, rather than the silicon substrate.

The present disclosure is directed to various implementations of stacked transistors or vertical transistors in integrated circuit cells (e.g., standard cells) that utilize connections to both topside metal layers and backside metal layers. The present inventors have recognized that topside and backside layers can be utilized in specific ways to provide technical and space saving advantages for cell layouts implementing stacked transistors or vertical transistors. The disclosed embodiments implement topside and backside metal layers to provide advantageous cell layouts and routing (e.g., paths) for control signals or power signals within the cell layouts.

Stacked Transistor Standard Cell Designs

Stacked transistors (e.g., where two transistor active regions are stacked vertically above a substrate) may provide various technical and space saving advantages due to the proximity of devices in the transistors. The implementation of stacked transistors in a standard cell, however, is challenging due to design and manufacturing constraints associated with standard cell construction. For example, in standard cells that utilize only topside routing, there are typically not enough paths for routing to both transistors without expanding the size of the standard cell. Standard cells that are limited to topside routing for control signals and backside routing for power signals may also lack the necessary routing and connection availability for two stacked transistors without changes to the size of the standard cell.

The present disclosure contemplates various techniques that implement routing in both topside and backside metal layers that allow two stacked transistors to be placed in a standard cell. Various embodiments of standard cell constructions are disclosed that provide basic building blocks for many different types of devices from simple devices (e.g., inverters and NAND devices) to more complex devices (e.g., complex FETs). The disclosed embodiments provide a compact standard cell construction that allows for the implementation of stacked transistors in various circuit logic schemes.

Certain embodiments disclosed herein have four broad elements: 1) a first metal layer located above a transistor region of an integrated circuit cell structure (e.g., a topside metal layer); 2) a second metal layer located below the transistor region (e.g., a backside metal layer), 3) a pair of vertically stacked transistors in the transistor region, and 4) various possible connection paths for both control signals and power signals between either the first or second metal layers and the first and second transistors. In certain embodiments, the pair of vertically stacked transistors includes heterogeneous transistors (e.g., complementary transistor types such as PMOS and NMOS transistors). In some embodiments, the pair of vertically stacked transistors includes homogeneous transistors (e.g., the transistors are of the same type).

In various embodiments, the control signal and power signal connections are made to implement logic associated with specific integrated circuit devices having multiple transistors for the standard cell constructions described herein. For instance, examples of an inverter device or a NAND gate device that may be implemented based on the standard cell construction are described below. Embodiments of various possible connections for control signals and voltage signals to the stacked transistors within the standard cell construction are also described. A person with knowledge in the art would understand that combinations of these various possible connections may be implemented to generate many different desired circuits based on the stacked transistor structure within the standard cell construction.

In short, the present inventors have recognized that providing various routing paths within a standard cell construction allows the implementation of connections to both topside and backside metal layers for control signals and power signals from stacked transistors positioned within the standard cell construction. The routing paths described herein enable standard cell constructions to be utilized in generating a variety of both simple and complex integrated circuit logic devices based on the stacked transistors within the cells. Additionally, the standard cell construction with stacked transistors described herein provides a scalable template that can be implemented in devices having multiple integrated circuit cells. The standard cell construction with stacked transistors within the present disclosure further enables constructions of cells that can be implemented within current manufacturing constraints and without changes to the size or parameters of current standard cells. As used herein, the term "routing" refers to any combination of metal vias, metal wires, metal traces, etc. that provide a path/route between two structures. Additional embodiments may be contemplated where the metal in "routing" is replaced with an alternative conductive material. For instance, the metal in "routing" may be replaced with a superconductor material, a semiconductor material, or a non-metal conductor.

Figure 2:
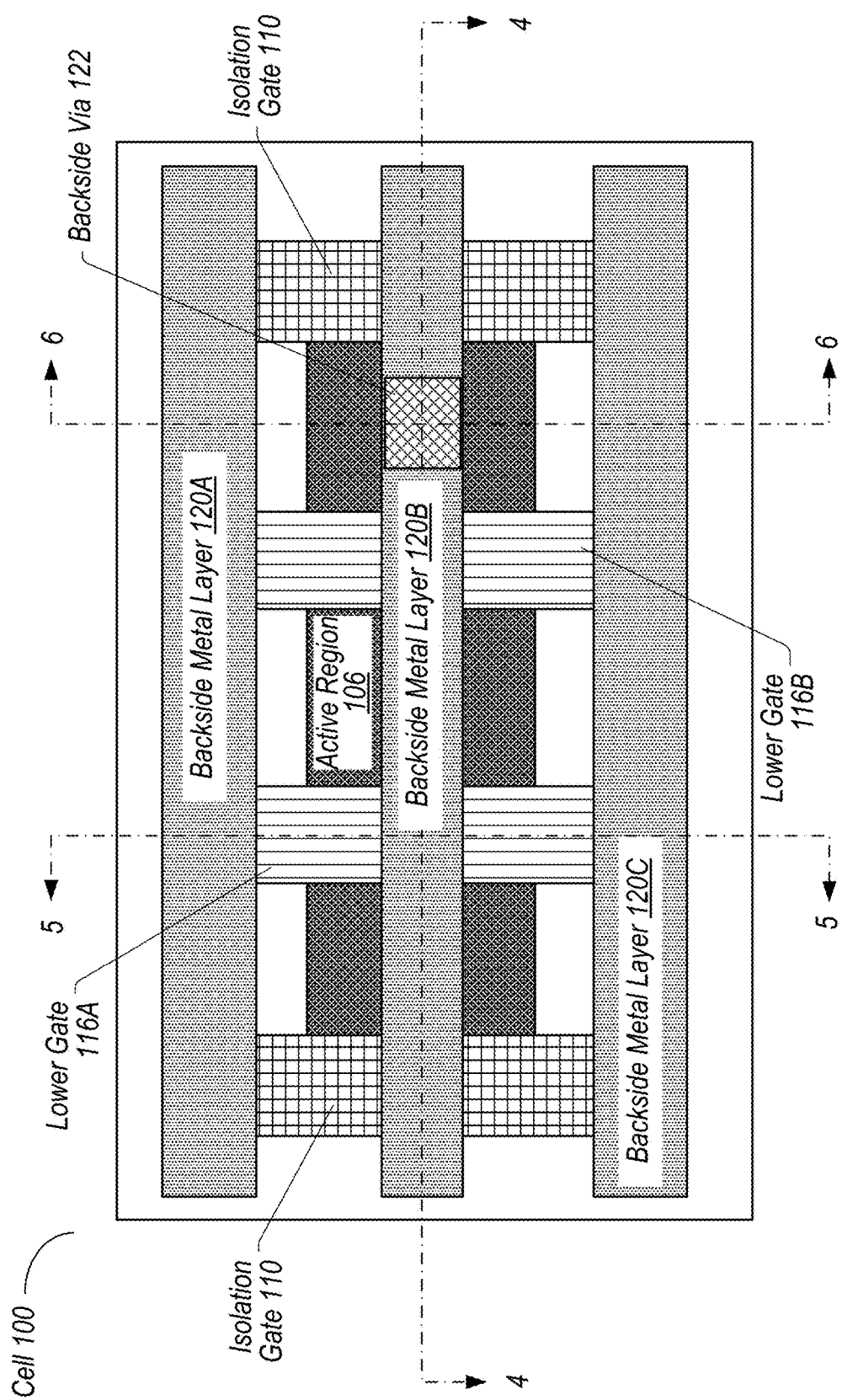
FIG. 2 depicts a backside plan view representation of a standard cell, according to some embodiments.
Figure 3:
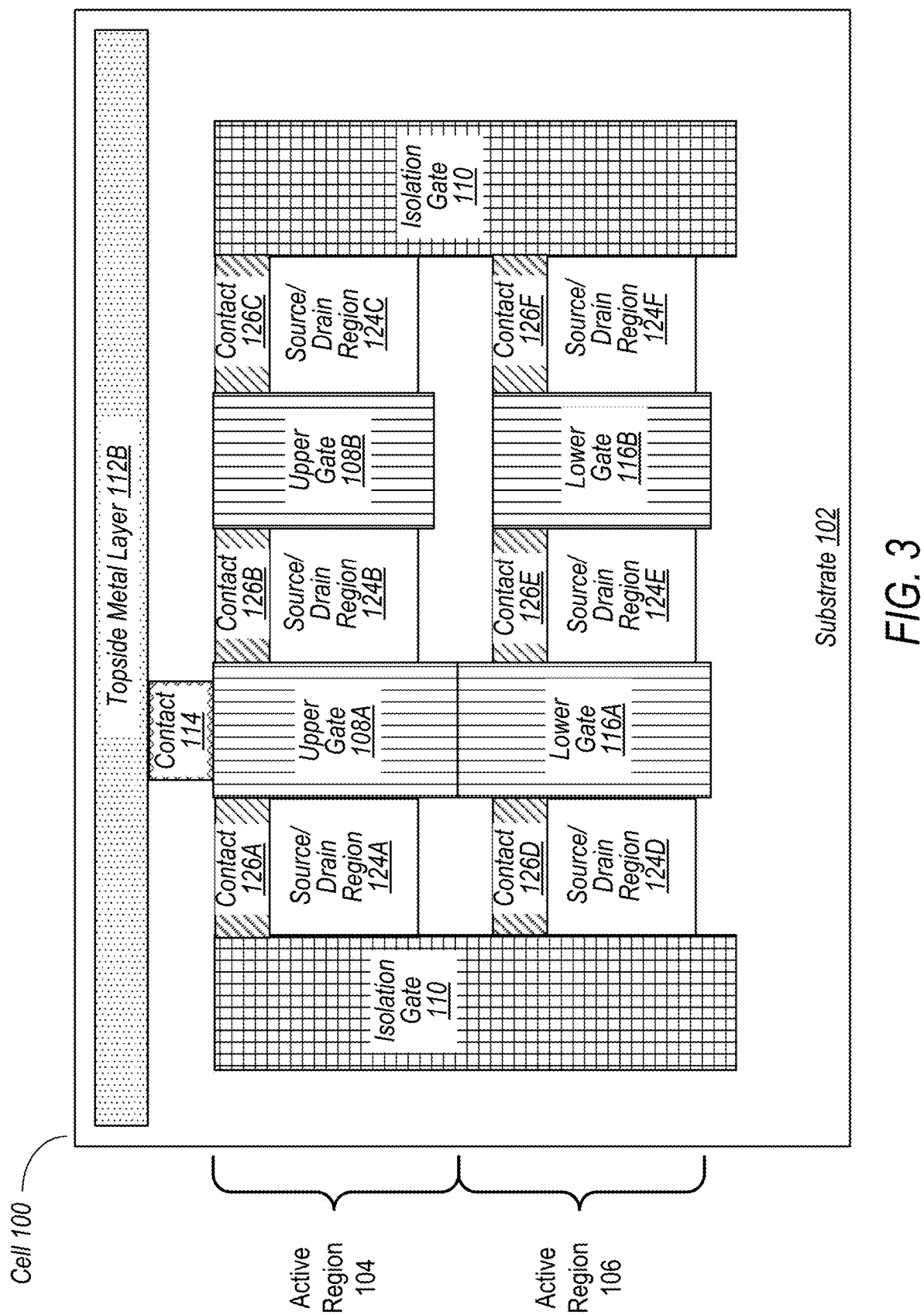
FIG. 3 depicts a cross-sectional representation of a standard cell along the line 3-3 shown in FIG. 1.
Figure 4:
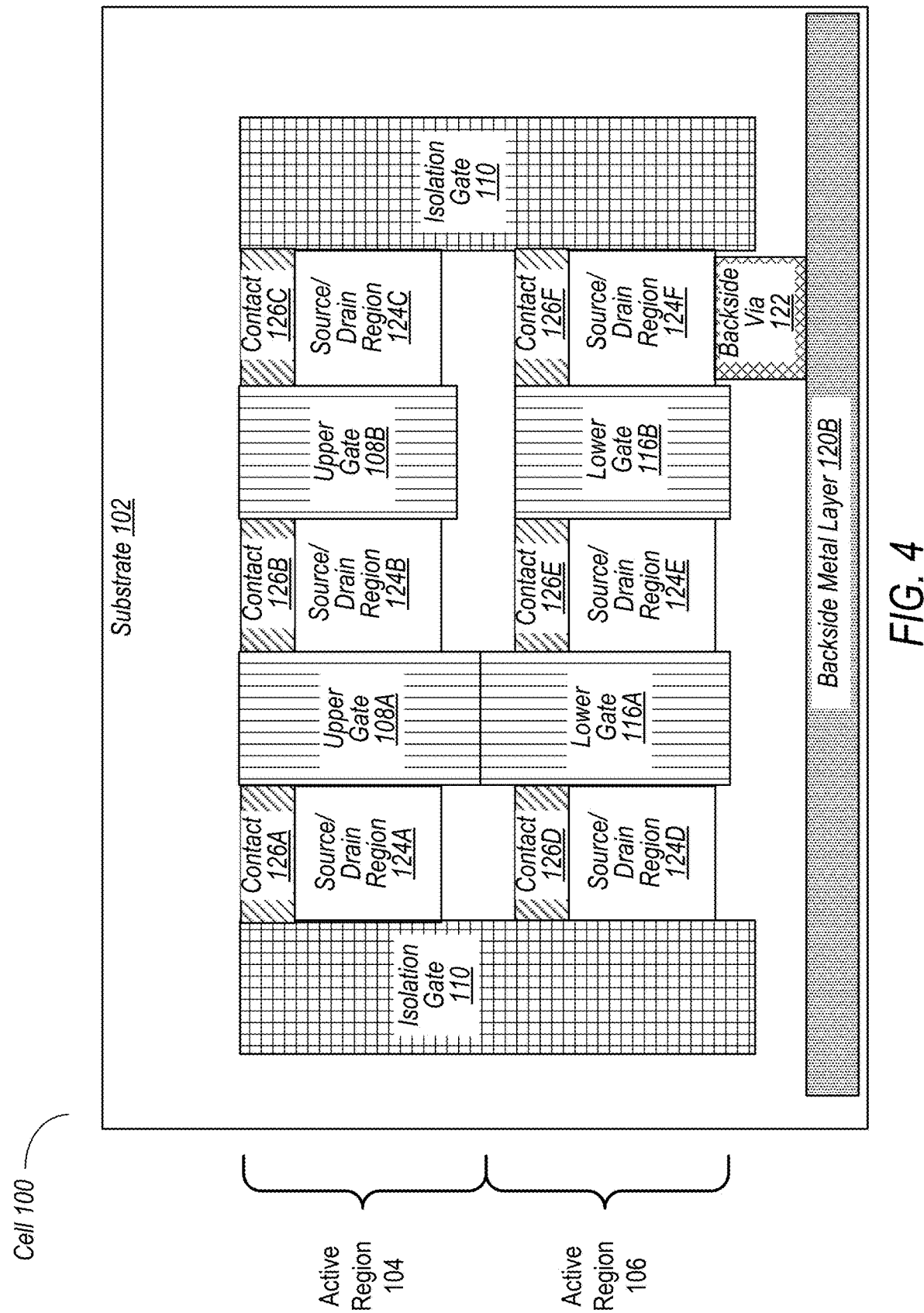
FIG. 4 depicts a cross-sectional representation of a standard cell along the line 4-4 shown in FIG. 2.
Figure 5:
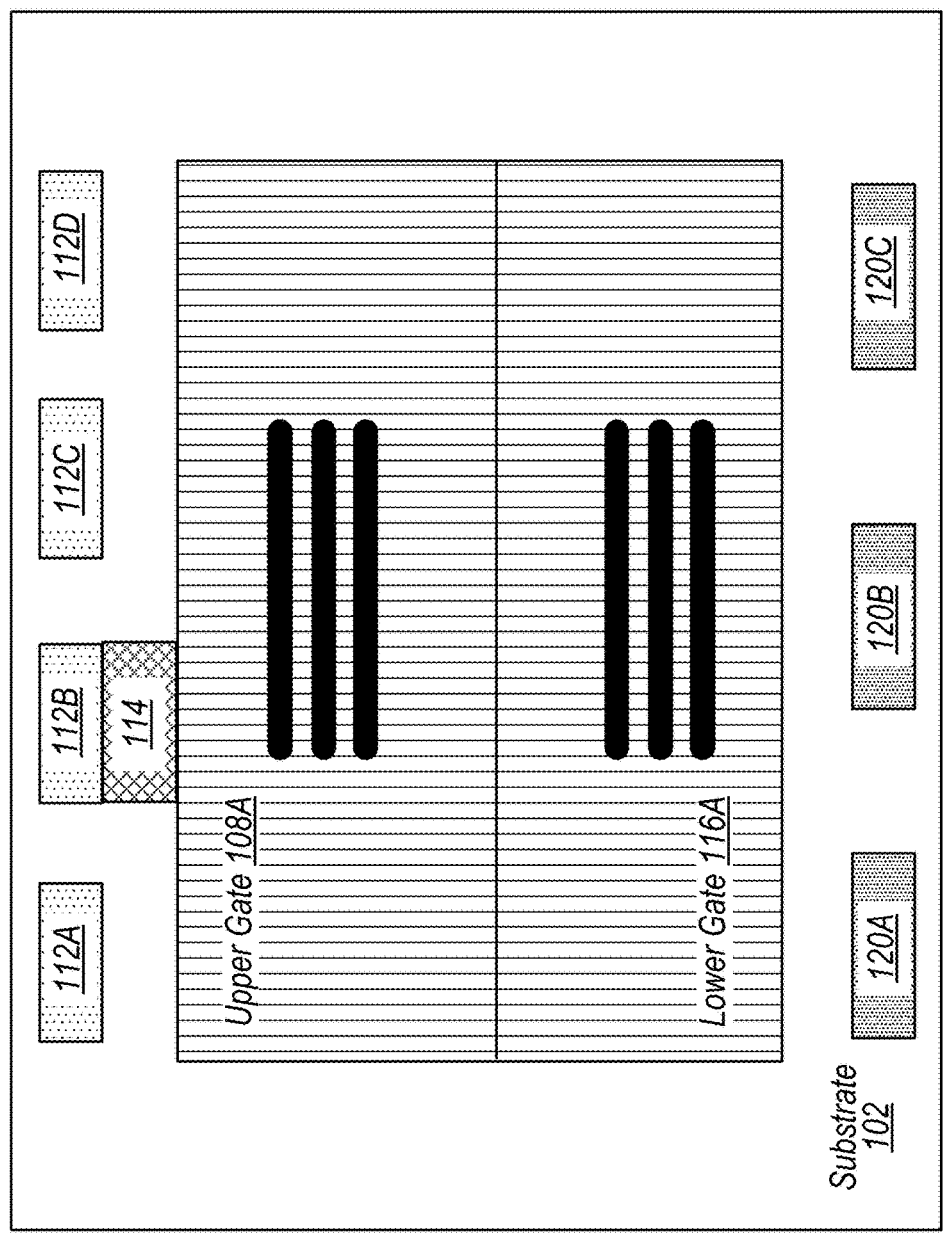
FIG. 5 depicts a cross-sectional representation of a standard cell along the line 5-5 shown in both FIGS. 1 and 2.
Figure 6:
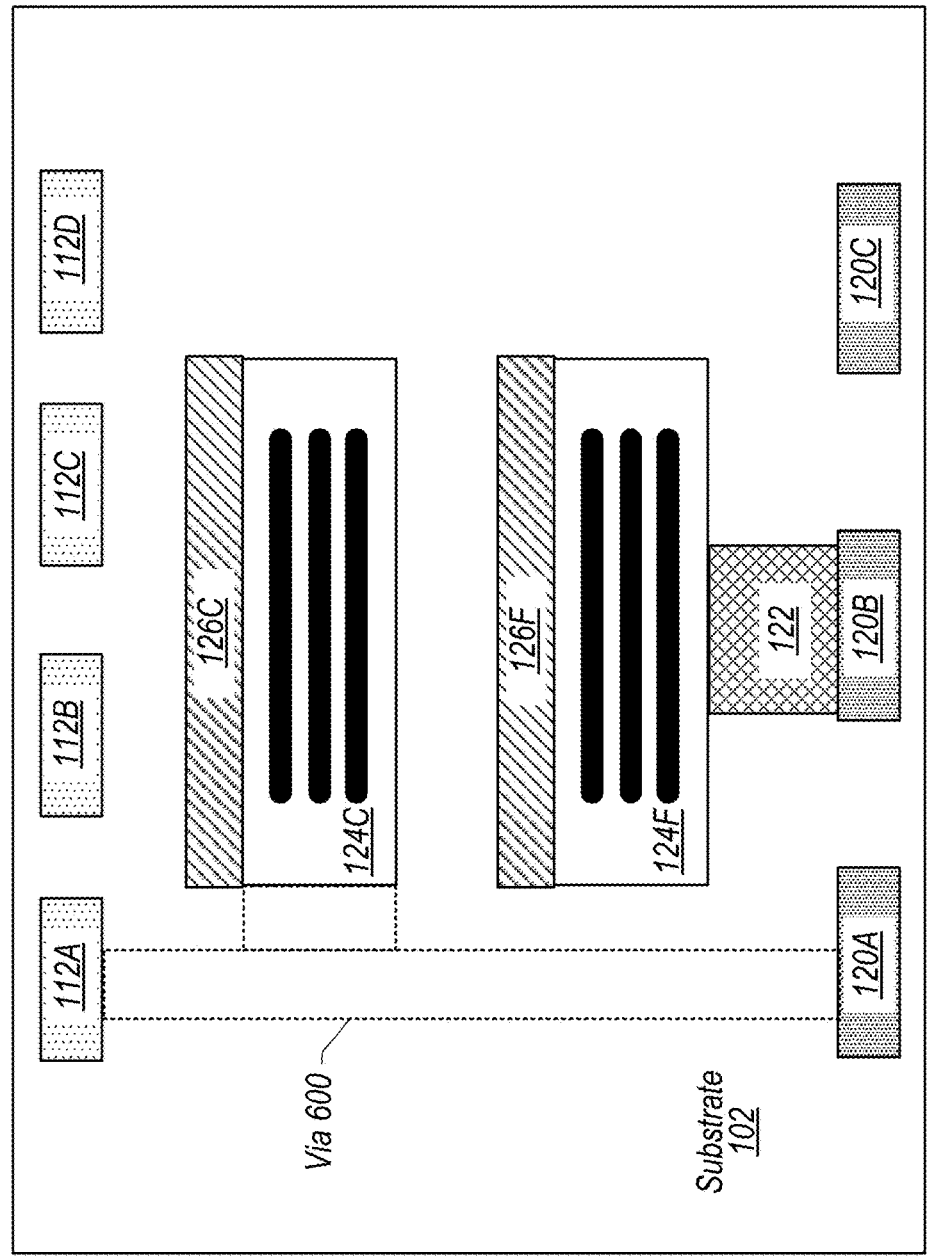
FIG. 6 depicts a cross-sectional representation of a standard cell along the line 6-6 shown in both FIGS. 1 and 2.

FIGS. 1-6 depict representations of a standard cell with stacked transistors and both topside and backside layer connections, according to some embodiments. FIG. 1 depicts a topside plan view representation of standard cell 100, according to some embodiments. FIG. 2 depicts a backside plan view representation of standard cell 100, according to some embodiments. FIG. 3 depicts a cross-sectional representation of standard cell 100 along the line 3-3 shown in FIG. 1. FIG. 4 depicts a cross-sectional representation of standard cell 100 along the line 4-4 shown in FIG. 2. FIG. 5 depicts a cross-sectional representation of standard cell 100 along the line 5-5 shown in both FIGS. 1 and 2. FIG. 6 depicts a cross-sectional representation of standard cell 100 along the line 6-6 shown in both FIGS. 1 and 2.

For simplicity in the drawings, only components relevant to the disclosure are shown in the representations of a cell disclosed herein. A person with knowledge in the art would understand that additional components may be present in any of the cells depicted herein. For instance, in FIG. 1, various connections (such as vias or contacts described herein) may be visible in some depictions. Additionally, some transparency of material is provided to enable visibility of underlying components in topside and backside plan views for better understanding of the disclosed embodiments. For instance, in FIGS. 1 and 2, substrate 102 has some transparency to provide visibility of gates and active regions of the underlying transistors and topside metal layers 112 and backside metal layers 120 have some transparency to provide visibility of contact 114 and backside via 122, respectively.

In various embodiments, as shown in FIGS. 1-6, standard cell 100 includes substrate 102. In certain embodiments, substrate 102 is a silicon substrate though other semiconductor substrates may also be contemplated. Substrate 102 may include additional components or features for implementation in cell 100. For instance, substrate 102 may include one or more insulating layers (e.g., oxide layers), diffusion (e.g., oxide diffusion) regions, or doped regions for implementation in cell 100. For simplicity in the drawings, substrate 102 is depicted as a material filling the volume of standard cell 100.

In various embodiments, first active region 104 and second active region 106 are formed in substrate 102. In certain embodiments, active region 104 is positioned vertically above active region 106 in cell 100. For example, active region 104 may be positioned in an upper portion of cell 100 with active region 106 in a lower portion of the cell. It should be noted that active region 104 and active region 106 may not necessarily be positioned directly above/beneath each other. For instance, some portions of active region 104 or active region 106 may be outside the boundaries of the other active region. Thus, when describing that active region 104 is above active region 106, it may be referencing that at least some portion of active region 104 is above at least some portion of active region 106, or vice versa.

In certain embodiments, active region 104 is an active region of a first transistor in cell 100 and active region 106 is an active region of a second transistor in the cell. For example, in one contemplated embodiment, active region 104 is the active region of an NMOS transistor with one or more NMOS gates and active region 106 is the active region of a PMOS transistor with one or more PMOS gates. Alternatively, active region 104 may be the active region of a PMOS transistor while active region 106 is the active region of an NMOS transistor. While transistor stacks with these complementary transistor types (e.g., heterogeneous transistors) are described with respect to FIGS. 1-6, it should be understood that additional embodiments may be contemplated where both transistors are of the same type (e.g., homogeneous transistors). Additionally, while the embodiments disclosed describe silicon-based transistors such as NMOS and PMOS transistors, other types of semiconductor-based transistors may be contemplated without deviating from the scope of the present disclosure. Yet further, any types of transistor structures may be contemplated. For instance, the transistors formed may include transistors such as, but not limited to, FinFETs, nanosheet FETs (NSHs), or GAAFETs ("gate-all-around" FETs).

In various embodiments, transistors with active region 104 include upper gates 108 and source/drain regions 124 while transistors with active region 106 include lower gates 116 and source/drain regions 124. The transistors may be positioned between isolation gates 110, as shown in FIGS. 1-4. Cell 100 may also include contacts 126 that provide connections for source/drain regions 124. Cell 100, as depicted in FIGS. 1-6, includes two upper gates 108A-B, two lower gates 116A-B, six source/drain regions 124A-F (with three source/drain regions 124A-C in the upper transistor and three source/drain regions 124D-F in the lower transistor), and six contacts 126A-F positioned between isolation gates 110 in the cell 100. The embodiment of cell 100 depicted in FIGS. 1-6 is, however, one example of a possible construction of transistor components within the cell. For instance, it should be understood that cell 100 may include any number of transistor components that fit within the boundaries of the cell according to design and manufacturing constraints of the cell (e.g., the design and manufacturing constraints of a standard cell) without deviating from the scope of the present disclosure.

Upper gates 108 and lower gates 116, may be, for example, poly lines (e.g., polysilicon layers) or high-k/metal gates. In certain embodiments, upper gates 108 and lower gates 116 include gate spacers (not shown for simplicity in the drawing). For instance, gate spacers may be positioned between gates 108/116 and source/drain regions 124. In various embodiments, the gate spacers are formed as parts of gates 108/116 (e.g., the gates and spacers are formed in the same process flow). Source/drain regions 124 may be, for example, epitaxial layers grown on fins or nanosheet stacks or any 2D (two-dimensional) channel materials. Various embodiments may also be contemplated where source/drain regions 124 are at least partially positioned in substrate 102.

In addition to the above-described transistor components, various connections to gates and/or source/drain regions may be made within cell 100. The connections may include, for example, contacts or vias that provide connection between transistor components in cell 100 and topside metal layers 112 or backside metal layers 120. Contact 114 (shown in FIGS. 1, 3, and 5) is an example of a gate contact that provides connection between upper gate 108A and topside metal layer 112B. Backside via 122 (shown in FIGS. 2, 4, and 6) is an example of a via that provides connection between source/drain region 124F and backside metal layer 120B.

In various embodiments, contacts 114 are topside vias that provide connection to topside metal layers 112 from various portions of the transistors (e.g., source/drain regions, gates, etc.) while backside vias 122 provide connection to backside metal layers from various portions of the transistors. Contacts 114 and backside vias 122 are provided as non-limiting examples of connections possible in cell 100. For instance, any number or combination of contacts or vias (along with any horizontal routing) may be implemented in cell 100 to provide connections between various topside metal layers and backside metal layers and transistor components (e.g., upper gates 108, lower gates 116, and source/drain regions 124) within the cell. Connections may also be made depending on whether control signals or power signals are intended for components within the transistors of cell 100. For example, in the embodiment depicted in FIGS. 1-6, contact 114 may provide a control signal connection to upper gate 108A while backside via 122 provides a power signal connection to source/drain region 124F. The number, types, and positioning of contacts and vias may be determined based on the desired device being constructed utilizing the component structure inside cell 100. For instance, an inverter device has different connections from a NAND device (shown as example in FIGS. 13-18).

As shown in FIGS. 1-6, cell 100 includes four topside metal tracks (topside metal layers 112A-D) and three backside metal tracks (backside metal layers 120A-C). It should be understood that cell 100 may include any number of topside metal tracks and backside metal tracks as allowed according to design and manufacturing constraints of the cell. For instance, the number of metal tracks may be higher or lower depending on design and manufacturing constraints for the cell such as height, pitch, width, etc. Additionally, topside metal tracks and backside metal tracks may not be aligned with each other. For instance, as clearly depicted in FIGS. 5-6, topside metal layers 112 are not aligned with backside metal layers 120. Embodiments with aligned topside and backside metal layers may, however, be contemplated.

In various embodiments, as shown in FIG. 4, backside metal layers 120 are formed at or near a bottom surface of substrate 102. In certain embodiments, backside metal layers 120 include one or more backside layers of an active layer in cell 100 (e.g., a backside metal layer is vertically below active region 106). In some embodiments, backside metal layers 120 include one or more buried layers in substrate 102 (e.g., the metal layers are buried or embedded underneath the bottom surface of the substrate). In some embodiments, backside metal layers 120 are buried beneath a carrier substrate layer (e.g., a silicon carrier substrate). Additional embodiments may be contemplated where backside metal layers 120 are not located in substrate 102.

Metal tracks also may be selected for use as control signal tracks (e.g., control signal rails) or power signal tracks (e.g., power signal rails) based on the desired device usage of cell 100. Control signal tracks may provide input or output signal connections to transistor components in cell 100 while power signal tracks may provide power routing to/from Vdd (e.g., the supply voltage) and Vss (e.g., ground) as well as other contemplated power supply connections. The selection of a track for use as a control signal track or power signal track may also determine connections made to the metal track. For instance, in the depicted embodiment of cell 100, topside metal layer 112B is a control signal track connected to upper gate 108A by contact 114 while backside metal layer 120B is a power signal track connected to source/drain region 124F by backside via 122. It should be noted that any of backside metal layers 120A-C may be used as a power signal track in various contemplated embodiments. The remaining topside metal tracks (e.g., topside metal layers 112A, 112C, 112D) may be used for either additional topside control signal tracks or topside power signal tracks. Similarly, the remaining backside metal tracks (e.g., backside metal layers 120A and 120C) may be used for either additional backside power signal tracks or backside control signal tracks. For instance, in one contemplated embodiment, one of topside metal layers 112A, 112C, 112D may be a topside power signal track that has a contact to a source/drain region in the upper portion of cell 100 (e.g., one of source/drain region 124A-C) to provide a power signal connection to the upper transistor with active region 104. Additionally, one of backside metal layers 120A and 120C may be a backside control signal track that has a contact to lower gate 116B (e.g., the lower gate in the split gate configuration) in the lower portion of cell 100 to provide a control signal connection to the lower transistor with active region 106.

In various contemplated embodiments, one or more topside metal tracks (e.g. topside metal layers 112A-D) may be merged to when the metal tracks are being used as power rails (e.g., power signal tracks). For instance, in some embodiments, when a metal track along the cell edge (e.g., topside metal layer 112A or topside metal layer 112D) is used as a power rail, the metal track may be merged with the metal cell track from the neighboring cell. For example, as shown in FIG. 1, topside metal layer 112D' may be in the neighboring cell in the cell height direction (above cell 100 in the depiction of FIG. 1). Power rail merge layer 109 (dashed line box) may then be implemented to merge topside metal layer 112A in cell 100 with topside metal layer 112D' in the above neighboring cell. In various embodiments, power rail merge layer 109 is a metal layer connecting topside metal layer 112A and topside metal layer 112D'. In some contemplated embodiments, topside metal layer 112A, topside metal layer 112D', and power rail merge layer 109 may be a single metal track formed in cell 100 and the neighboring cell.

In other contemplated embodiments for merging of metal tracks, metal tracks at or near a center of a cell that are used as power rails may be merged. For instance, as shown in FIG. 1, power rail merge layer 111 (dashed line box) may be implemented to merge topside metal layer 112B and topside metal layer 112C when these metal layers are used as power rails. Power rail merge layer 111 may be, for instance, metal connecting topside metal layer 112B and topside metal layer 112C. In some instances, topside metal layer 112B, topside metal layer 112C, and power rail merge layer 111 may be a single metal track in cell 100.

It should be noted that in the embodiment of cell 100 depicted in FIGS. 1-6, additional contacts for control signals and power signals are not shown for simplicity in the drawings with the understanding that various connections could be made between the depicted metal tracks and the transistor components within the cell. For instance, any metal track (e.g., any one of topside metal layers 112A, 112C, 112D or any one of backside metal layers 120A and 120C) can be connected to any gate (e.g., upper gate 108 or lower gate 116) or source/drain region 124 within cell 100 as needed for a desired device structure. Thus, the depicted structure of cell 100 in FIGS. 1-6 with components (e.g., gates 108/116 and source/drain regions 124) and metal tracks (e.g., topside metal layers 112 and backside metal layers 120) provides a basic building block structure from which different variations of connections between the components and the metal tracks can be made to generate many different types of devices.

As shown in FIGS. 1-6, upper gates 108 and lower gates 116 may be formed in cell 100 with different relationships between the gates in the stacked transistor structure. Two possible embodiments for gate relationships are depicted in FIGS. 3 and 4. In a first contemplated embodiment, upper gate 108A is merged with lower gate 116A, creating connectivity between the gates. The connectivity created by merging of the gates allows a single control signal to be provided to both gates. For example, as shown in FIGS. 3 and 4, a control signal provided to upper gate 108A from topside metal layer 112B through contact 114 may be passed through and used as the control signal for lower gate 116A because of the connectivity between the gates. It should be noted that the merged gate configuration is also shown in the cross-section representation of FIG. 5. A second contemplated embodiment includes upper gate 108B being separated (e.g., split) from lower gate 116B. Separating upper gate 108B and lower gate 116B keeps the gates electrically disconnected. Thus, upper gate 108B and lower gate 116B would need separate control signals since a control signal cannot be passed between the gates due to the separation/split between the gates.

While not shown in FIGS. 1-6, source/drain regions 124 may also be merged between the upper and lower transistors in various embodiments. Examples of merged source/drain regions are shown in FIGS. 13-16, described below. Merging of source/drain regions 124 may allow for a single power signal to connect power to both the upper and lower transistors or a single control signal (e.g., a single output signal from a drain) to be connected to both the upper and lower transistors. Similar to splitting of gates, separate connections need to be made to the split source/drain regions when source/drain regions 124 are split (as shown in FIGS. 1-6).

In certain embodiments, power routing for the transistors in cell 100 (e.g., the upper transistor and the lower transistor) is divided between the topside metal layers 112 and the backside metal layers 120. For instance, as shown in FIGS. 2, 4, 6, backside metal layer 120B is connected to source/drain region 124F through backside via 122. Thus, in certain embodiments, power to lower gate 116B in the lower transistor (e.g., the transistor with active region 206) is routed from backside metal layer 120B. To divide power, power to upper gate 108B may be routed from one of topside metal layers not used for control signals (such as, for example, topside metal layer 112C). Accordingly, upper gate 108B and lower gate 116B would have separate power rails providing power to the gates/transistors. Dividing the power routing between the topside metal layers 112 and the backside metal layers 120 may provide more efficient power routing in cell 100.

Additional embodiments may be contemplated where power routing is provided from one or the other of the topside metal layers 112 and the backside metal layers 120 but not both layers. For instance, as discussed above, the source/drain regions could be merged and a single power signal from either the topside or backside could be provided to the merged regions. In another contemplated embodiment, power may be brought into cell 100 through a backside metal layer (such as backside metal layer 120A) and a via could route power from the backside metal layer to one of the topside metal layers, which then connects to a source/drain region in the upper transistor. The via could be positioned in an open channel in cell 100 between topside metal layers and backside metal layers. One example of a via is shown in FIG. 6 where via 600 (dashed lines) is optionally routed between topside metal layer 112A and backside metal layer 120A in the space (e.g., channel) outside source/drain regions 124C/124F. Topside metal layer 112A may then connect (directly or through another topside metal layer) to source/drain region 124C to provide power in the upper transistor. Note that via 600 as shown in FIG. 6 can also be used to route signals between topside and backside metal layers.

Yet another alternative for routing power from backside layers to the upper could include extending source/drain region 124C to intersect and connect with via 600, as shown by the dotted lines extending from source/drain region 124C in FIG. 6. The extension would create a direct connection between via 600 and source/drain region 124C. Other examples of extensions (both gates and source/drain regions) are provided below in reference to FIGS. 7-12, which describe the implementation of via pillars in cells (e.g., on the perimeter of the cells).

As discussed above, the embodiment of cell 100 depicted in FIGS. 1-6 provides a basis for a compact standard cell structure that implements two vertically stacked transistors. The transistors can be heterogeneous (e.g., two different types of transistors) or homogeneous (e.g., the same type of transistor). Cell 100 implements availability for connections from either topside metal layers and backside metal layers to any of the various transistor components including the gates and the source/drain regions. The adaptability in connections for both control signal and power for the transistor components allows the basic structure of cell 100 to be adapted to a wide range of logic schemes to implement different integrated circuit devices using stacked transistors. The compactness of cell 100 allows a cell with stacked transistors to be implemented within current standard cell design and manufacturing constraints.

In some instances, placing cell 100 next to neighboring cells may cause manufacturing issues due to routing tracks along the boundaries of the cells. With the routing tracks along the boundaries, vias from the routing tracks may create spacing issues between the neighboring cells. One possible solution to this boundary problem is to replace the routing tracks along the edges with via tracks where the vias alternate between being used by the current cell and the neighboring cell.

Figure 7:
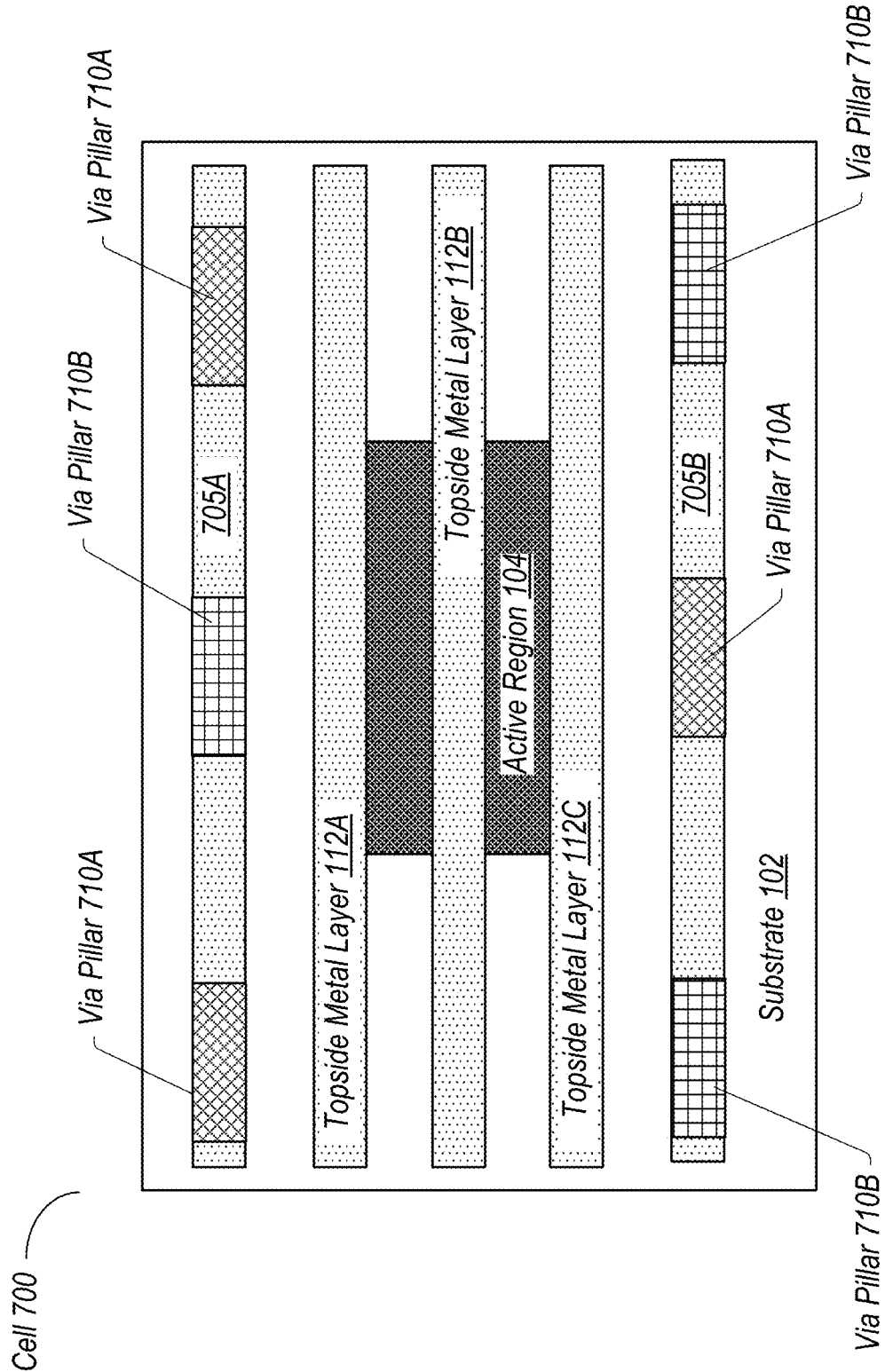
FIG. 7 depicts a topside plan view representation of a cell having alternative vias along the boundary, according to some embodiments.

FIG. 7 depicts a topside plan view representation of a cell having alternative vias along the boundary, according to some embodiments. In cell 700, three topside metal layers 112A, 112B, 112C are positioned between via track 705A and via track 705B. Via track 705A and via track 705B are placed along the boundary (e.g., edge) of cell 700. Via tracks 705A and via track 705B include via pillars 710. In certain embodiments, via pillars 710A and via pillars 710B with via pillars 710A belonging to cell 700 while via pillars 710B belong to neighboring cells. In various embodiments, via pillars 710 placed on the perimeter of cells and are utilized to provide routing into the interior of cell 700 for either control signals or power signals. It should be noted that neighboring cells may have mirrored setups to cell 700 to accommodate the alternating via pillar arrangement.

Various embodiments for connecting to via pillars 710A within cell 700, shown in FIG. 7, may be contemplated. Embodiments may include routing connections to gates or source/drain regions within cell 700. FIGS. 8 and 9 depict cross-sectional representations of source and drain connections in a cell implementing via pillars, according to some embodiments. FIG. 8 is a cross-sectional representation of cell 800 showing connections to source regions 124A, 124B while FIG. 9 is a cross-section representation of cell 800 showing connections to drain regions 124C, 124D.

In various embodiments, as shown in FIG. 8, source regions 124A, 124B are connected directly to topside metal layer 112B and backside metal layer 120A, respectively by contacts 114. Topside metal layer 112B and backside metal layer 120A may then route to power supply (e.g., Vdd) or ground (e.g., Vss) for power connections to source regions 124A, 124B. For drain regions 124C, 124D, as shown in FIG. 9, contacts 114 are routed horizontally to via pillar 710A. Via pillar 710A may then route to topside metal layer 112 or backside metal layer 120 for signal connection. In some embodiments, contacts 114 for drain regions 124C, 124D may be replaced by extending drain regions 124C, 124D horizontally to connect with via pillar 710A.

Figures 10, 11:
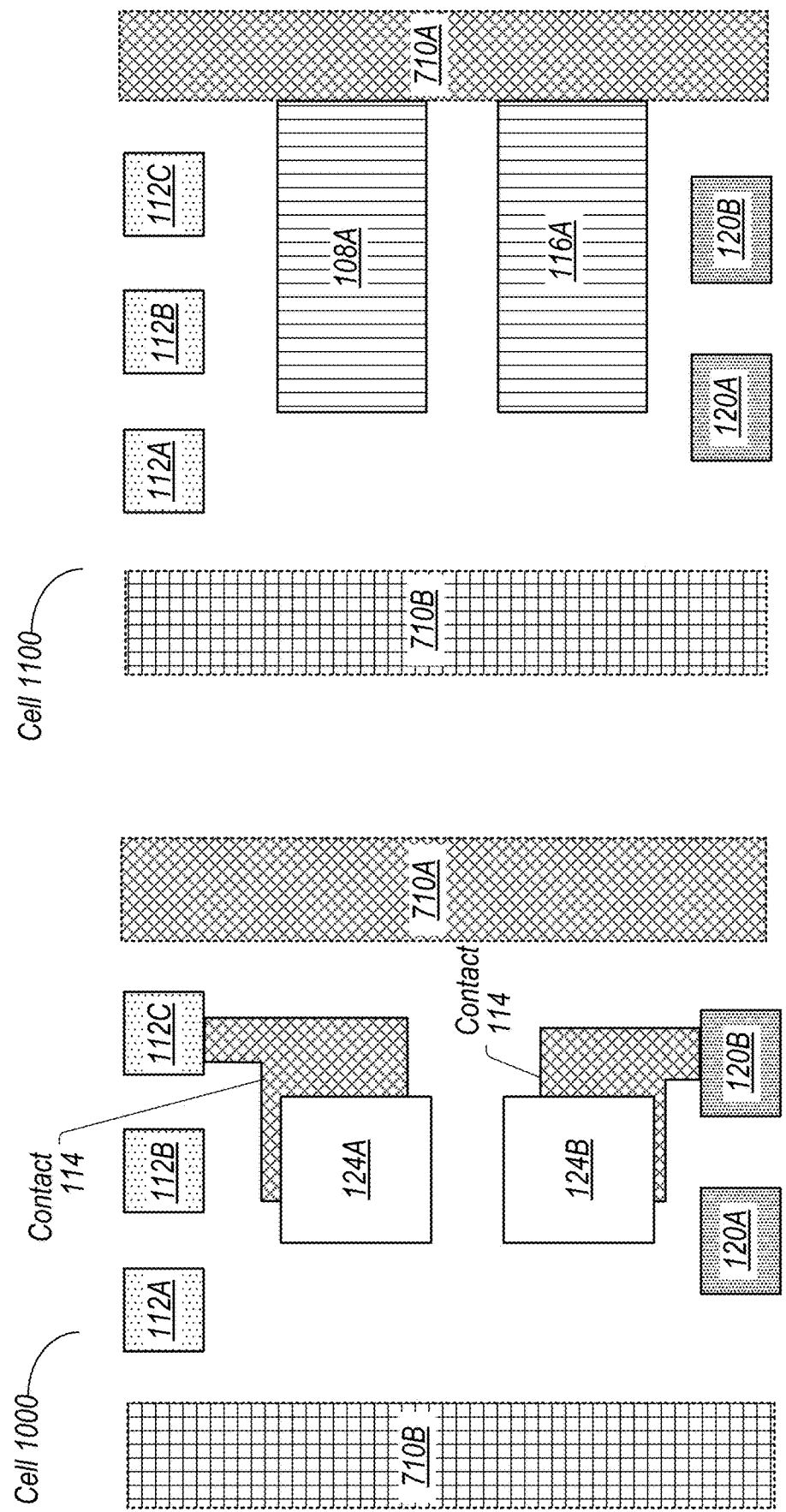
FIG. 10 depicts a cross-sectional representation of a stacked transistor control signal connections in a cell implementing via pillars, according to some embodiments.
FIG. 11 depicts a cross-sectional representation of a stacked transistor control signal connections in a common gate configuration, according to some embodiments.

FIG. 10 depicts a cross-sectional representation of a stacked transistor control signal connections in a cell implementing via pillars, according to some embodiments. In FIG. 10, cell 1000 includes source/drain regions 124A, 124B connected to topside metal layer 112C and backside metal layer 120B, respectively, by contacts 114. Topside metal layer 112C and backside metal layer 120B may be routing for control signals provided to source/drain regions 124A, 124B.

Figure 12:
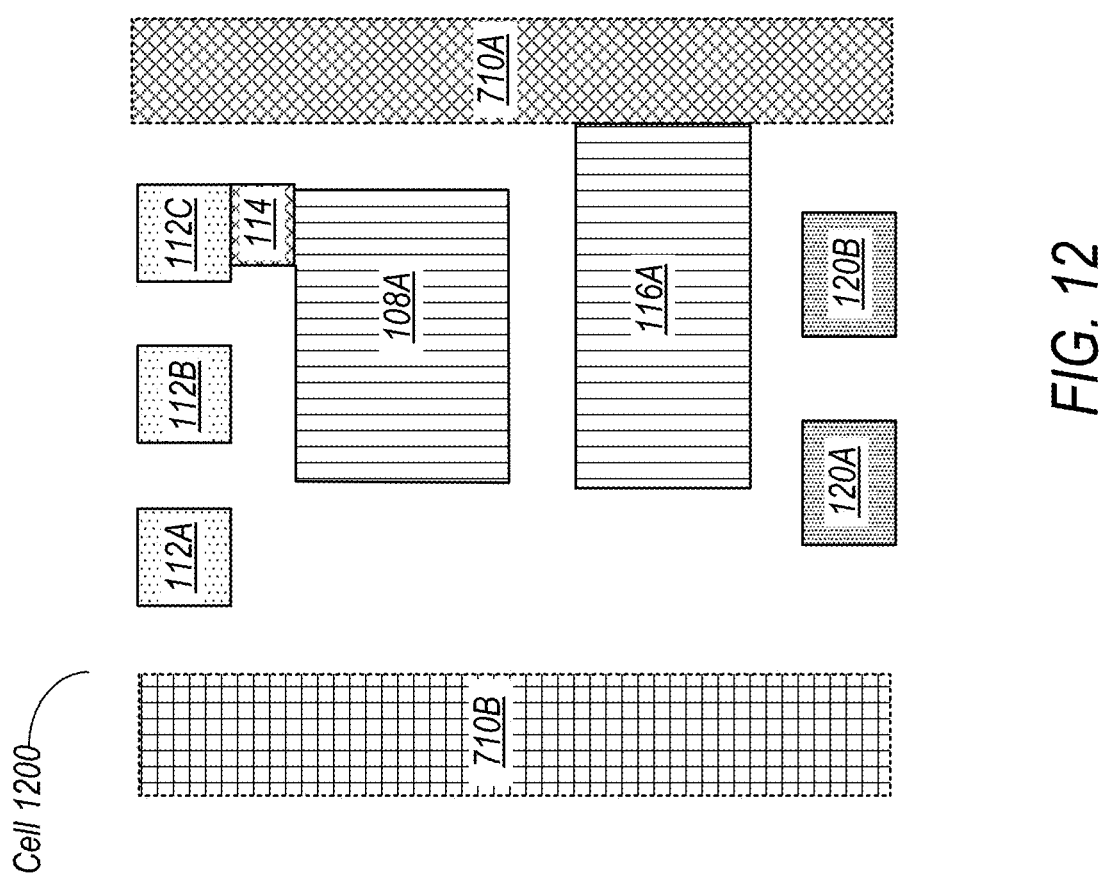
FIG. 12 depicts a cross-sectional representation of a stacked transistor control signal connections in a cross-coupled gate configuration, according to some embodiments.

Via pillars 710A may also provide routing for control signals from gates in various embodiments of stacked transistors. The gates may, for example, be coupled to as common gates or split gates (e.g., as used in transmission gates). FIG. 11 depicts a cross-sectional representation of a stacked transistor control signal connections in a common gate configuration, according to some embodiments. In cell 1100, upper gate 108A and lower gate 116A are extended to intersect and connect to via pillar 710A for a common connection to the gates. FIG. 12 depicts a cross-sectional representation of a stacked transistor control signal connections in a split-gate configuration, according to some embodiments. In cell 1200, upper gate 108A is connected to topside metal layer 112C by contact 114 and lower gate 116A is extended to intersect and connect to via pillar 710A. Topside metal layer 112C and via pillar 710A may then be cross-coupled to cross-couple upper gate 108A and lower gate 116A.

Example NAND Cell with Stacked Transistors

Figure 13:
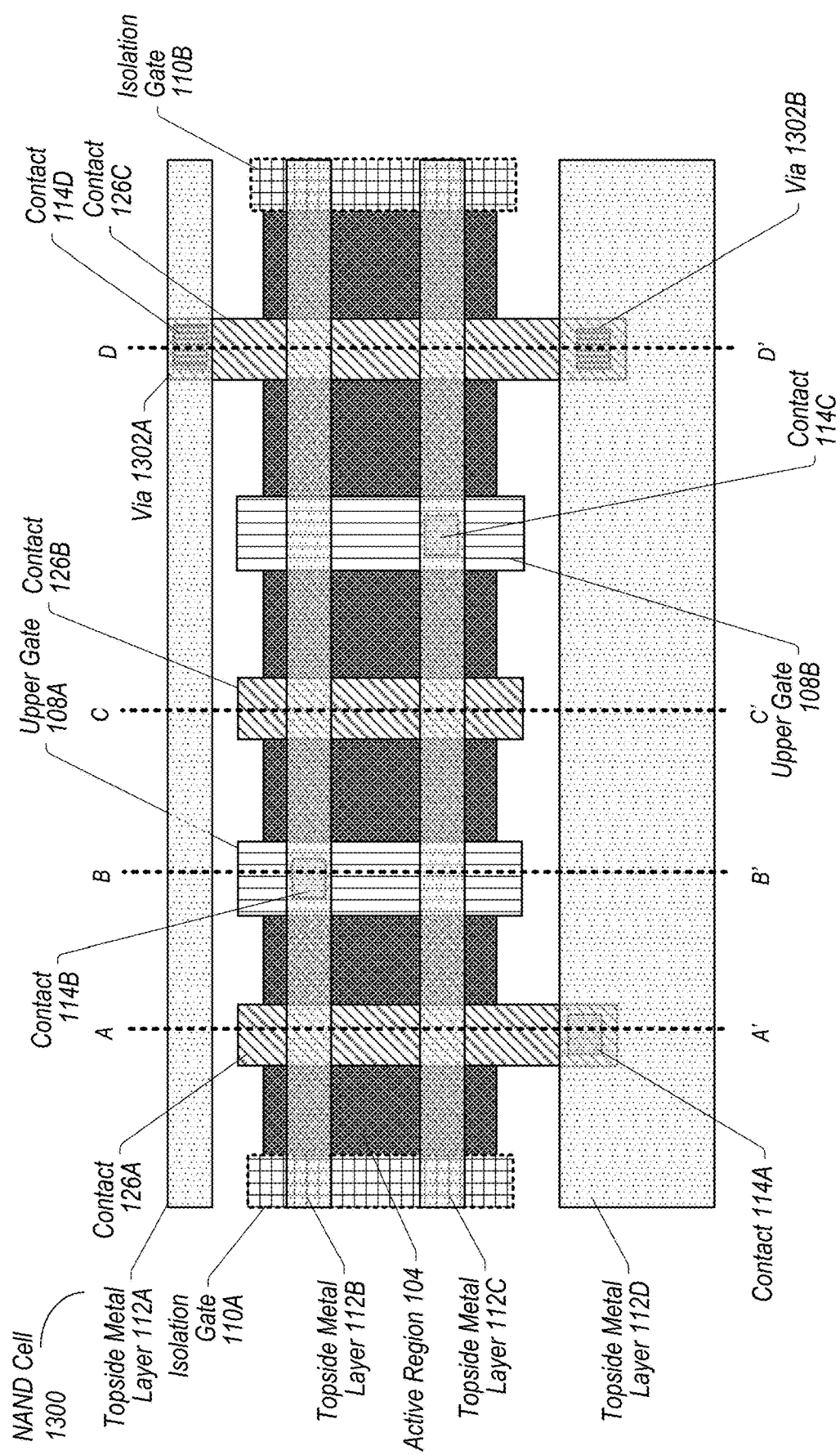
FIG. 13 depicts a topside plan view representation of a NAND cell, according to some embodiments.
Figure 14:
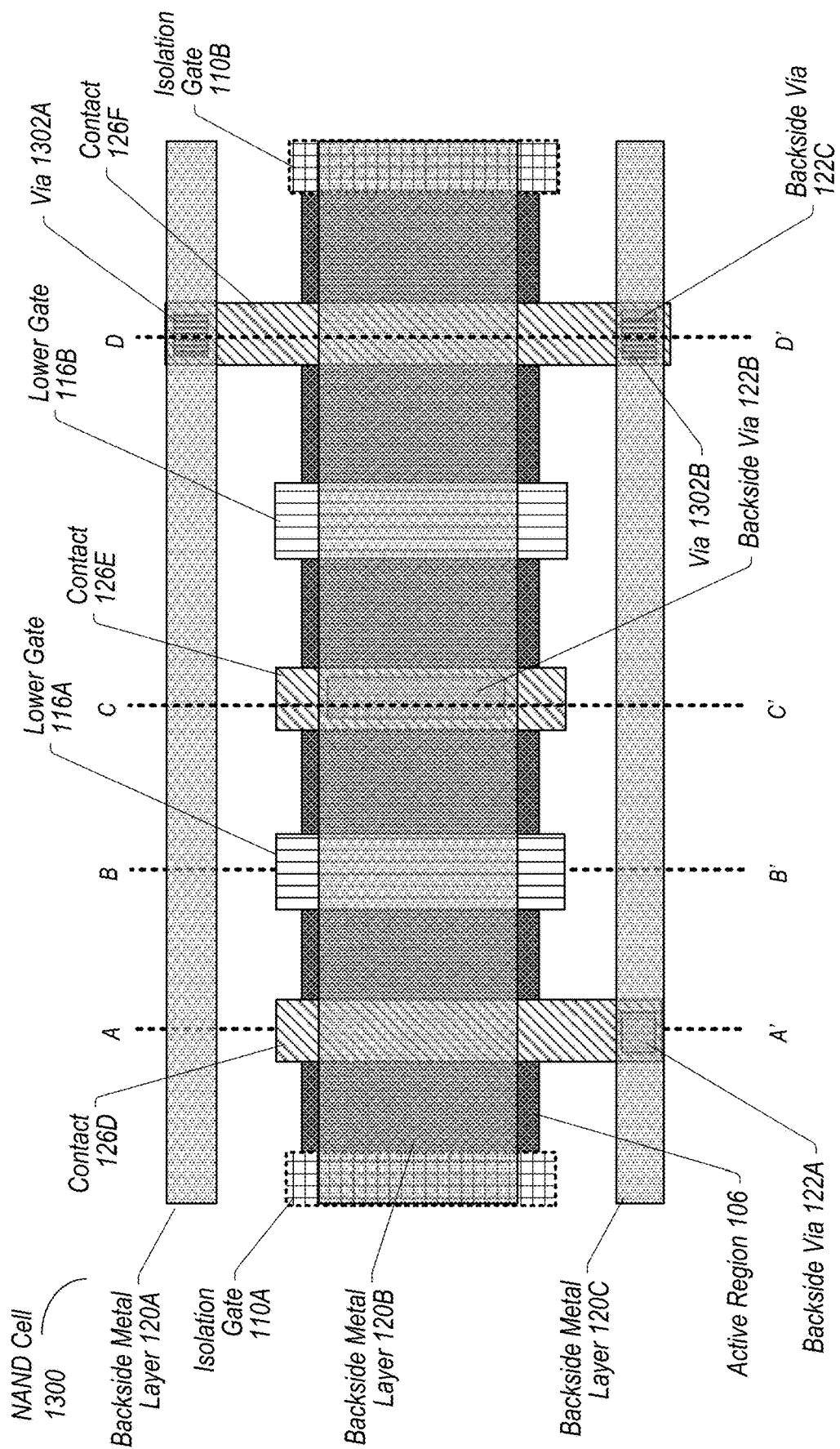
FIG. 14 depicts a backside plan view representation of a NAND cell, according to some embodiments.
Figure 15:
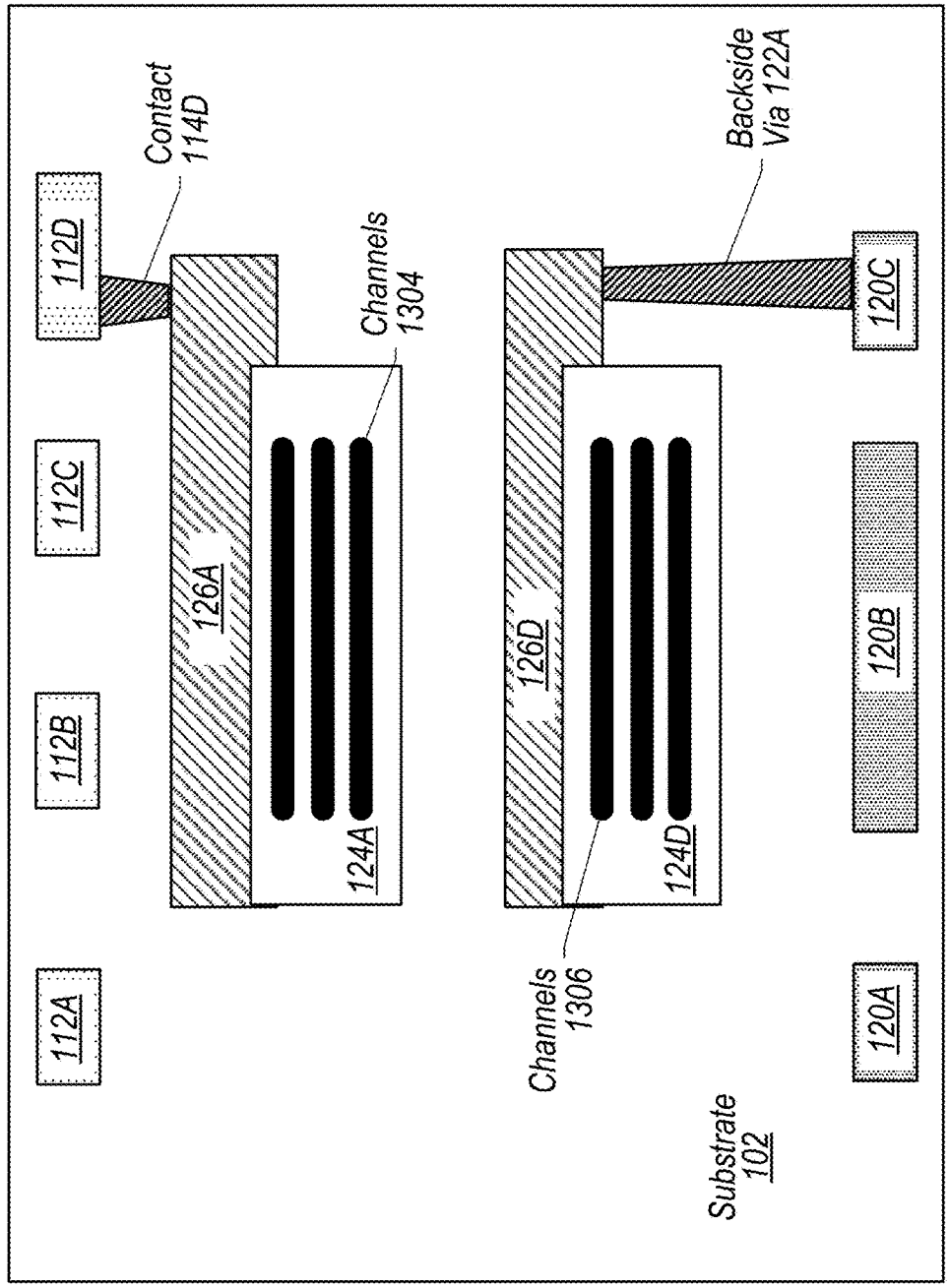
FIG. 15 depicts a cross-sectional representation of a NAND cell along the line A-A' shown in FIGS. 13 and 14.
Figure 16:
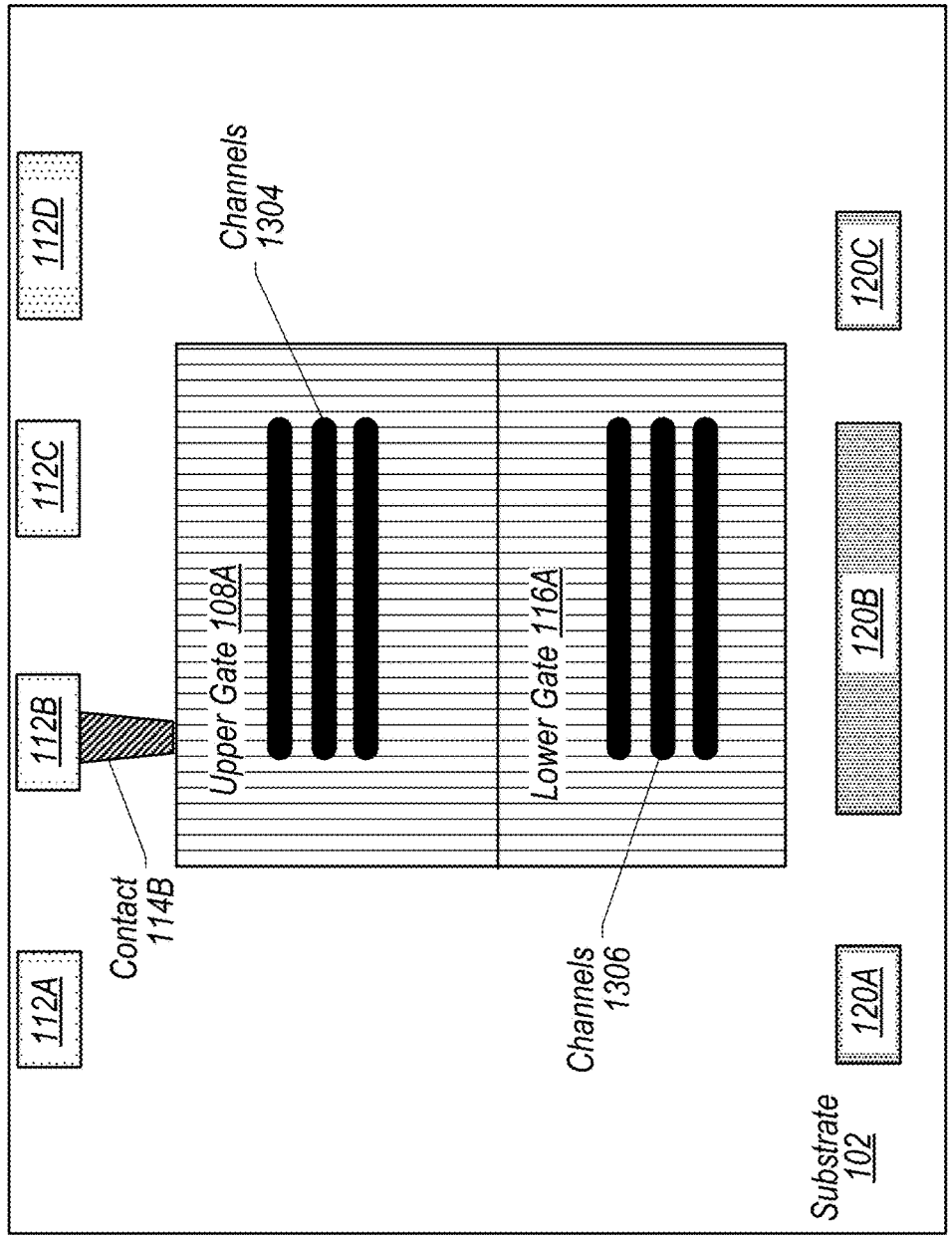
FIG. 16 depicts a cross-sectional representation of a NAND cell along the line B-B' shown in FIGS. 13 and 14.
Figure 17:
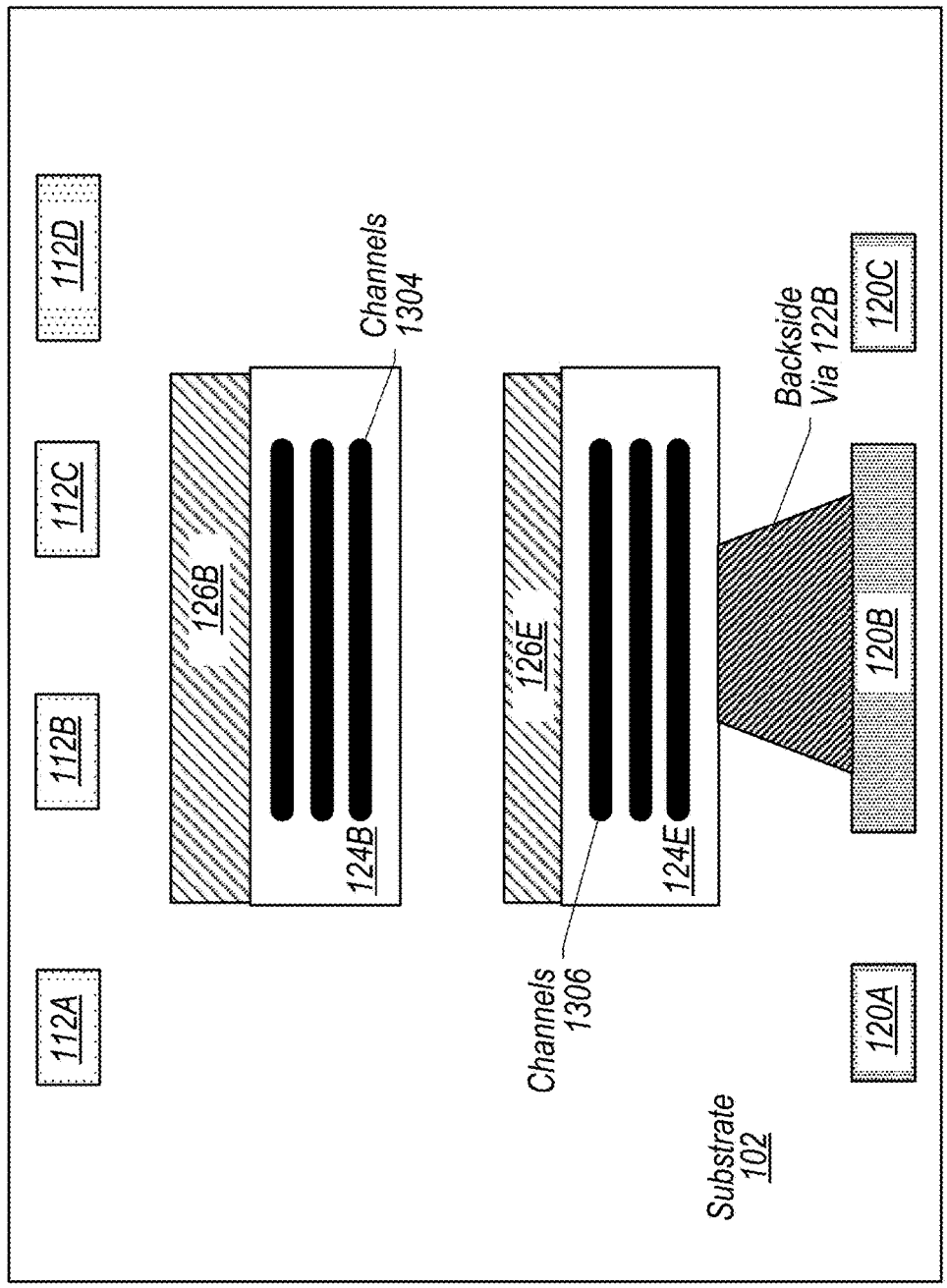
FIG. 17 depicts a cross-sectional representation of a NAND cell along the line C-C' shown in FIGS. 13 and 14.
Figure 18:
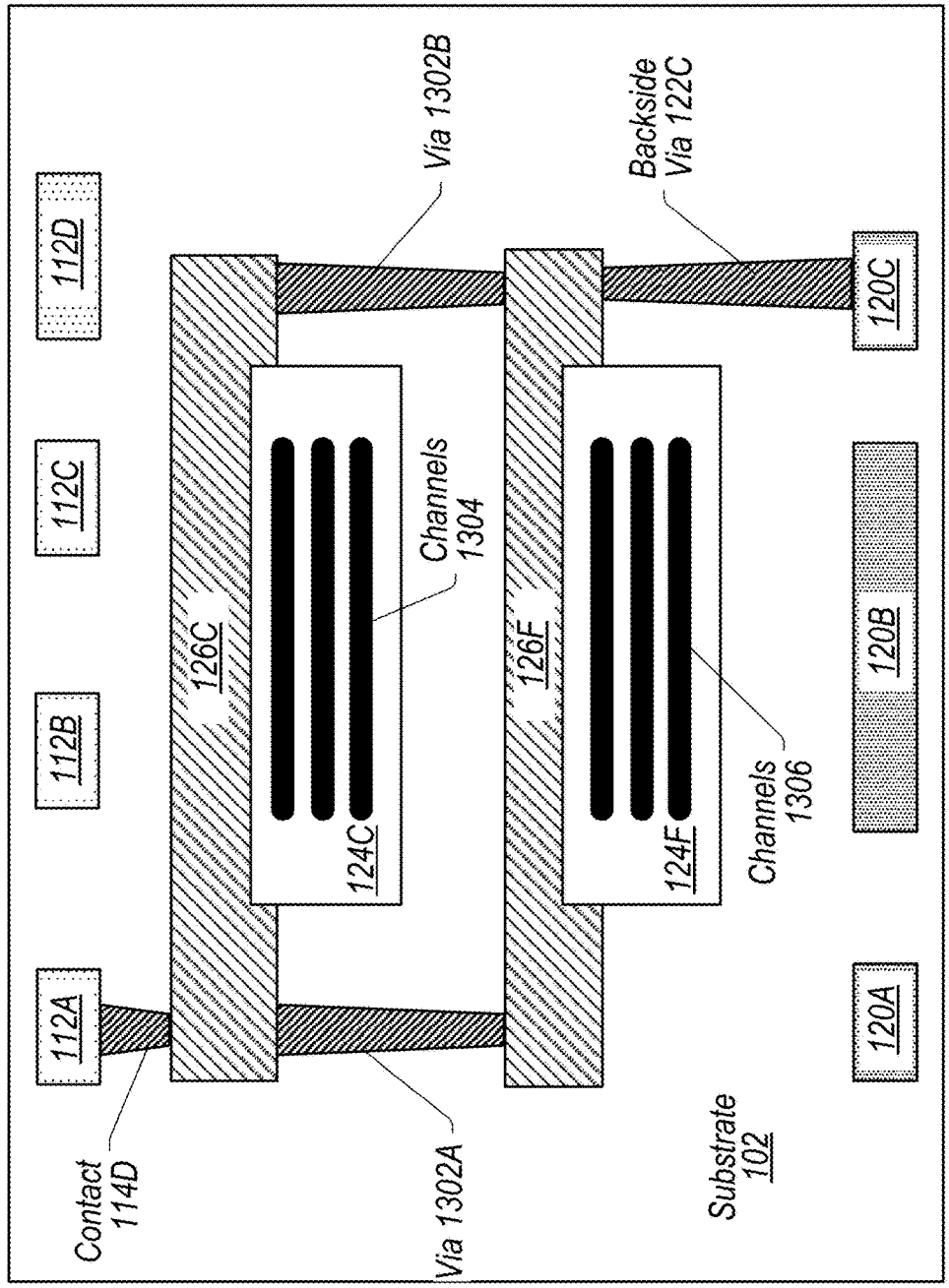
FIG. 18 depicts a cross-sectional representation of a NAND cell along the line D-D' shown in FIGS. 13 and 14.

FIGS. 13-18 depict representations of an example NAND cell, according to some embodiments. FIG. 13 depicts a topside plan view representation of NAND cell 1300, according to some embodiments. FIG. 14 depicts a backside plan view representation of NAND cell 1300, according to some embodiments. FIG. 15 depicts a cross-sectional representation of NAND cell 1300 along the line A-A' shown in FIGS. 13 and 14. FIG. 16 depicts a cross-sectional representation of NAND cell 1300 along the line B-B' shown in FIGS. 13 and 14. FIG. 17 depicts a cross-sectional representation of NAND cell 1300 along the line C-C' shown in FIGS. 13 and 14. FIG. 18 depicts a cross-sectional representation of NAND cell 1300 along the line D-D' shown in FIGS. 13 and 14.

In certain embodiments, FIG. 13 depicts (from the topside) structures associated with active region 104 of the upper transistor (e.g., the NMOS active region) and FIG. 14 depicts (from the backside) structures associated with active region 106 of the lower transistor (e.g., the PMOS active region) in the vertically stacked transistors. In the illustrated embodiment, topside metal layer 112D is a ground rail (e.g., VSS rail) while backside metal layer 120B is a power supply rail (e.g., VDD rail). The remaining topside metal layers (e.g., topside metal layers 112A, 112B, 112C) and backside metal layers (e.g., backside metal layers 120A, 120C) may be used for signal routing and/or internal routing inside NAND cell 1300, as described below.

In the illustrated embodiment, as shown in FIG. 13, NAND cell 1300 includes upper gate 108A and upper gate 108B, which are active NMOS gates positioned inside the cell. Isolation gates 110A, B (e.g., dummy gates) are positioned at opposing ends of cell 1300 in the gate pitch direction while upper contact 126A is positioned between isolation gate 110A and upper gate 108A, upper contact 126B is positioned between upper gate 108A and upper gate 108B, and upper contact 126C is positioned between upper gate 108B and isolation gate 110B also in the gate pitch direction. Further in the illustrated embodiment, as shown in FIG. 14, NAND cell 1300 includes lower gate 116A and lower gate 116B, which are active PMOS gates positioned inside the cell. Lower contact 126D is positioned between isolation gate 110A and lower gate 116A, lower contact 126E is positioned between lower gate 116A and lower gate 116B, and lower contact 126F is positioned between lower gate 116B and isolation gate 110B in the gate pitch direction.

In various embodiments, as shown in FIGS. 13 and 15, contact 114A provides connection between contact 126A and topside metal layer 112D (e.g., the ground rail). Contact 126A is also connected to source/drain region 124A of upper gate 108A. Note that FIGS. 15-18 depict six source/drain regions 124A-F in NAND cell 1300 where source/drain regions 124A-C are upper source/drain regions and source/drain regions 124D-F are lower source/drain regions. In NAND cell 1300, upper source/drain regions 124A-C are separated from lower source/drain regions 124D-F. Additionally, upper source/drain regions 124A-C and upper gates 108A, 108B include upper channels 1304 while lower source/drain regions 124D-F and lower gates 116A, 116B include lower channels 1306.

Contact 114B, shown in FIGS. 13 and 16 provides connection between upper gate 108A and topside metal layer 112B, which may be a route for an input signal to the device of NAND cell 1300. NAND cell 1300 further includes contact 114D (shown in FIGS. 13 and 18) that connects contact 126C to topside metal layer 112A, which may be a route for an output signal from the device of NAND cell 1300.

In the contemplated embodiment of NAND cell 1300, the upper gates and lower gates are merged. For instance, as shown in FIG. 16, upper gate 108A is merged to lower gate 116A. Thus, contact 114B provides a connection between a merged upper gate 108A and lower gate 116A and topside metal layer 112B (e.g., the input signal route). Upper gate 108B and lower gate 116B may be similarly merged and connected to contact 114C (shown in FIG. 13), which then provides connection to topside metal layer 112C, which may be a second route for an input signal to the device of NAND cell 1300.

In various embodiments, NAND cell 1300 includes backside via 122A and backside via 122C, shown in FIGS. 14, 15, 17, and 18. Backside via 122A provides a connection between lower contact 126D and backside metal layer 120C, as shown in FIGS. 14 and 15. Backside metal layer 120C is also connected to lower contact 126F by backside via 122C, as shown in FIGS. 14 and 18. Accordingly, backside metal layer 120C provides an internal (to the cell) route path between lower contact 126D (which is connected to lower source/drain region 124D of lower gate 116A) and lower contact 126F (which is connected to lower source/drain region 124F of lower gate 116B).

In certain embodiments, NAND cell 1300 includes via 1302A and via 1302B. Via 1302A and via 1302B are top-to-back vias that connect upper contact 126C to lower contact 126F, as shown in FIGS. 13, 14, and 18. Accordingly, via 1302A and via 1302B provide connection between upper source/drain region 124C of upper gate 108B and lower source/drain region 124F of lower gate 116B. Note that in the depictions of FIGS. 13 and 14, via 1302A and via 1302B may be partially hidden from view by contact 114D and backside via 122C, respectively.

NAND cell 1300 further includes backside via 122B, shown in FIGS. 14 and 17. Backside via 122B provides a power supply connection (from backside metal layer 120B, which is the power supply rail) to lower source/drain region 124E. Lower source/drain region 124E is shared by lower gate 116A and lower gate 116B in lower active region 106. Accordingly, power supply is provided to all the active gates through backside via 122B since lower gate 116A and lower gate 116B are respectively merged to upper gate 108A and upper gate 108B.

Complementary FET SRAM Cells

Figure 19:
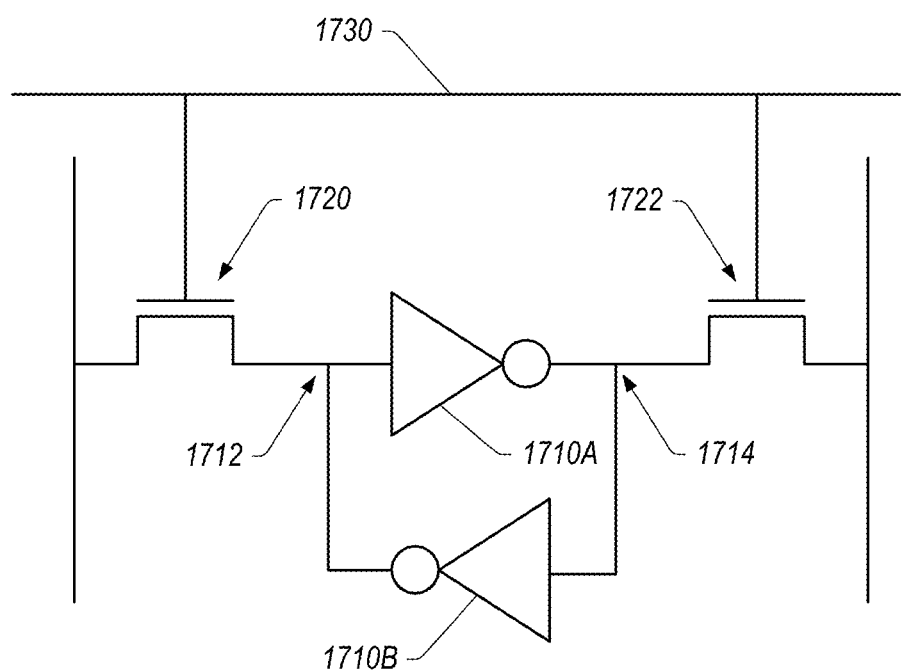
FIG. 19 depicts a schematic representation of a memory cell.

In various embodiments, stacked transistors, such as those described herein, may be implemented in memory cells such as SRAM cells. FIG. 19 depicts a schematic representation of a memory cell. Cell 1700 is, by example, a 6T SRAM memory cell. Cell 1700 includes two inverters 1710A, 1710B that are cross-coupled with the inputs being fed into the outputs at node 1712 and node 1714. Node 1712 is coupled to the output of pass gate 1720 and node 1714 is coupled to output of pass gate 1722. Pass gates 1720, 1722 may sometimes be referred to as "access gates" or "transmission gates". Wordline 1730 is coupled to pass gate 1720 and pass gate 1722 to provide control signals to the pass gates. Bitline 1740 is coupled to pass gate 1720 to read/write data from the pass gate. Bitline 1742, which is complementary to bitline 1740, is coupled to pass gate 1722 to read/write data from the pass gate.

With inverter 1710A, inverter 1710B, pass gate 1720, and pass gate 1722, cell 1700 includes six transistors—two in each of the inverters and one in each of the pass gates. In certain embodiments, the inverters 1710 include two complementary transistors—for example, each inverter includes an NMOS transistor and a PMOS transistor. Pass gates 1720, 1722 may be transistors of the same type. In one embodiment, both pass gates are NMOS transistors. Thus, in various embodiments, cell 1700 includes four NMOS transistors and two PMOS transistors.

The present disclosure contemplates various techniques that implement stacked transistors in a memory cell. For instance, stacked transistors, such as those described above, may be implemented in the 6T SRAM memory cell shown in FIG. 19. Utilizing the disclosed embodiments of stacked transistors in a memory cell provides capability for minimizing spacing along with multiple transistors in the memory cell. Accordingly, the disclosed embodiments of memory cells include multiple transistors in a small scale factor.

Certain embodiments disclosed herein have five broad elements: 1) a first transistor region with first and second active regions in parallel; 2) a second transistor region with third and fourth active regions in parallel where the second transistor region is positioned vertically below the first transistor region, 3) a first inverter formed by a transistor in the first active region and a transistor in the third active region, 4) a second inverter formed by a transistor in the second active region and a transistor in the fourth active region, and 5) a cross-coupling between the first inverter and the second inverter. In certain embodiments, the source/drain regions in the inverters are merged. For instance, the source/drain regions on opposite sides of the gates of the two transistors in the first inverter may be merged. In certain embodiments, the cross-coupling is achieved by coupling a horizontally extended portion of the gate for the transistor in the third active region with a source/drain region of the transistor in the fourth active region and coupling a horizontally extended portion of the gate for the transistor in the fourth active region with a source/drain region of the transistor in the third active region.

In various embodiments, the horizontally extended portions of the gates for cross-coupling are portions that extend towards and possibly into the other active region (e.g., the gate for the transistor in the third active region has a portion extending into the fourth active region). Extending the gates as described herein allows the cross-couple connections to be made in areas of the cell vertically below the active regions of the memory cell. The cross-couplings may also be positioned vertically above any backside layer routing. This area is available for cross-coupling by removing material in inactive portions of the third and fourth active regions.

In short, the present inventors have recognized that stacked transistors may be implemented in a memory cell along with the removal of material for inactive portions of active regions to enable cross-coupling of inverters formed by the transistors in the memory cell. The cross-coupling of the inverters in the areas intended for inactive portions provides a memory cell construction that maintains current design philosophies while also reducing the cell height versus typical memory cells. The cell height may be reduced as the utilization of the cross-coupling in an area below the active regions allows the active regions to be vertically positioned closer together. Minimizing the vertical spacing between the active regions accordingly allows reduction in the overall height of the memory cell.

Figure 20:
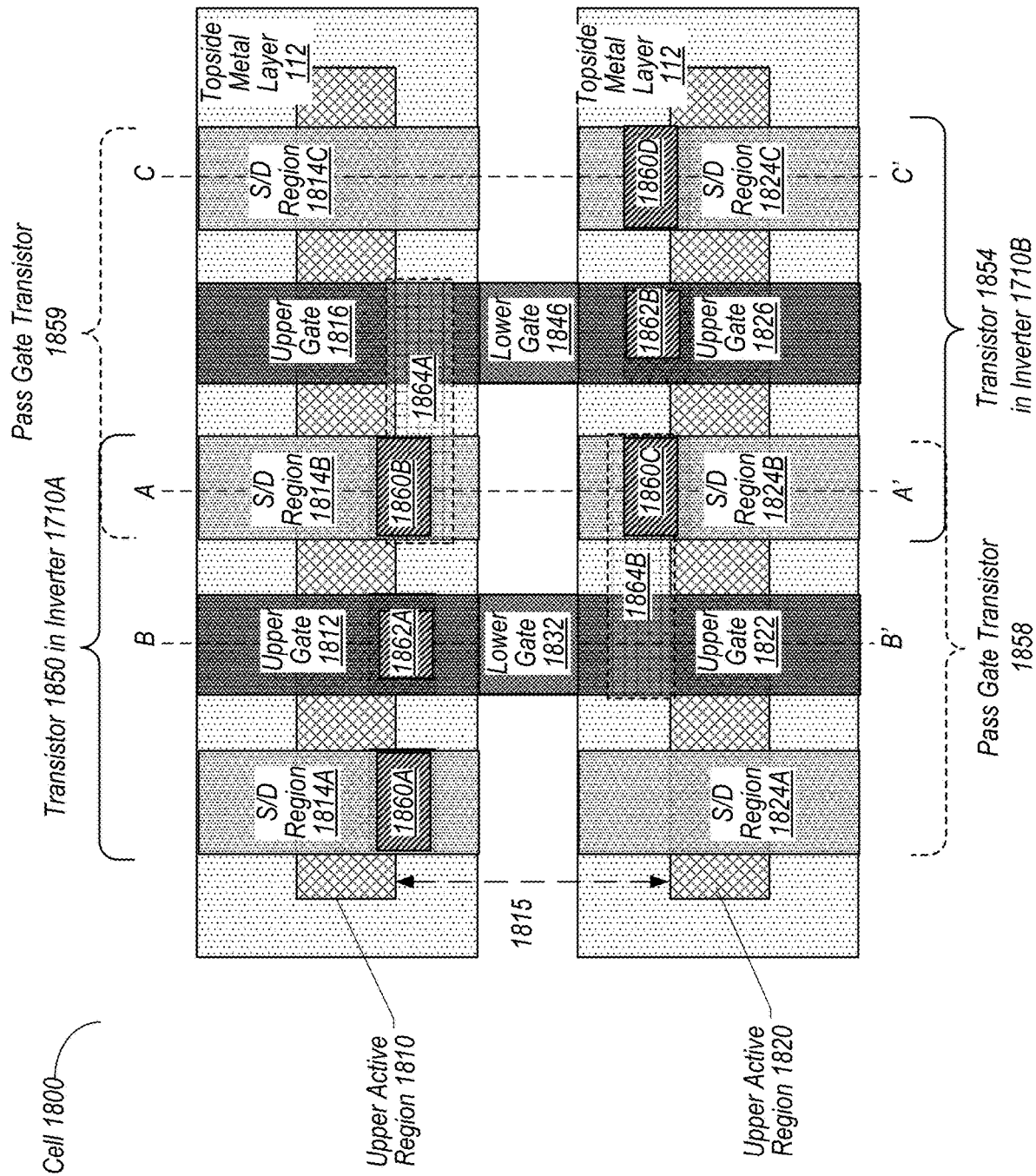
FIG. 20 depicts a topside plan view representation of a memory cell with stacked transistors, according to some embodiments.
Figure 21:
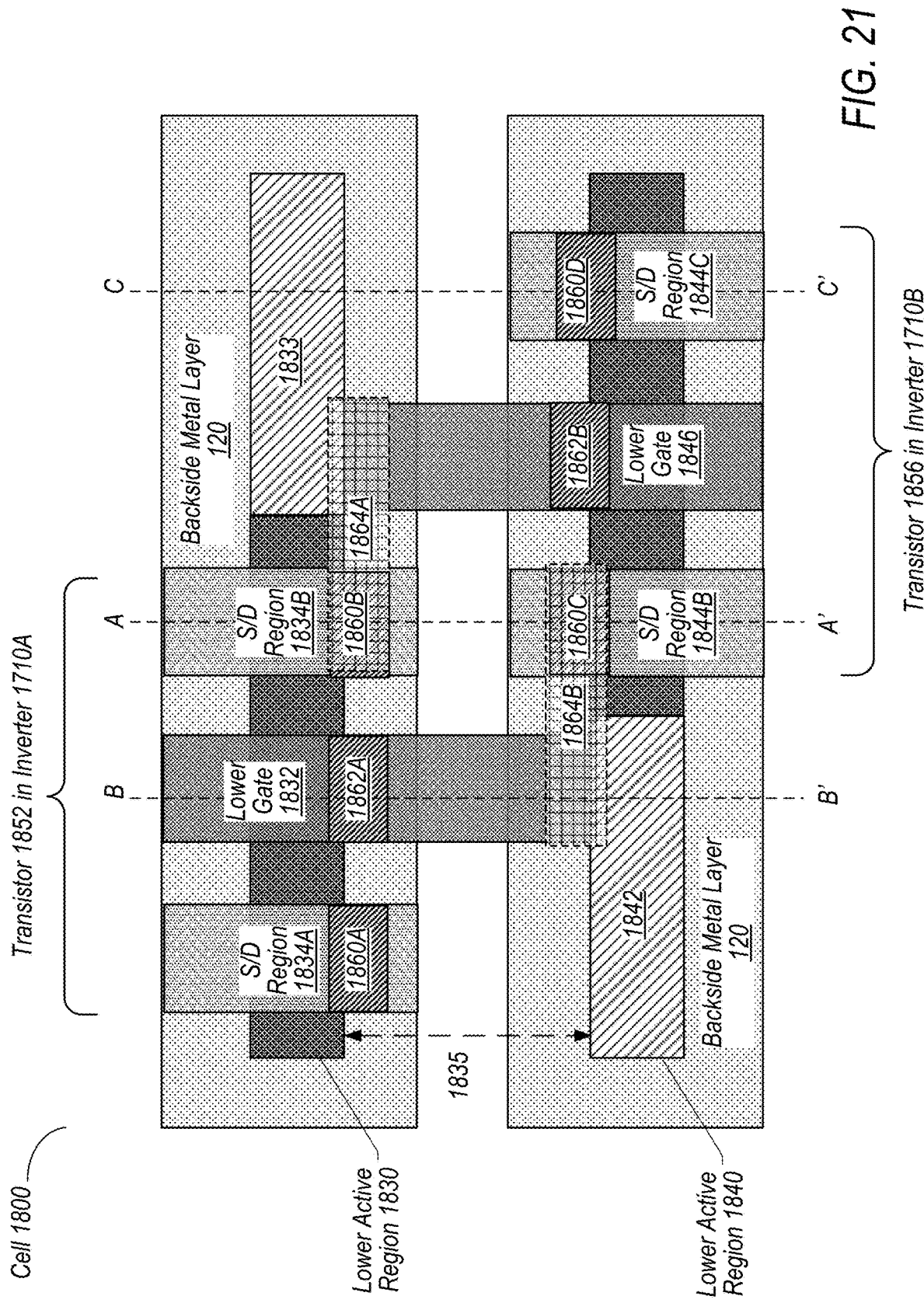
FIG. 21 depicts a backside plan view representation of a memory cell with stacked transistors, according to some embodiments.

FIG. 20 depicts a topside plan view representation of memory cell 1800 with stacked transistors, according to some embodiments. FIG. 21 depicts a backside plan view representation of memory cell 1800 with stacked transistors, according to some embodiments. FIG. 22 depicts a cross-sectional representation of memory cell 1800 along the line A-A' shown in both FIGS. 20 and 21. FIG. 23 depicts a cross-sectional representation of memory cell 1800 along the line B-B' shown in both FIGS. 20 and 21. FIG. 24 depicts a cross-sectional representation of memory cell 1800 along the line C-C' shown in both FIGS. 20 and 21.

For simplicity in the drawings, only components relevant to the disclosure are shown in the representations of a cell disclosed herein. A person with knowledge in the art would understand that additional components may be present in any of the cells depicted herein. For instance, in FIGS. 20 and 21, various connections (such as vias or contacts described herein) may be visible in some depictions. Additionally, some transparency of material is provided to enable visibility of underlying components in topside and backside plan views for better understanding of the disclosed embodiments. For instance, in FIGS. 20 and 21, gates (e.g., poly lines) and source/drain regions have some transparency to provide visibility of vias/contacts, and active regions in the underlying areas of the transistors and, in FIGS. 20 and 21, the topside and backside metal layers have transparency to provide visibility of the transistors that would be hidden in the plan views. Depths of the various components may be seen more clearly in the cross-sectional representations of FIGS. 22-24. It should be noted that the topside metal layers are not depicted in the cross-sectional representations of FIGS. 22-24 for further simplicity in the drawings.

In the illustrated embodiments, cell 1800 includes two upper active regions 1810, 1820 (shown in FIG. 20) and two lower active regions 1830, 1840 (shown in FIG. 21). In certain embodiments, upper active regions 1810, 1820 are active regions for NMOS transistors and lower active regions 1830, 1840 are active regions for PMOS transistors. Lower active regions 1830, 1840 may include inactive portions 1833, 1842 (shown by the angled fill pattern in the active regions of FIG. 21). Inactive portions 1833, 1842 may be formed by not having diffusion material in the portions (e.g., through either removing diffusion material or not having diffusion material deposited in the portions) or disconnecting diffusion material from active portions of the lower active regions 1830, 1840 (e.g., by an isolation structure or mechanism).

Upper active region 1810 is separated from upper active region 1820 by a diffusion to diffusion spacing distance 1815. Similarly, lower active region 1830 is separated from lower active region 1840 by a diffusion to diffusion spacing distance 1835. In some embodiments, distance 1815 and distance 1835 are substantially the same distances.

In the illustrated embodiments, upper active region 1810 includes upper gate 1812 between source/drain region 1814A and source/drain region 1814B and upper gate 1816 between source/drain region 1814B and source/drain region 1814C. Upper active region 1820 includes upper gate 1822 between source/drain region 1824A and source/drain region 1824B and upper gate 1826 between source/drain region 1824B and source/drain region 1824C. Upper gates 1812, 1816, 1822, 1826 may be poly gates or other types of gates for FET transistor devices. In one embodiment, upper gates 1812, 1816, 1822, 1826 are NMOS gates.

In certain embodiments, upper gate 1812 is separated from upper gate 1822 and upper gate 1816 is separated from upper gate 1826. For instance, the poly for upper gate 1812 is not connected to the poly for upper gate 1822. Similarly, the poly for upper gate 1816 is not connected to the poly for upper gate 1826. The upper gates may be separated by either cutting the poly between the upper gates (e.g., cutting the poly between upper active region 1810 and upper active region 1820) or forming the upper gates from separate poly layers in upper active region 1810 and upper active region 1820. Separation of the upper gates between upper active region 1810 and upper active region 1820 provides distinction between transistors formed by these upper gates to allow the upper gates to form transistors for inverters and pass gates, as described herein.

In the illustrated embodiments, lower active region 1830 includes lower gate 1832 between source/drain region 1834A and source/drain region 1834B. Lower active region 1840 includes lower gate 1846 between source/drain region 1844B and source/drain region 1844C. It should be noted that there are only two gate regions in the lower active regions 1830, 1840 due to the presence of inactive portions 1833, 1842 and as only two transistors are needed in combination with the four transistors in the upper active regions in order to form a memory cell device. Lower gates 1832, 1846 may be poly gates or other types of gates for FET transistor devices. In one embodiment, lower gates 1832, 1846 are PMOS gates.

In certain embodiments, as shown in FIG. 21, portions of lower gate 1832 and lower gate 1846 extend across the separation distance 1835 between lower active region 1830 and lower active region 1840. The portions of lower gate 1832 and lower gate 1846 extend across the separation distance are also seen in the depiction of FIG. 20 in the gap between upper active region 1810 and upper active region 1820. In some embodiments, the portions of lower gate 1832 and lower gate 1846 extend across the separation distance 1835 extend below a transistor region of the other lower active region. For example, as shown in FIGS. 20 and 21, lower gate 1832 extends into a transistor region around lower active region 1840, which is below the transistor region around upper active region 1820. Similarly, lower gate 1846 extends into a transistor region around lower active region 1830, which is below the transistor region around upper active region 1810. In some embodiments, the portions of lower gate 1832 and lower gate 1846 extend under the transistor regions that define pass gates in the upper active regions, as described in more detail below. The extensions of lower gate 1832 and lower gate 1846 across the active regions provides capabilities for cross-coupling connections in cell 1800, as also described in more detail below.

An example embodiment of a 6T (six-transistor) SRAM memory cell that may be implemented in cell 1800 is now described with respect to the various connections made within the cell to implement the six transistors (e.g., four NMOS transistors and two PMOS transistors) that are arranged as inverters and pass gates. It should be understood that various additional embodiments of memory cells may be contemplated based on the disclosed structure of cell 1800. As shown in FIG. 19, a 6T SRAM memory cell includes two NMOS transistors and two PMOS transistors arranged to form two inverters, which are then cross-coupled. Two more NMOS transistors are then arranged to form pass gates connected to the inverters.

Turning back to cell 1800, upper gate 1812 along with source/drain region 1814A and source/drain region 1814B, shown in FIG. 20, may form first NMOS transistor 1850 of inverter 1710A. Then, as shown in FIG. 21, lower gate 1832 along with source/drain region 1834A and source/drain region 1834B may form first PMOS transistor 1852 of inverter 1710A. To form inverter 1710A with transistor 1850 and transistor 1852, source/drain region 1814A is merged with source/drain region 1834A by S/D merge 1860A. S/D merge 1860A may be, for example, a via or other substantially vertical connection made between source/drain region 1814A and source/drain region 1834A. Merging of source/drain region 1814A and source/drain region 1834A merges power connections between transistor 1850 and transistor 1852.

Additionally for transistor 1850 and transistor 1852, source/drain region 1814B is merged with source/drain region 1834B by S/D merge 1860B (as shown in FIG. 22). Merging of source/drain region 1814B and source/drain region 1834B merges the outputs of transistor 1850 and transistor 1852. The inputs of transistor 1850 and transistor 1852 may be merged by merging upper gate 1812 with lower gate 1832 using gate merge 1862A. Gate merge 1862A, as shown in FIG. 23, may be a via or other substantially vertical connection made between upper gate 1812 and lower gate 1832. With the inputs and outputs of transistor 1850 and transistor 1852 merged, the transistors form inverter 1710A.

Inverter 1710B, shown in FIG. 19, may similarly be formed by second NMOS transistor 1854 and second PMOS transistor 1856, shown in FIGS. 20 and 21. Transistor 1854 may be formed by upper gate 1826 along with source/drain region 1824B and source/drain region 1824C, as shown in FIG. 20. Transistor 1856 may be formed by lower gate 1846 along with source/drain region 1844B and source/drain region 1844C, as shown in FIG. 21. source/drain region 1814A is merged with source/drain region 1834A by S/D merge 1860A.

To form inverter 1710B with transistor 1854 and transistor 1856, source/drain region 1824B is merged with source/drain region 1844B by S/D merge 1860C (also shown in FIG. 22) and source/drain region 1824C is merged with source/drain region 1844C by S/D merge 1860D (also shown in FIG. 24). Merging of source/drain region 1824B and source/drain region 1844B merges the outputs of transistor 1854 and transistor 1856 while merging of source/drain region 1824C and source/drain region 1844C merges power connections between transistor 1854 and transistor 1856. The inputs of transistor 1854 and transistor 1856 are then merged by merging upper gate 1826 with lower gate 1846 using gate merge 1862B. With the inputs and outputs of transistor 1854 and transistor 1856 merged, the transistors form inverter 1710B.

In various embodiments, cell 1800 provides availability for forming pass gate 1720 and pass gate 1722 in addition to the inverters 1710A, 1710B. For instance, pass gate 1720 may be formed with third NMOS transistor 1858 while pass gate 1722 is formed with fourth NMOS transistor 1859, as shown in FIG. 20. It should be noted that both transistor 1858 and transistor 1859 are formed without any underlying PMOS transistor (e.g., above the inactive portions of the lower active regions). In the illustrated embodiment, transistor 1858 is formed by upper gate 1822 along with source/drain region 1824A and source/drain region 1824B. Transistor 1859 is formed by upper gate 1816 along with source/drain region 1814B and source/drain region 1814C.

Both upper gate 1816 and upper gate 1822 may be coupled to a wordline (e.g. wordline 1730) for the transmission of control signals to the gates. A read/write data connection to a bitline (e.g., bitline 1742) for upper gate 1816 may be provided through source/drain region 1814C while a read/write data connection to a bitline (e.g., bitline 1740) for upper gate 1822 may be provided through source/drain region 1824A. The output of transistor 1859 (which corresponds to pass gate 1722) is provided through source/drain region 1814B, which is also the output of transistor 1850 and merged with the output of transistor 1852 in inverter 1710A. Correspondingly, the output of transistor 1858 (which corresponds to pass gate 1720) is provided through source/drain region 1824B, which is also the output of transistor 1854 and merged with the output of transistor 1856 in inverter 1710B. Thus, transistors 1858, 1859 provide pass gate transistors 1720, 1722 that are coupled to inverter 1710A and inverter 1710B according to the schematic diagram of FIG. 19.

As discussed above, in certain embodiments, lower gate 1832 (in transistor 1852 of inverter 1710A) and lower gate 1846 (in transistor 1856 of inverter 1710B) extend towards the inactive portions of the active regions of the opposite transistor region. These extensions provide capability for providing cross-coupling between the inverters below the active regions of cell 1800. For example, as shown in FIG. 23, lower gate 1832 extends below gate 1822 formed in active region 1820. With the extension of lower gate 1832, cross-coupling 1864B can be coupled between lower gate 1832 (which is the merged PMOS transistor gate in inverter 1710A) and source/drain region 1844B (which is the merged PMOS source/drain region in inverter 1710B). Thus, cross-coupling 1864B cross-couples the input of inverter 1710A and the output of inverter 1710B. Similarly, cross-coupling 1864A, shown in FIGS. 20-22, may be implemented to cross-couple the input of inverter 1710B (by coupling to the extension of lower gate 1846) and the output of inverter 1710A (by coupling to source/drain region 1834B, as shown in FIG. 22).

In certain embodiments, cross-couplings 1864A, 1864B are positioned below the active regions and above backside metal layers 120 in cell 1800. For example, as shown in FIGS. 22 and 23, cross-couplings 1864A, 1864B are coupled to the backside (e.g., bottom) of lower gates and source/drain regions in the lower transistor region of the PMOS transistors. Cross-couplings 1864A, 1864B may be placed in this area due to the removal of material in inactive portions 1833, 1842 of lower active regions 1830, 1840. Cross-couplings 1864A, 1864. The use of cross-couplings 1864A, 1864B in cell 1800 maintains a current design philosophy for a SRAM cell while reducing the cell height versus typical SRAM cells. For example, cross-couplings 1864A, 1864B, as implemented with lower gate 1832 and lower gate 1846, provides better area scaling in cell 1800 by allowing both the upper active regions 1810, 1820 and the lower active regions 1830, 1840 to be brought closer together. For instance, in some embodiments, both the upper active regions 1810, 1820 and the lower active regions 1830, 1840 may be positioned with minimum required spacing between the diffusion regions in the active regions. Implementing the minimum required spacing may reduce the height of cell 1800 to about ½ the typical height of a 6T SRAM cell.

Macro SRAM Cells

In various embodiments, in addition to being implemented in memory cells such as SRAM cells (e.g., SRAM bit cells), stacked transistors, such as those described herein, may be implemented in periphery cells associated with SRAM cells. For instance, the present disclosure contemplates various techniques that implement column input/output logic cells that include the stacked transistors. Implementation of stacked transistors in periphery cells, such as column input/output logic cells, may allow utilization of both topside and backside routing in a memory device containing various types of SRAM cells, including the various embodiments of SRAM cells described herein.

Certain embodiments disclosed herein have four broad elements: 1) a plurality of bit cells formed in first and second transistor regions that are vertically disposed relative to each other; 2) a first metal layer located above the bit cells (e.g., a topside metal layer) and a second metal layer located below the bit cells (e.g., a backside metal layer), 3) a first column input/output logic cell coupled a first array of bit cells, and 4) a second column input/output logic cell coupled a second array of bit cells where the second array of bit cells is closer to the logic cells than the first array of bit cells. In certain embodiments, the first metal layer includes first routing that couples the first array of bit cells to the first column input/output logic cell while the second metal layer includes second routing that couples the second array of bit cells to the second column input/output logic cell. In some embodiments, the column input/output logic cells implement stacked transistors, such as those described herein.

Accordingly, in various embodiments, the first column input/output logic cell provides column I/O logic for bit cells that are further away from the periphery region of the device while the second column input/output logic cell provides column I/O logic for bit cells that are closer to the periphery region of the device. Splitting the routing between the topside and backside metal layers reduces routing congestion compared to utilization of only topside or backside routing for routing logic in a memory device. In various embodiments, dummy cells may be utilized for localized routing of bitline signals between topside and backside metal layers. For instance, dummy cells may be utilized for localized routing near bit cells of the first array (e.g., bit cells far away from the logic cells).

In short, the present inventors have recognized that routing for column I/O logic in both topside metal layers and backside metal layers can be utilized in a memory device to relieve metal congestion in the memory device. Additionally, various techniques are implemented to reduce any area penalties associated with front to back transitions (or vice versa) when both topside metal layers and backside metal layers are used for routing logic between bit cells and logic cells. In some embodiments, the various routing paths provide reduced resistance paths for logic within a memory device. With implementation of the various disclosed techniques, the disclosed embodiments of a memory device may have strong signal connectivity with improved read/write speeds and thus improved performance.

Figure 25:
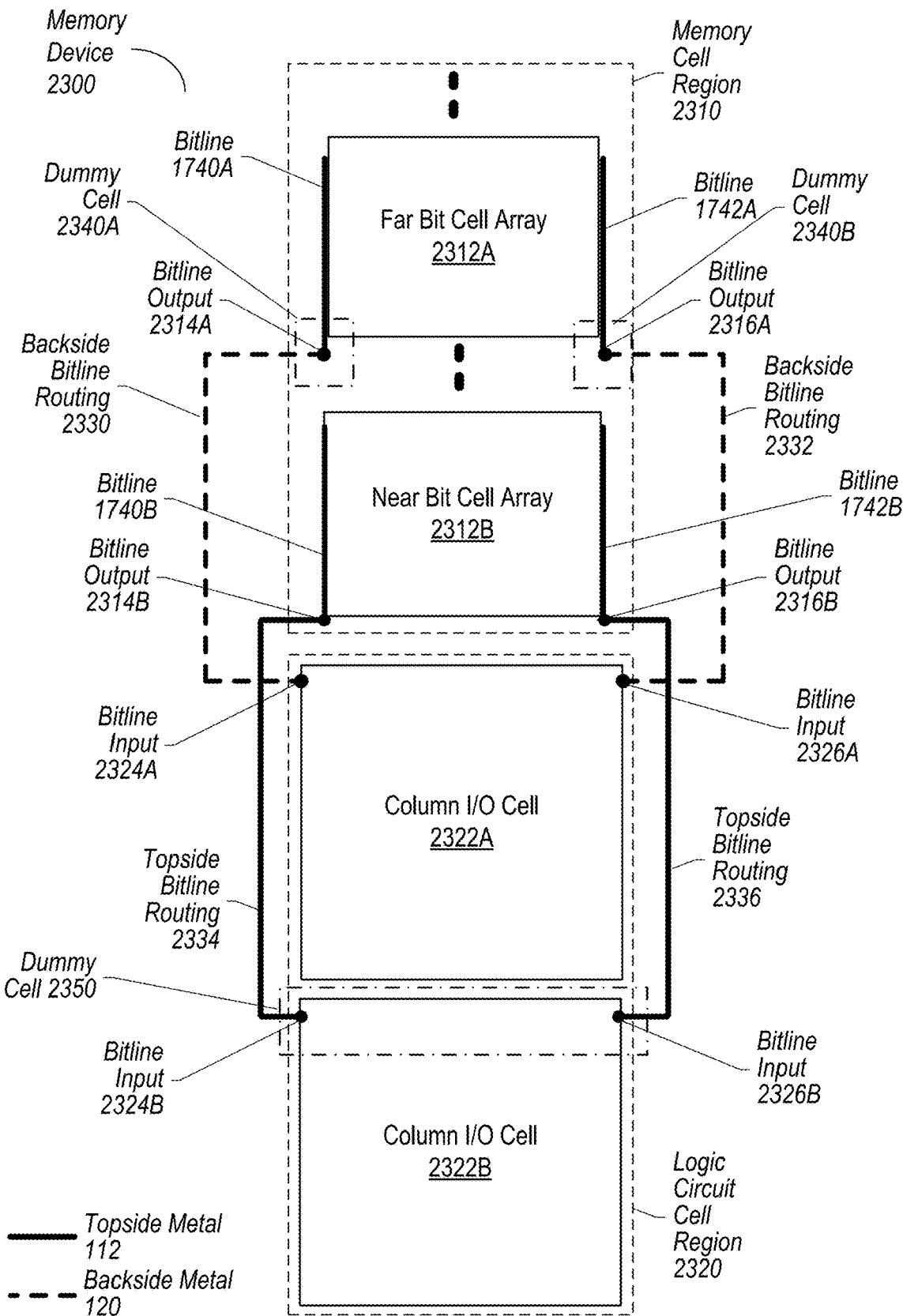
FIG. 25 depicts a block diagram representation of a memory device, according to some embodiments.

FIG. 25 depicts a block diagram representation of a memory device, according to some embodiments. In the illustrated embodiment, memory device 2300 includes memory cell region 2310 and logic circuit cell region 2320. Memory cell region 2310 includes a plurality of bit cells that may be divided into far bit cell array 2312A and near bit cell array 2312B. The bit cells in the arrays may be, for example, SRAM cells 1800, described above. Far bit cell array 2312A includes a plurality of bit cells that are positioned further away from logic circuit cell region 2320 than the bit cells in near bit cell array 2312B, as depicted in FIG. 25.

In various embodiments, logic circuit cell region 2320 includes multiple column input/output (I/O) logic cells 2322. Column I/O cells 2322 may, for instance, manage read/writes from bit cell arrays 2312. Column I/O cells 2322 may also include portions of sense amplifiers. It should be understood that logic circuit cell region 2320 may include other logic cells in addition to column input/output (I/O) logic cells 2322. For instance, logic circuit cell region 2320 may also include power switch logic cells, wordline logic circuit cells, local I/O circuit cells, global I/O circuit cells, etc. In some embodiments, logic circuit cell region 2320 may be referred to as a periphery region of memory device 2300.

In a contemplated embodiment, logic circuit cell region 2320 includes individual column I/O logic cells 2322 for each bit cell array in memory cell region 2310. For instance, in the illustrated embodiment, logic circuit cell region 2320 includes first column I/O logic cell 2322A and second column I/O logic cell 2322B as memory cell region 2310 has two bit cell arrays 2312A, 2312B.

In various embodiments, first column I/O logic cell 2322A provides column I/O logic for far bit cell array 2312A and second column I/O logic cell 2322B provides column I/O logic for near bit cell array 2312B. Routing in both topside metal layers 112 and backside metal layers 120 may be utilized in memory device 2300 to relieve metal congestion in the memory device. The present disclosure contemplates routing methods that also reduce any front to back transition area penalty in the utilization of both topside metal layers 112 and backside metal layers 120 in routing logic between bit cells and logic cells.

In certain embodiments, memory device 2300 utilizes both topside metal layers 112 and backside metal layers 120 for bitline routing in the memory device. For example, topside metal layers 112 may be utilized for bitline routing between near bit cell array 2312B and second column I/O logic cell 2322B and backside metal layers 120 may be utilized for bitline routing between far bit cell array 2312A and first column I/O logic cell 2322A. In the illustrated embodiment, bitlines 1740A and bitlines 1742A provide bitline routing in far bit cell array 2312A and bitlines 1740B and bitlines 1742B provide bitline routing in near bit cell array 2312B. Bitlines 1740 and bitlines 1742 may be, as described herein, complementary bitlines.

As shown in FIG. 25, bitline 1740A and bitline 1742A in far bit cell array 2312A are coupled to bitline output 2314A and bitline output 2316A, respectively. Bitline output 2314A is then coupled to backside bitline routing 2330 and bitline output 2316A is coupled to backside bitline routing 2332. In certain embodiments, bitline 1740A and bitline 1742A are in topside metal layers 112. For instance, as shown in FIGS. 19 and 20, the output of the pass gate transistors are in the upper transistor region and coupled to topside metal layers 112. Because bitline 1740A and bitline 1742A are routing in the topside metal layers 112, as shown in FIG. 25, a transition needs to be made from the topside metal layers to the backside metal layer 120 where backside bitline routing 2330 and backside bitline routing 2332 are positioned.

Figure 26:
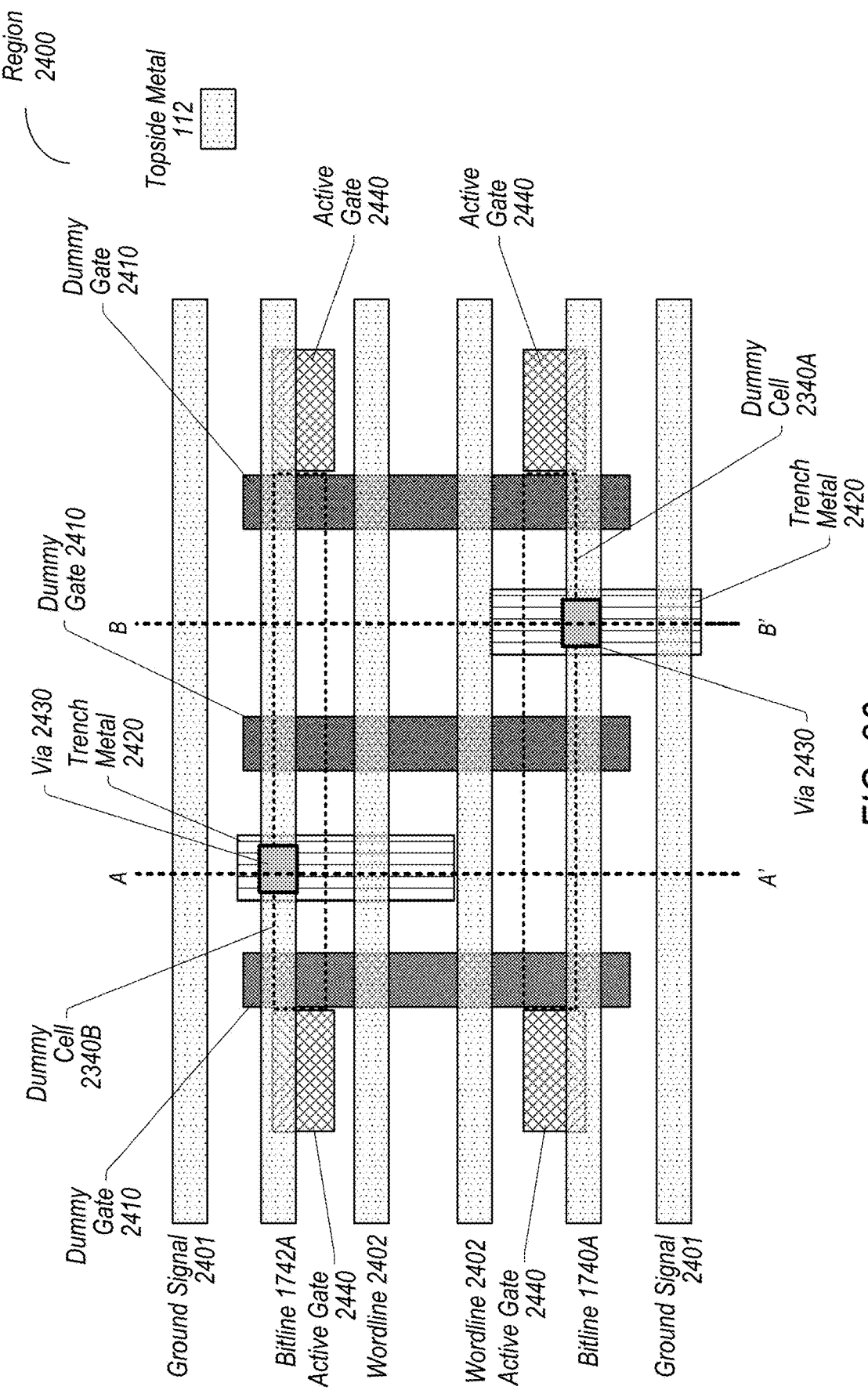
FIG. 26 depicts a topside plan view representation of a region having dummy cells, according to some embodiments.
Figure 27:
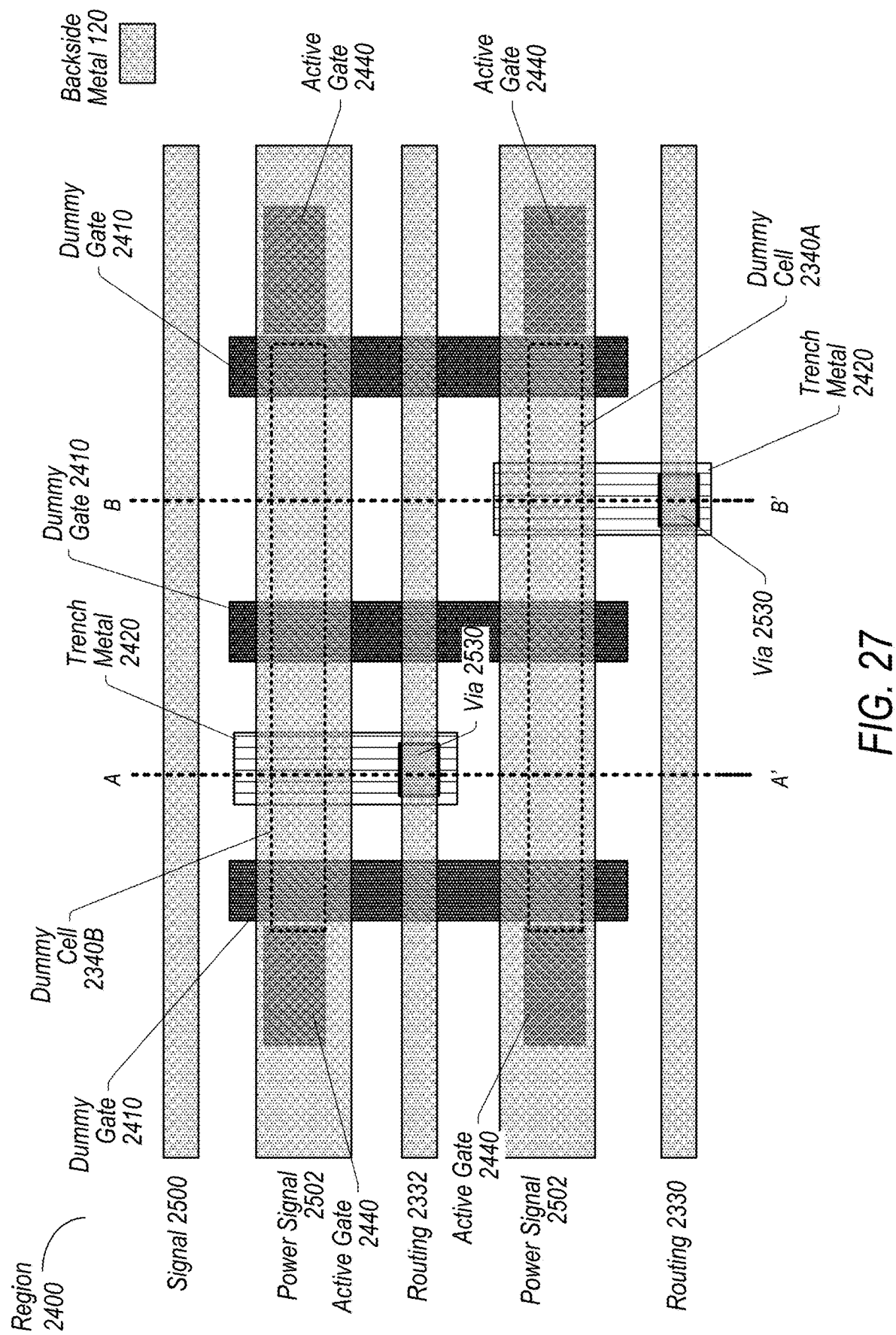
FIG. 27 depicts a backside plan view representation of the region having dummy cells, according to some embodiments.

In certain embodiments, dummy cells 2340A, 2340B are positioned at or near bitline outputs 2314A, 2316A, respectively. Dummy cell 2340A includes a connection between bitline 1740A in topside metal layers 112 and backside bitline routing 2330 in backside metal layers 120. Dummy cell 2340B includes a connection between bitline 1742A in topside metal layers 112 and backside bitline routing 2332 in backside metal layers 120. FIG. 26 depicts a topside plan view representation of a region having dummy cells 2340, according to some embodiments. FIG. 27 depicts a backside plan view representation of the region having dummy cells 2340, according to some embodiments. FIG. 28 depicts a cross-sectional representation of the region having dummy cells 2340 along the line A-A' shown in both FIGS. 26 and 27. FIG. 29 depicts a cross-sectional representation of the region having dummy cells 2340 along the line B-B' shown in both FIGS. 26 and 27.

In various embodiments, as shown in FIG. 26, topside metal layers 112 in region 2400 includes routing for ground signals 2401 and wordlines 2402 in addition to bitline 1740A and bitline 1742A. In various embodiments, as shown in FIG. 27, backside metal layers 120 in region 2400 includes routing for signal 2500 and power signals 2502 in addition to backside bitline routing 2330 and backside bitline routing 2332. In certain embodiments, dummy gates 2410 are positioned adjacent to active gates 2440 on both sides of region 2400. Dummy gates 2410 may be, for example, gate cuts or other gates that isolate the area between the dummy gates. Isolation may include, for example, inhibiting connections to any gate activity within the area between the dummy gates 2410.

In certain embodiments, dummy cells 2340A, 2340B include trench metal 2420 formed between bitline 1740A and backside bitline routing 2330 and between bitline 1742A and backside bitline routing 2332, as shown in FIGS. 26-29. Bitlines 1740A, 1742A may be coupled to trench metals 2420 by vias 2430 (shown in FIGS. 26 and 28-29) and backside bitline routings 2330, 2332 may be coupled to trench metals 2420 by vias 2530 (shown in FIGS. 27-29).

The use of trench metals 2420 for the connection between bitlines 1740A, 1742A and backside bitline routings 2330, 2332 provides a low electrical resistance path for bitline signals to transition from topside metal layers 112 to backside metal layers 120. Dummy cells 2340 provide localized traffic management for bitline signals at or near far bit cell array 2312A. While dummy cells 2340 have some area penalty in memory device 2300, the area penalty is small as the dummy cells are localized to shallow metal layers and are not associated with any global routing.

Turning back to FIG. 25, after bitline signals are routed to backside bitline routing 2330 and backside bitline routing 2332 at dummy cells 2340A, 2340B, respectively, the backside bitline routing carries the signals to bitline input 2324A and bitline input 2326A, respectively, at first column I/O cell 2322A. As described below, bitline input 2324A and bitline input 2326A in first column I/O cell 2322A (and bitline inputs in second column I/O cell 2322B) are inputs that are in the backside metal layers. Thus, no additional transition between topside metal layers 112 and backside metal layers 120 is needed for transmission of bitline signals from backside bitline routing 2330 and backside bitline routing 2332 to bitline input 2324A and bitline input 2326A in first column I/O cell 2322A.

Turning now to near bit cell array 2312B, bitline 1740B and bitline 1742B are coupled to bitline output 2314B and bitline output 2316B, respectively. Bitline output 2314B and bitline output 2316B are then coupled to topside bitline routing 2334 and topside bitline routing 2336, respectively. Since both bitlines 1740B, 1742B and topside bitline routings 2334, 2336 are located in topside metal layers 112, no transition between the topside metal layers and backside metal layers 120 is needed at near bit cell array 2312B.

In the illustrated embodiment, topside bitline routing 2334 and topside bitline routing 2336 carry bitline signals from near bit cell array 2312B to bitline input 2324B and bitline input 2326B, respectively, at second column I/O cell 2322B. As noted above and described below, bitline input 2324B and bitline input 2326B are positioned in backside metal layers 120. Accordingly, a transition from topside metal layers 112 to backside metal layers 120 may be needed at bitline input 2324B and bitline input 2326B.

Figure 30:
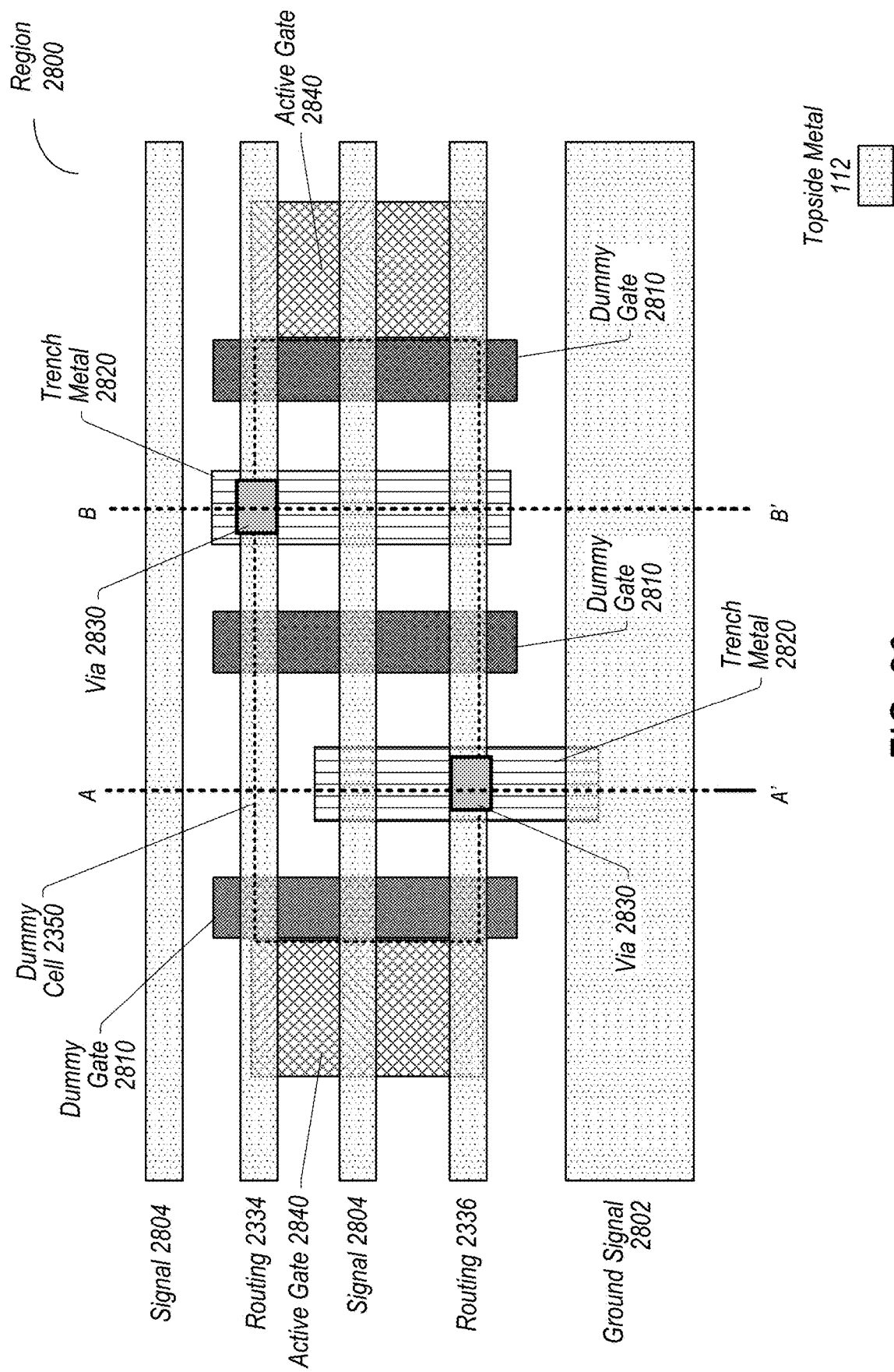
FIG. 30 depicts a topside plan view representation of a region having a dummy cell, according to some embodiments.
Figure 31:
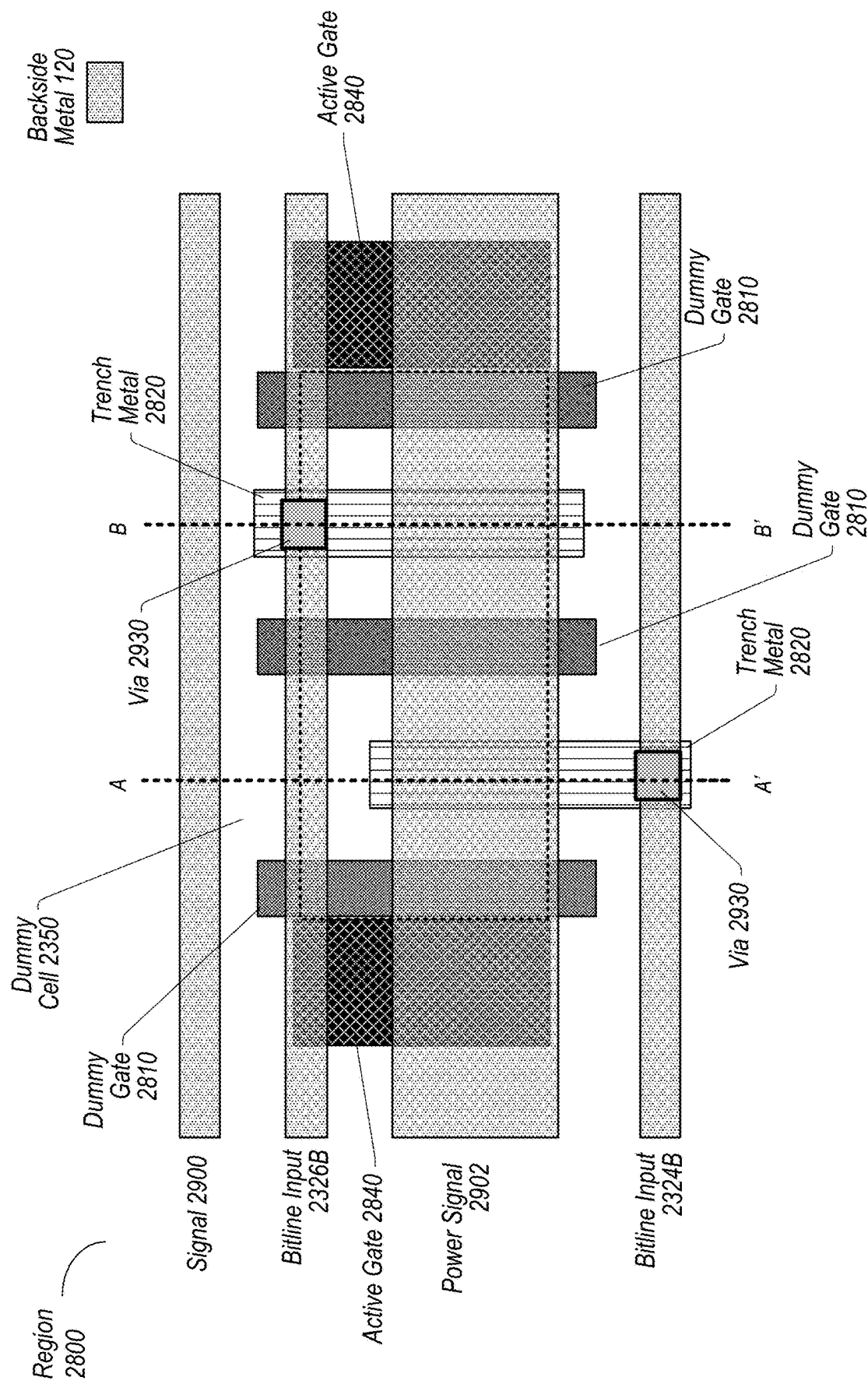
FIG. 31 depicts a backside plan view representation of the region having a dummy cell, according to some embodiments.

In certain embodiments, dummy cell 2350 is positioned at or near bitline inputs 2324B, 2326B. Dummy cell 2350 includes a connection between topside bitline routing 2334 in topside metal layers 112 and bitline input 2324B in backside metal layers 120 and a connection between topside bitline routing 2336 in topside metal layers 112 and bitline input 2326B in backside metal layers 120. FIG. 30 depicts a topside plan view representation of a region having dummy cell 2350, according to some embodiments. FIG. 31 depicts a backside plan view representation of the region having dummy cell 2350, according to some embodiments. FIG. 32 depicts a cross-sectional representation of the region having dummy cell 2350 along the line A-A' shown in both FIGS. 30 and 31. FIG. 33 depicts a cross-sectional representation of the region having dummy cell 2350 along the line B-B' shown in both FIGS. 30 and 31.

In various embodiments, as shown in FIG. 30, topside metal layers 112 in region 2800 includes routing for ground signal 2802 and signals 2804 in addition to topside bitline routing 2334 and topside bitline routing 2336. In various embodiments, as shown in FIG. 31, backside metal layers 120 in region 2800 includes routing for signal 2900 and power signal 2902 in addition to bitline input 2324B and bitline input 2326B. In certain embodiments, dummy gates 2810 are positioned adjacent to active gates 2840 on both sides of region 2800. Dummy gates 2810 may be, for example, gate cuts or other gates that isolate the area between the dummy gates. Isolation may include, for example, inhibiting connections to any gate activity within the area between the dummy gates 2810.

In certain embodiments, dummy cell 2350 includes trench metal 2820 formed between topside bitline routing 2334 and bitline input 2324B and between topside bitline routing 2336 and bitline input 2326B, as shown in FIGS. 30-33. Topside bitline routings 2334, 2336 may be coupled to trench metals 2820 by vias 2830 (shown in FIGS. 30 and 32-33) and bitline inputs 2324B, 2326B may be coupled to trench metals 2820 by vias 2930 (shown in FIGS. 31-33).

Similar to dummy cells 2340, the use of trench metals 2820 for the connection between topside bitline routings 2334, 2336 and backside bitline inputs 2324B, 2326B provides a low electrical resistance path for bitline signals to transition from topside metal layers 112 to backside metal layers 120. Dummy cells 2350 provide localized traffic management for bitline signals in logic circuit cell region 2320 (e.g., in the periphery region).

Turning back to FIG. 25, as with first column I/O cell 2322A, bitline inputs 2324B, 2326B in second column I/O cell 2322B are inputs that are in backside metal layers 120. Thus, after bitline signals are routed to bitline input 2324B and bitline input 2326B by dummy cell 2350, second column I/O cell 2322B can receive bitline signals in the proper metal layer. With the various routings of bitline signals from memory cell region 2310 to logic circuit cell region 2320 through combinations of topside metal layers 112 and backside metal layers, column logic I/O cells 2322 in the logic circuit cell region may, in various embodiments, have unipolar connectivity in a simple fabrication scheme.

Figure 34:
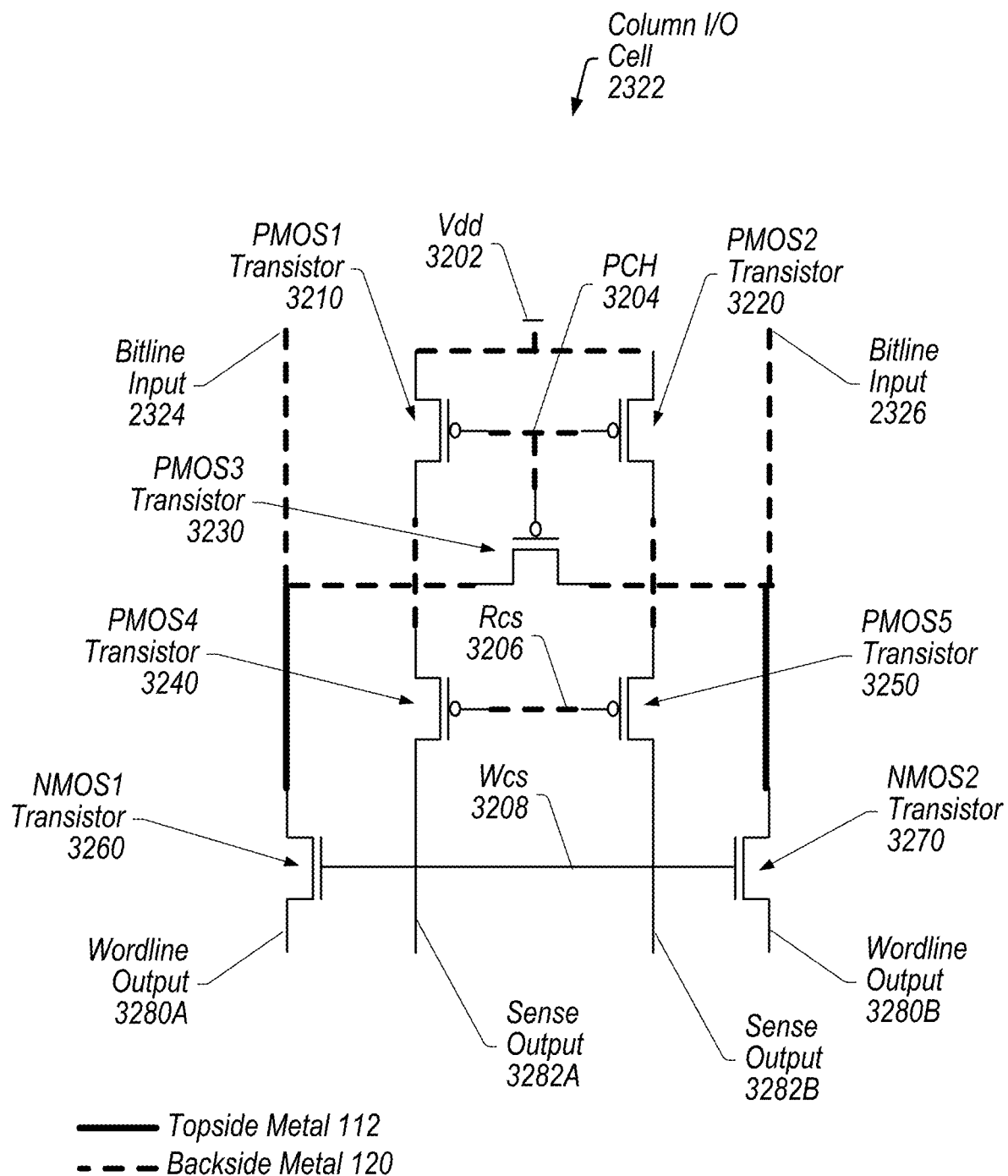
FIG. 34 depicts a schematic representation of a column I/O cell, according to some embodiments.

In various embodiments, column I/O cells 2322 may implement stacked transistors to provide connectivity to the various routings described above for memory device 2300. FIG. 34 depicts a schematic representation of a column I/O cell 2322, according to some embodiments. In the illustrated embodiment, cell 2322 includes five PMOS transistors and two NMOS transistors. The PMOS transistors include PMOS1 transistor 3210, PMOS2 transistor 3220, PMOS3 transistor 3230, PMOS4 transistor 3240, and PMOS5 transistor 3250. The NMOS transistors includes NMOS1 transistor 3260 and NMOS2 transistor 3270.

As shown in FIG. 34, various routings and connections for the transistors in cell 2322 are provided by topside metal layers 112 (solid lines) and backside metal layers 120 (dashed lines). In certain embodiments, cell 2322 includes Vdd 3202, Vss 3203, PCH 3204, Rcs 3206, Wcs 3208, wordline outputs 3280A, 3280B, and sense outputs 3282A, 3282B. Vdd 3202 provides routing to power for cell 2322 while Vss 3203 provides routing to ground. PCH 3204 couples PMOS1 transistor 3210, PMOS2 transistor 3220, and PMOS3 transistor 3230 to form a precharge circuit. Rcs 3206 couples PMOS4 transistor 3240 and PMOS5 transistor 3250 for a read column select circuit and Wcs 3208 couples NMOS1 transistor 3260 and NMOS2 transistor 3270 for a write column select circuit. Wordline outputs 3280A, 3280B provide write outputs from cell 2322 and sense outputs 3282A, 3282B provide read outputs from cell 2322.

Figure 35:
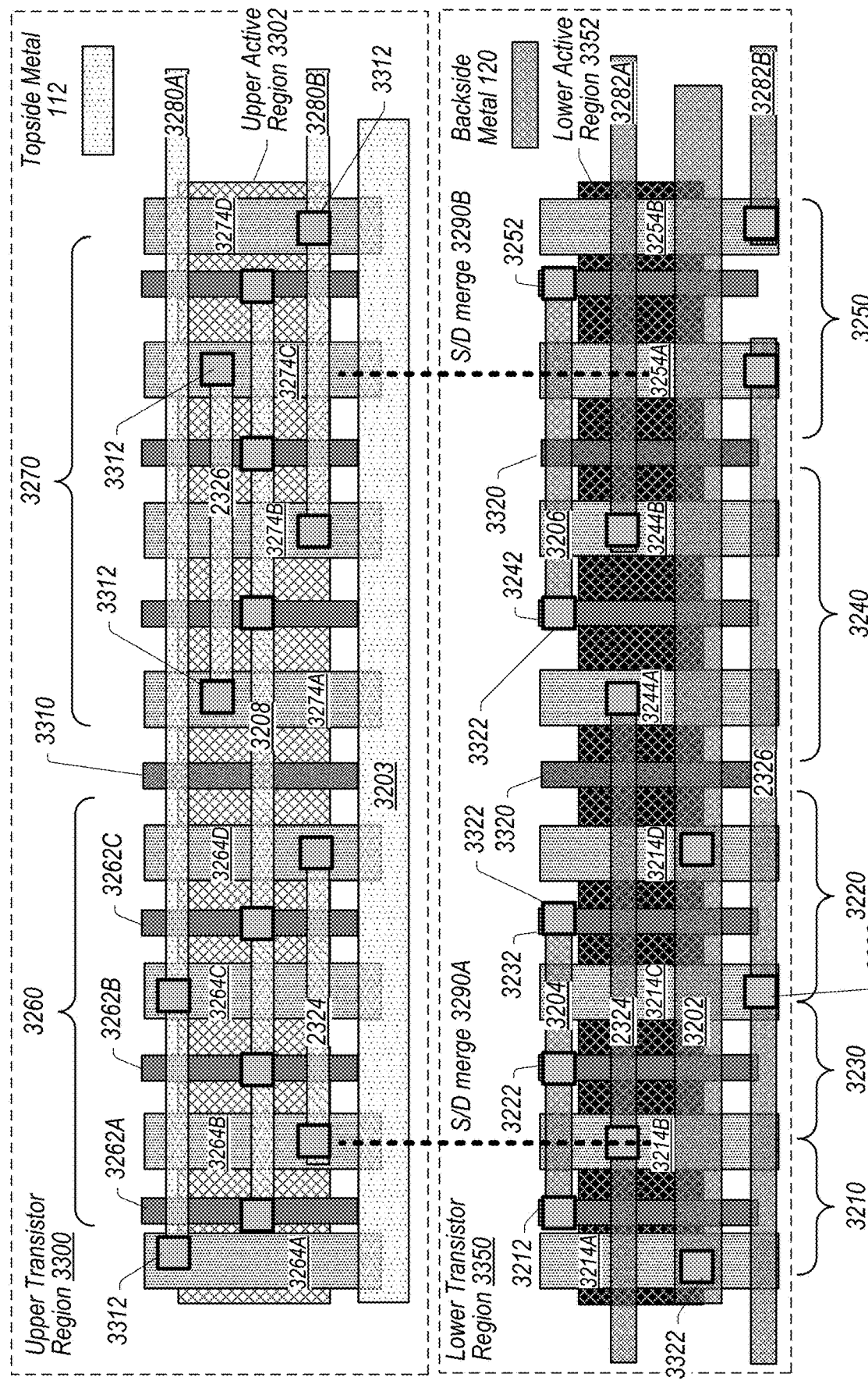
FIG. 35 depicts a layout of a column I/O cell, according to some embodiments.

In certain embodiments, the transistors in cell 2322 may be formed by a stacked transistor as described herein. For example, the PMOS transistors are formed in a lower transistor region and the NMOS transistors are formed in an upper transistor region. FIG. 35 depicts a layout of cell 2322, according to some embodiments. In FIG. 35, the top panel is a topside plan view representation of the upper transistor region 3300 and the bottom panel is a backside plan view representation of the lower transistor region 3350. Upper transistor region 3300 includes upper active region 3302 and lower transistor region 3350 includes lower active region 3352.

In the illustrated embodiment of upper transistor region 3300 in FIG. 35, topside metal layers 112 includes routing for bitline input 2324, bitline input 2326, Vss 3203, Wcs 3208, and wordline outputs 3280A, 3280B. NMOS1 transistor 3260 includes by gates 3262A, 3262B, 3262C and source/drain regions 3264A, 3264B, 3264C, 3264D. NMOS2 transistor 3270 includes by gates 3272A, 3272B, 3272C and source/drain regions 3267A, 3274B, 3274C, 3274D. Dummy gate 3310 (e.g., a gate cut) separates NMOS1 transistor 3260 and NMOS2 transistor 3270. Vias 3312 connect gates 3262 and gates 3272 using Wcs 3208. Vias 3312 also connect source/drain region 3264A and source/drain region 3264C to wordline output 3280A along with source/drain region 3274B and source/drain region 3274D to wordline output 3280B. Yet more vias 3312 connect source/drain region 3264B and source/drain region 3264D to bitline input 2324 and source/drain region 3274A and source/drain region 3274C to bitline input 2326.

In the illustrated embodiment of lower transistor region 3350 in FIG. 35, backside metal layers 120 includes routing for bitline input 2324, bitline input 2326, Vdd 3202, PCH 3204, Rcs 3206, and sense outputs 3282A, 3282B. PMOS1 transistor 3210 includes by gate 3212 and source/drain regions 3214A, 3214B. PMOS2 transistor 3220 includes by gate 3222 and source/drain regions 3214B, 3214C. PMOS2 transistor 3230 includes by gate 3232 and source/drain regions 3214C, 3214D. Dummy gate 3320 then separates source/drain region 3214D and PMOS2 transistor 3230 from source drain/region 3244A in PMOS4 transistor 3240. PMOS4 transistor 3240 includes gate 3242 and source/drain regions 3244A, 3244B. Another dummy gate 3320 then separates PMOS4 transistor 3240 and PMOS5 transistor 3250. PMOS5 transistor 3250 includes gate 3252 and source/drain regions 3254A, 3254B.

Vias 3322 connect gate 3212, gate 3222, and gate 3232 by PCH 3204. Vias 3322 also connect gate 3242 and 3252 using Rcs 3206. More vias 3322 connect source/drain region 3244B to sense output 3282A and source/drain region 3254B to sense output 3282B. Yet more vias 3322 connect source/drain region 3214B and source/drain region 3244A to bitline input 2324 and source/drain region 3214C and source/drain region 3254A to bitline input 2326. Vdd is connected to source/drain region 3214A and source/drain region 3214D by additional vias 3322.

In some embodiments, source/drain region 3214B in lower transistor region 3350 is merged with source/drain region 3264B in upper transistor region 3300 by source/drain merge 3290A. Additionally, source/drain region 3254A may be merged with source/drain region 3274C by source/drain merge 3290B. Merging of these source/drain regions provides necessary connections between NMOS transistors and PMOS transistors.

The embodiment of memory device 2300 described herein provides a memory device that may provide strong signal connectivity using current layout techniques without significant area penalties. Routing in memory device 2300 utilizes bitline routing through topside and backside metal layers to avoid metal routing congestion in the device. Memory device 2300 also avoids typical complexities involved with unipolar device fabrication utilizing the various routing paths and connection paths described herein. The various connection paths described herein may also reduce resistance within memory device 2300 and thus improve read/writing speeds and the performance of the memory device.

Vertical Transistor Cells

A recent development in transistor design is the implementation of vertical transistors where the cells have vertical transport through vertically displaced source/drain regions and a gate positioned vertically in between the source/drain regions. Current vertical transistor designs typically include wide frontside (e.g., topside) power rails at the boundaries of the cell for power delivery. These wide power rails, however, contribute to an increased and large standard cell height. The larger standard cell height reduces the area efficiency of the vertical transistor while also reducing available connectivity and performance of the transistor.

The present disclosure contemplates various embodiments that utilize backside power routing in vertical transistor designs to reduce scaling, provide better connectivity, and provide better performance of the transistors. Certain embodiments disclosed herein have four broad elements: 1) a pair of vertical transistors in an integrated circuit cell; 2) a topside metal layers above the transistor regions of the vertical transistors with signal routing, 3) a backside metal layer below the transistor regions with power routing, and 4) a metal contact layer between the backside metal layer and source/drain regions of the transistors. In certain embodiments, the transistors are complementary transistors. In some embodiments, vias couple power routing in the backside metal layer to the metal contact layer. In some embodiments, a second pair of vertical transistors may be included in the cell. Additional implementations of gate vias, fins, contact vias, and various other connections and routings may also be contemplated in various embodiments.

In various embodiments, control signal and power signal connections are made using various contacts or vias to implement logic associated with specific integrated circuit devices having multiple vertical transistors for the cell constructions described herein. For instance, examples of an inverter device, a NAND device, and a MUX device that may be implemented based on the vertical transistor cell construction are described below. Embodiments of various possible connections for control signals and voltage signals to the vertical transistors within the cell constructions are also described. A person with knowledge in the art would understand that combinations of these various possible connections may be implemented to generate many different desired circuits based on the vertical transistor structure within the cell constructions disclosed herein.

In short, the present inventors have recognized that the implementation of backside routing for power connections in combination with vertical transistors provides various opportunities for construction of specific transistor designs with reduced scaling. Additionally, various techniques are implemented to provide specific routing for control signal and power routing within the cell constructions with vertical transistors described herein. With implementation of the various disclosed techniques, vertical transistor cell constructions that provide improved performance in a small scale factor are contemplated.

Figures 36, 37:
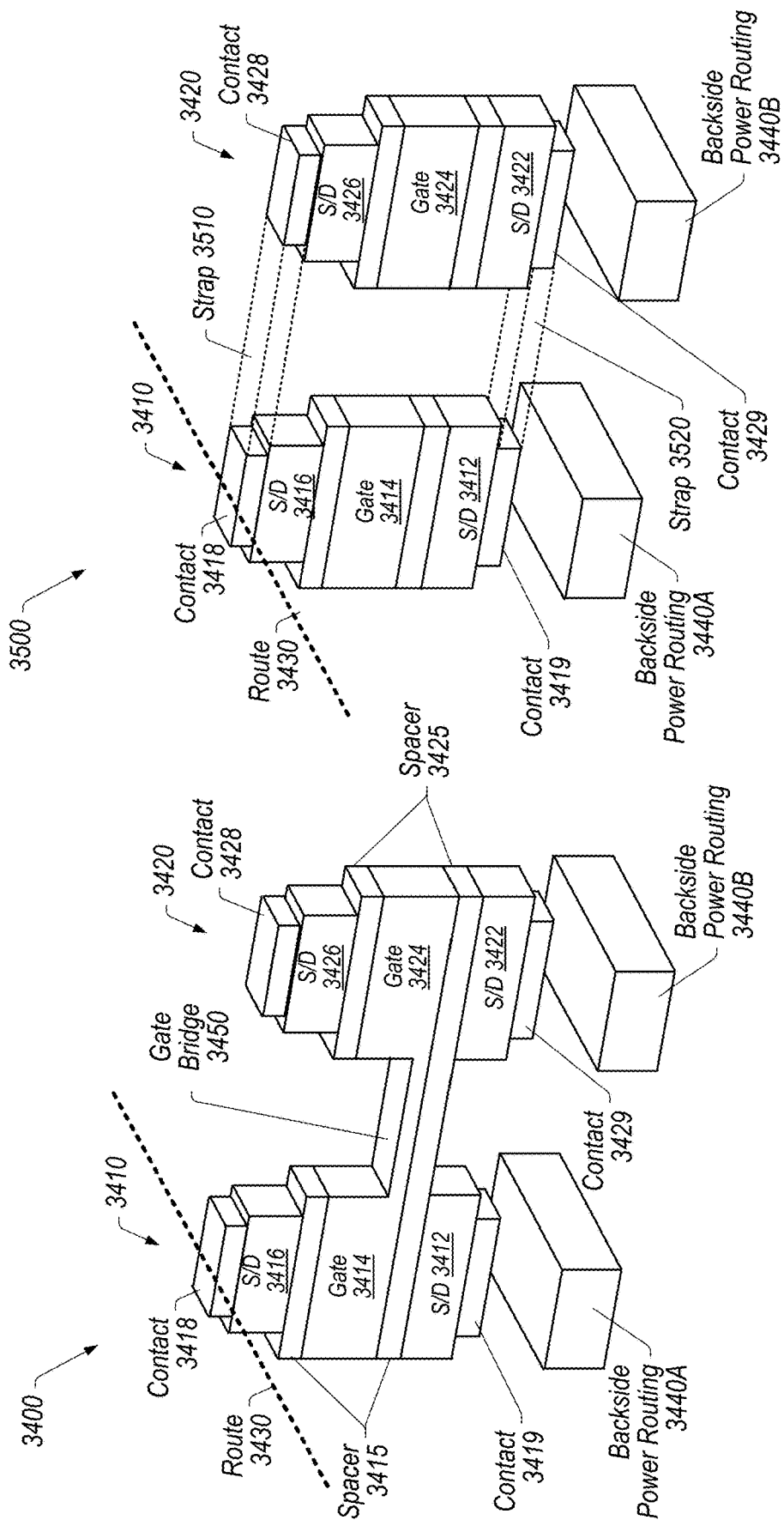
FIG. 36 depicts a perspective representation of a contemplated vertical transistor device, according to some embodiments.
FIG. 37 depicts a perspective representation of another contemplated vertical transistor device, according to some embodiments.

FIG. 36 depicts a perspective representation of a contemplated vertical transistor device, according to some embodiments. FIG. 37 depicts a perspective representation of another contemplated vertical transistor device, according to some embodiments. It should be noted that device 3400, shown in FIG. 36, and device 3500, shown in FIG. 37, are generic representations of vertical transistor-based device structures without depiction of various connections that can be made to the structures. Example embodiments of connected structures are further disclosed herein below with respect to FIGS. 38-54.

In the illustrated embodiment of FIG. 36, device 3400 includes two vertical transistors 3410, 3420. In certain embodiments, transistors 3410, 3420 are complementary types of transistors. For instance, transistor 3410 is a PMOS transistor and transistor 3420 is an NMOS transistor. Transistor 3410 includes lower source/drain region 3412, gate 3414, and upper source/drain region 3416. Similarly, transistor 3420 includes lower source/drain region 3422, gate 3424, and upper source/drain region 3426. In some embodiments, gate 3414 and gate 3424 are fin-type gates. In various embodiments, gate 3414 includes gate spacers 3415 and gate 3424 includes gate spacers 3425. Gate spacers 3415, 3425 are not labelled in the remaining figures for simplicity in the drawings.

As depicted in FIG. 36, the lower source/drain regions, the gates, and the upper source/drain regions are stacked in the vertical dimension of the transistors. Further as depicted, transistor 3410 and transistor 3420 are parallel and have a spacing (e.g., distance) between them in the horizontal direction (e.g., the horizontal dimension) of device 3400.

In certain embodiments, transistor 3410 includes upper contact 3418 coupled to upper source/drain region 3416 and transistor 3420 includes upper contact 3428 coupled to upper source/drain region 3426. Contact 3418 and contact 3428 may be, for example, metal contacts for contacting various resources in a first metal layer positioned above transistor 3410 and transistor 3420. For example, as shown in FIG. 36, contact 3418 may be routed to a resource by route 3430 (e.g., a routing shown by the dotted line). Route 3430 may be, for example, a metal layer route path in a first metal layer above transistor 3410 and transistor 3420. It should be noted that the dotted line depiction of route 3430 is provided as example of one resource (e.g., routing) in the metal layer and that the metal layer may include multiple resources (e.g., multiple routings). Additionally, only the first metal layer above transistor 3410 and transistor 3420 is depicted and there may be multiple additional metal routing above route 3430.

In various embodiments, transistor 3410 includes lower contact 3419 coupled to lower source/drain region 3412 and transistor 3420 includes lower contact 3429 coupled to lower source/drain region 3422. Contacts 3419, 3429 may be, for example, metal contacts. Contacts 3419, 3429 may be utilized to route to backside power routing layers (e.g., backside power routing 3440A or backside power routing 3440B, as shown in FIG. 36 and described herein) or to route to various other resources within device 3400.

In certain embodiments, device 3400 includes a backside power layer. In the illustrated embodiment of FIG. 36, the backside power layer includes backside power routing 3440A and backside power routing 3440B. Routing 3440A and routing 3440B may, for example, provided routing to/from power source (e.g., Vdd) and power ground (e.g., Vss) resources for device 3400.

In various embodiments, gate 3414 and gate 3424 are interconnected by gate bridge 3450. Gate bridge 3450 may be formed, for example, by extension of the gate material of gate 3414 and gate 3424 to couple the gates together. In some embodiments, gate bridge 3450 may be formed by a single extension of gate material from either gate 3414 or gate 3424 that is extended to the other gate. Gate bridge 3450 may also include extension of material for gate spacers. Gate bridge 3450 merges gate 3414 and gate 3424 for implementation of transistor 3410 and transistor 3420 in various embodiments of CMOS devices, some examples of which are described herein. Various embodiments may also be contemplated where gate 3414 and/or gate 3424 extend in other directions. For instance, a gate may include an extension that extends towards an outer boundary of device 3400 (e.g., towards an outer boundary of the cell structure in an opposite direction of gate bridge 3450).

In the illustrated embodiment of FIG. 37, device 3500 does not have a gate bridge connecting gate 3414 in transistor 3410 and gate 3424 in transistor 3420. Various techniques for connecting transistor 3410 and transistor 3420 may be contemplated without the gate bridge. For instance, in one contemplated embodiment, contact 3418 and contact 3428 may be connected by strap 3510. Strap 3510 may be, for example, a metal strap. In some embodiments, contact 3418, contact 3428, and strap 3510 may be formed as a single contact (e.g., a single strap connecting upper source/drain region 3416 and upper source/drain region 3426). Various embodiments may also be contemplated where strap 3510 extends in another direction from one of contacts 3418, 3428. For instance, strap 3510 may extend perpendicular to the depicted embodiment towards another vertical transistor or resource in device 3500.

In another contemplated embodiment, contact 3419 and contact 3429 may be connected by strap 3520. Strap 3520 may also be a metal strap. In some embodiments, strap 3520 is formed as a single contact along with contact 3419 and contact 3429. For example, strap 3520, contact 3419, and contact 3429 may be part of a single metal contact plate formed in the contact layer. Various embodiments may also be contemplated where contact 3419 and/or contact 3429 extends outwards from the bottoms of transistors 3410, 3420. For instance, a contact may have a portion that extends towards an outer boundary of device 3500 (e.g., towards an outer boundary of the cell structure).

It should be understood that while device 3400, shown in FIG. 36, and device 3500, shown in FIG. 37, are depicted with various connection structures separately, embodiments may be contemplated where structures from device 3400 are combined with structures from device 3500 in a cell design. For instance, a device may be contemplated that includes both gate bridge 3450 and one or both of strap 3510 and strap 3520. Various example device cell constructions are now described as example based on device 3400 and/or device 3500. It should be noted that the various device cell constructions are provided as example and that various additional device cell constructions may be implemented based on the description herein.

Figure 38:
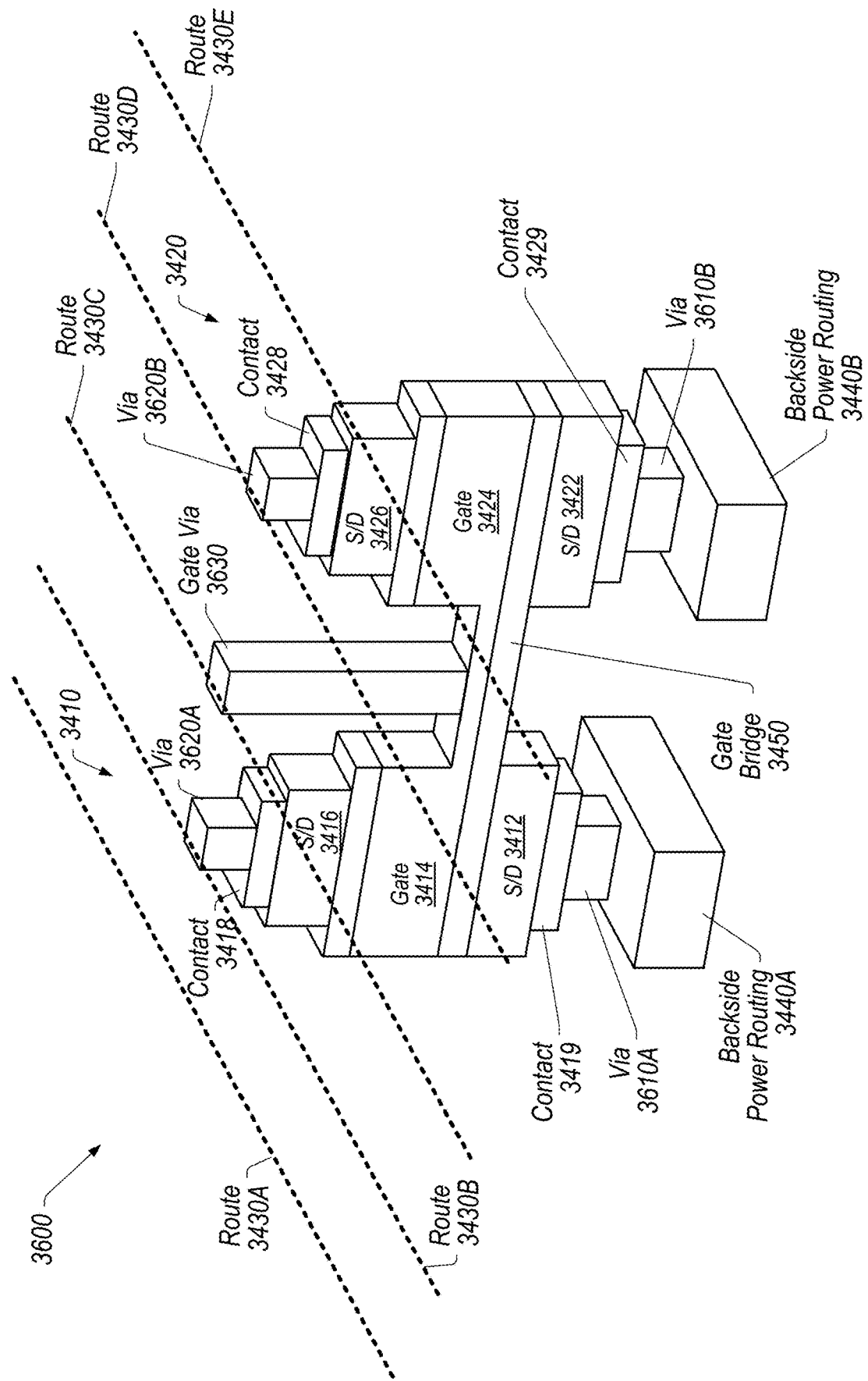
FIG. 38 depicts a perspective view representation of an inverter cell construction, according to some embodiments.
Figure 41:
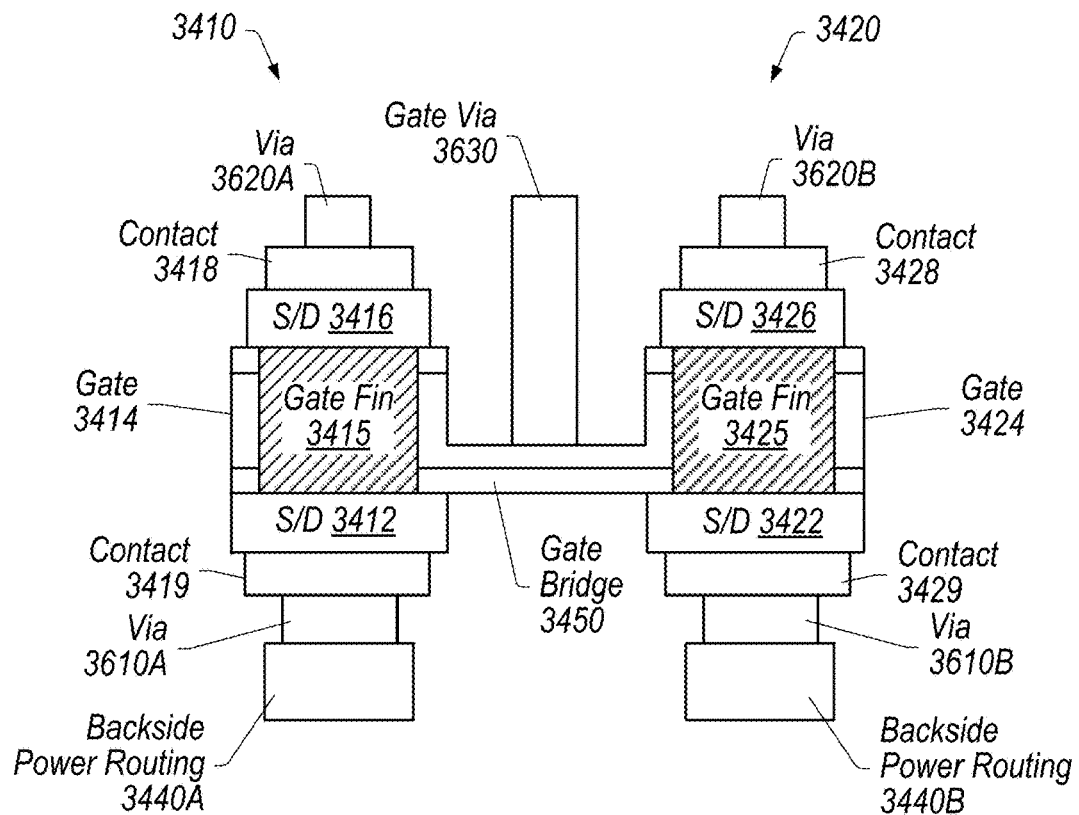
FIG. 41 depicts a cross-sectional representation of an inverter cell construction, according to some embodiments, along line 41-41 shown in FIG. 39.
Figure 42:
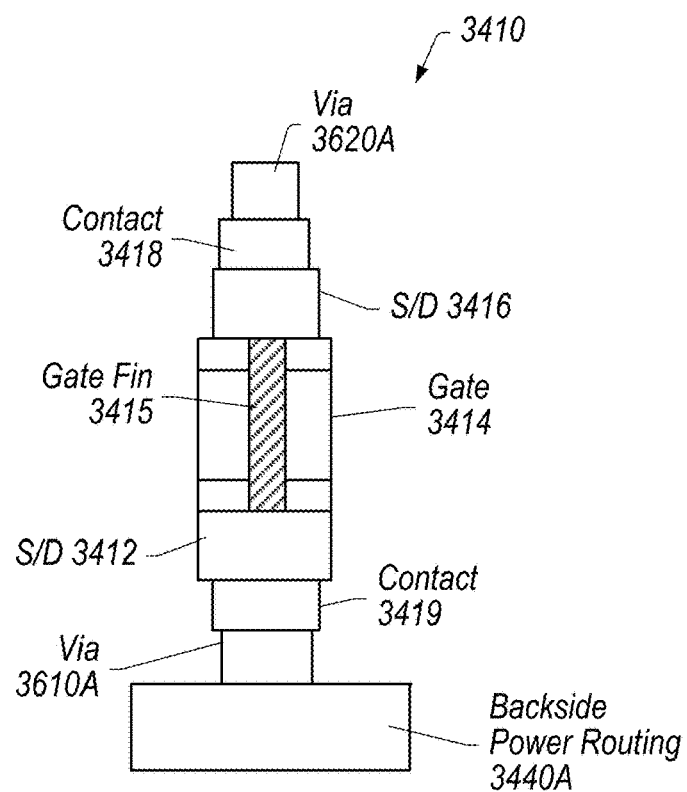
FIG. 42 depicts a cross-sectional representation of an inverter cell construction, according to some embodiments, along line 42-42 shown in FIG. 39.

FIGS. 38-42 depict representations of an inverter cell construction, according to some embodiments. FIG. 38 depicts a perspective view representation of the inverter cell construction, according to some embodiments. FIG. 39 depicts a topside plan view representation of the inverter cell construction, according to some embodiments. FIG. 40 depicts a backside plan view representation of the inverter cell construction, according to some embodiments. FIG. 41 depicts a cross-sectional representation of the inverter cell construction, according to some embodiments, along line 41-41 shown in FIG. 39 (e.g., along the gate bridge). FIG. 42 depicts a cross-sectional representation of the inverter cell construction, according to some embodiments, along line 42-42 shown in FIG. 39 (e.g., perpendicular to the gate fin of transistor 3410).

Inverter cell device 3600 may be derived from the structure of device 3400, shown in FIG. 36. In the illustrated embodiment of FIGS. 38-42, device 3600 includes vertical transistor 3410 and vertical transistor 3420. Transistor 3410 includes lower source/drain region 3412, gate 3414, upper source/drain region 3416, upper contact 3418, and lower contact 3419. Transistor 3420 includes lower source/drain region 3422, gate 3424, upper source/drain region 3426, upper contact 3428, and lower contact 3429. In the illustrated embodiment of device 3600, transistor 3410 is a PMOS transistor and transistor 3420 is an NMOS transistor.

In certain embodiments, device 3600 includes backside vias 3610A, 3610B. Backside via 3610A is coupled to lower source/drain region 3412 through lower contact 3419. Backside via 3610A couples lower source/drain region 3412 to backside power routing 3440A. For device 3600, backside power routing 3440A provides power supply (e.g., Vdd) to lower source/drain region 3412 and transistor 3410. Backside via 3610B is coupled to lower source/drain region 3422 through lower contact 3429. Backside via 3610B couples lower source/drain region 3422 to backside power routing 3440B. For device 3600, backside power routing 3440B provides ground supply (e.g., Vss) to lower source/drain region 3422 and transistor 3420.

In various embodiments, device 3600 includes topside vias 3620A, 3620B. Topside via 3620A may be coupled to upper source/drain region 3416 through upper contact 3418 and topside via 3620B may be coupled to upper source/drain region 3426 through upper contact 3428. Topside vias 3620A, 3620B may provide connection to signal routing resources (e.g., routes 3430A-E) in a first metal layer above transistor 3410 and transistor 3420. For example, in the illustrated embodiment, topside via 3620A is coupled to route 3430B and topside via 3620B is coupled to route 3430D. Routes 3430B and 3430D may provide routes for output signals from transistor 3410 and transistor 3420, respectively.

In certain embodiments, a route for an input signal to transistor 3410 and transistor 3420 is provided by route 3430C. As shown in FIGS. 38 and 39, route 3430C is coupled to gate via 3630, which is coupled to gate bridge 3450. Thus, gate via 3630 provides connection between route 3430C (e.g., the input signal route) and both gate 3414 in transistor 3410 and gate 3424 in transistor 3420. With the connections to the input signal route, the output signal routes, and the power supply/ground routes, transistor 3410 and transistor 3420 are connected to form the inverter cell device 3600.

It should be noted that while FIGS. 38 and 39 depict five routes 3430A-E in the first metal layer above transistor 3410 and transistor 3420, the first metal layer may include additional routes. Further, additional metal layers may be positioned above the first metal layer and provide various connections to either the first metal layer or device 3600. For example, in one embodiment, a metal layer above the first metal layer may include a strap (or other connector) coupling route 3430B and route 3430D such that the outputs of transistor 3410 and transistor 3420 are merged together into a single output. Additionally, while two backside power routings are shown (e.g., routing 3440A and routing 3440B), the backside power layer may include additional routings (e.g., routings for other power and signal resources).

The topside and backside plan views of device 3600 shown in FIGS. 39 and 40 further depict gate fins that may be present in the gates of the transistors. For example, gate fin 3415 is the gate fin for gate 3414 and gate fin 3425 is the gate fin for gate 3424. Gate fin 3415 and gate fin 3425 are also shown in the cross-sectional representation of device 3600 in FIG. 41 and gate fin 3415 is shown in the cross-sectional representation of transistor 3410 in FIG. 42. Note that the cross-section representation of FIG. 42 is perpendicular to the gate fin of transistor 3410, which is the direction of route 3430B, shown in FIGS. 38 and 39.

Figure 43:
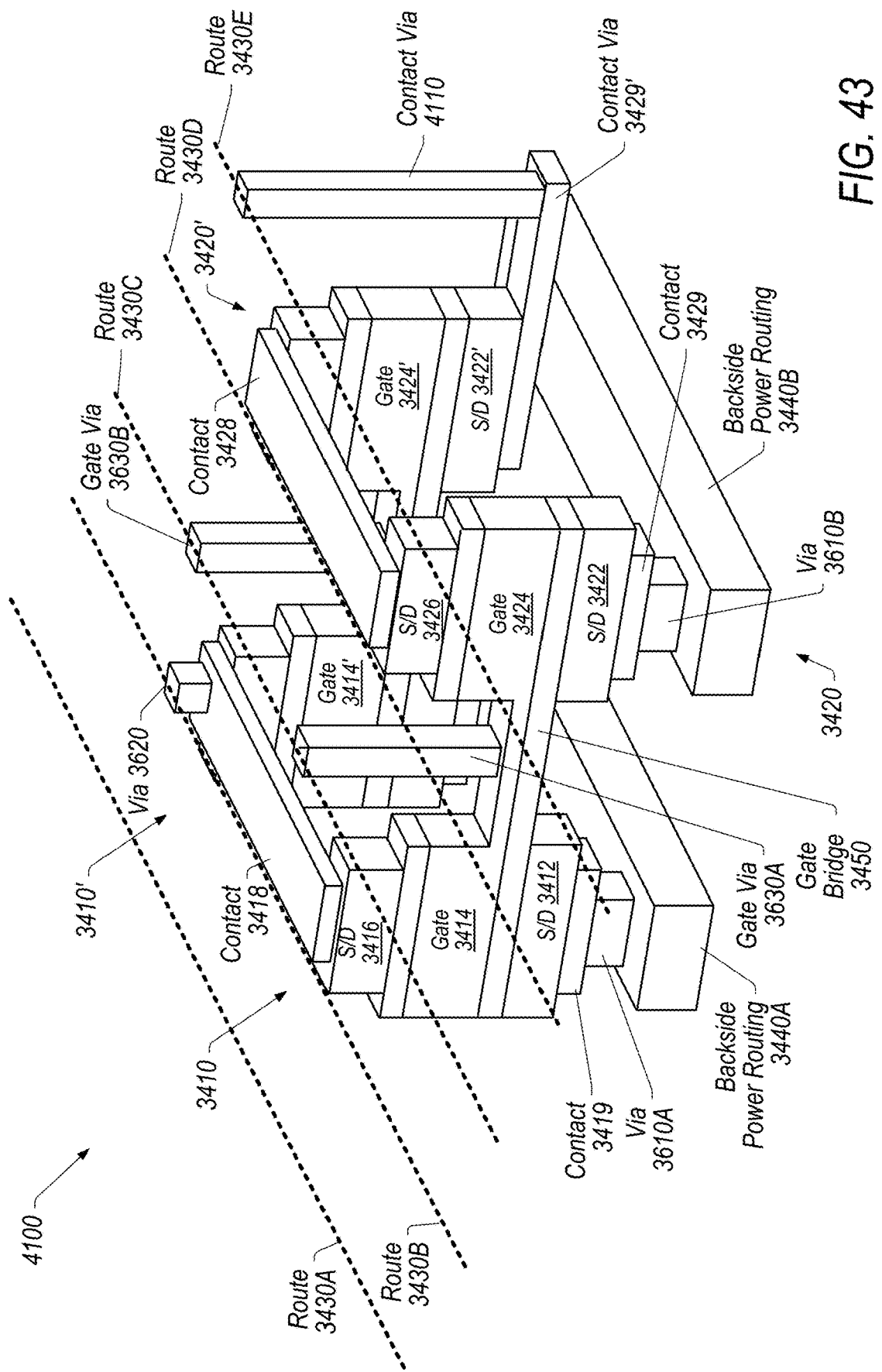
FIG. 43 depicts a perspective view representation of a NAND cell construction, according to some embodiments.
Figures 44, 45:
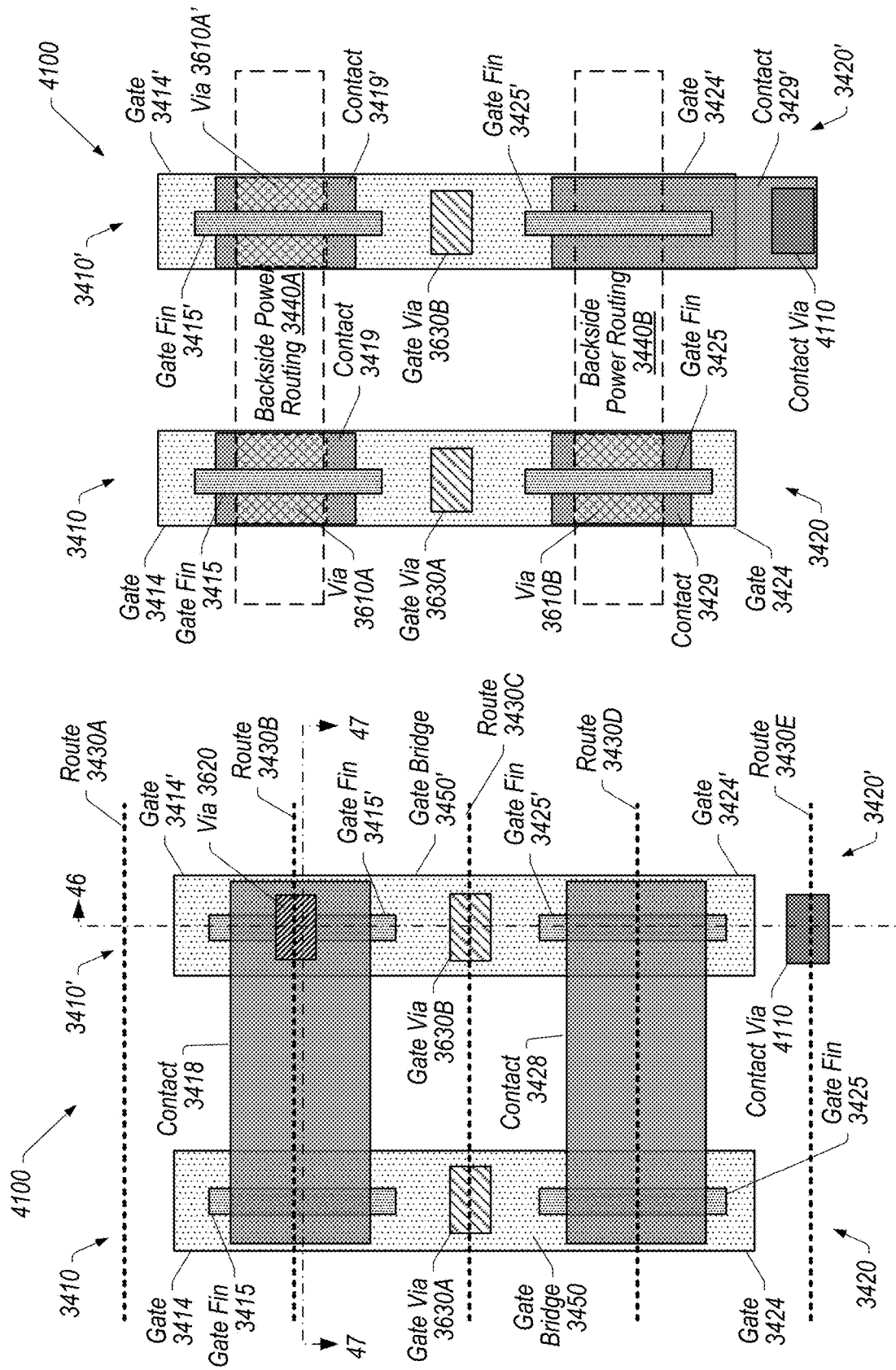
FIG. 44 depicts a topside plan view representation of a NAND cell construction, according to some embodiments.
FIG. 45 depicts a backside plan view representation of the NAND cell construction, according to some embodiments.
Figure 46:
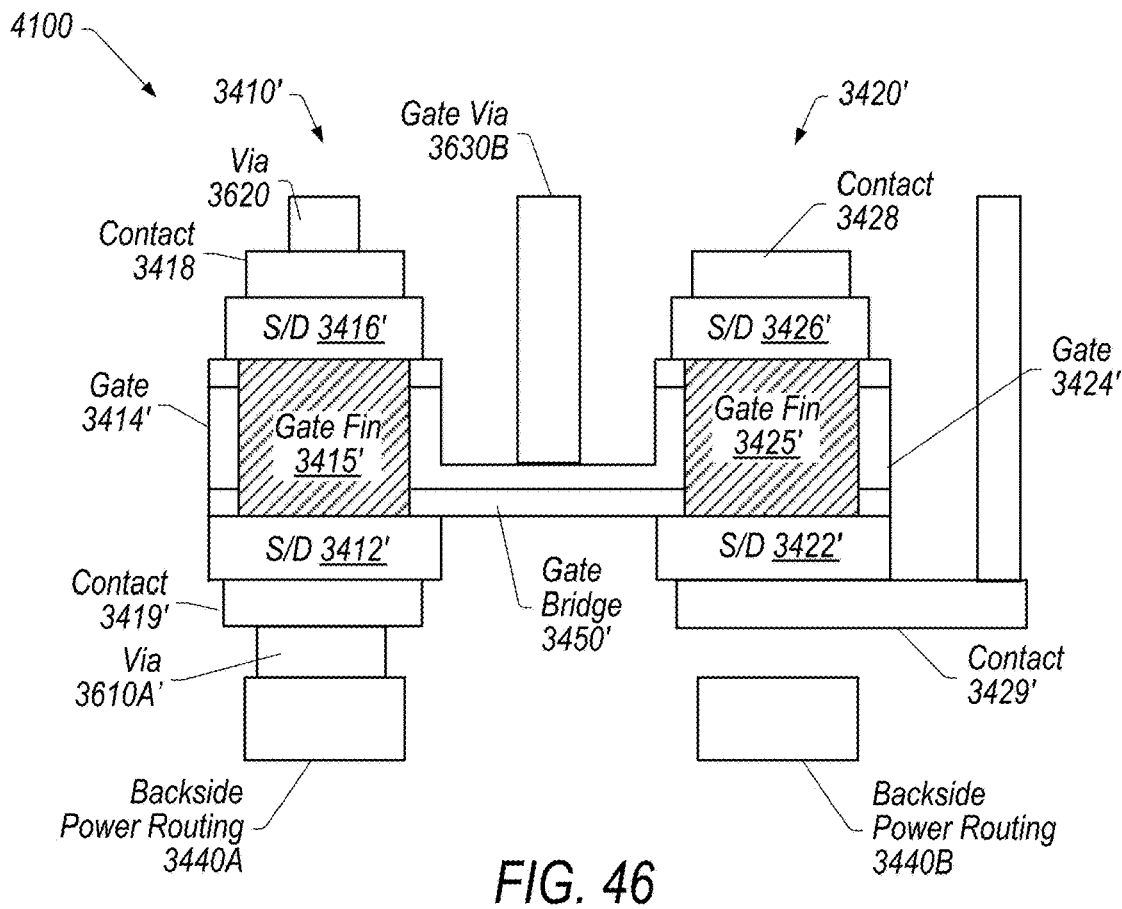
FIG. 46 depicts a cross-sectional representation of a NAND cell construction, according to some embodiments, along line 46-46 shown in FIG. 44.
Figure 47:
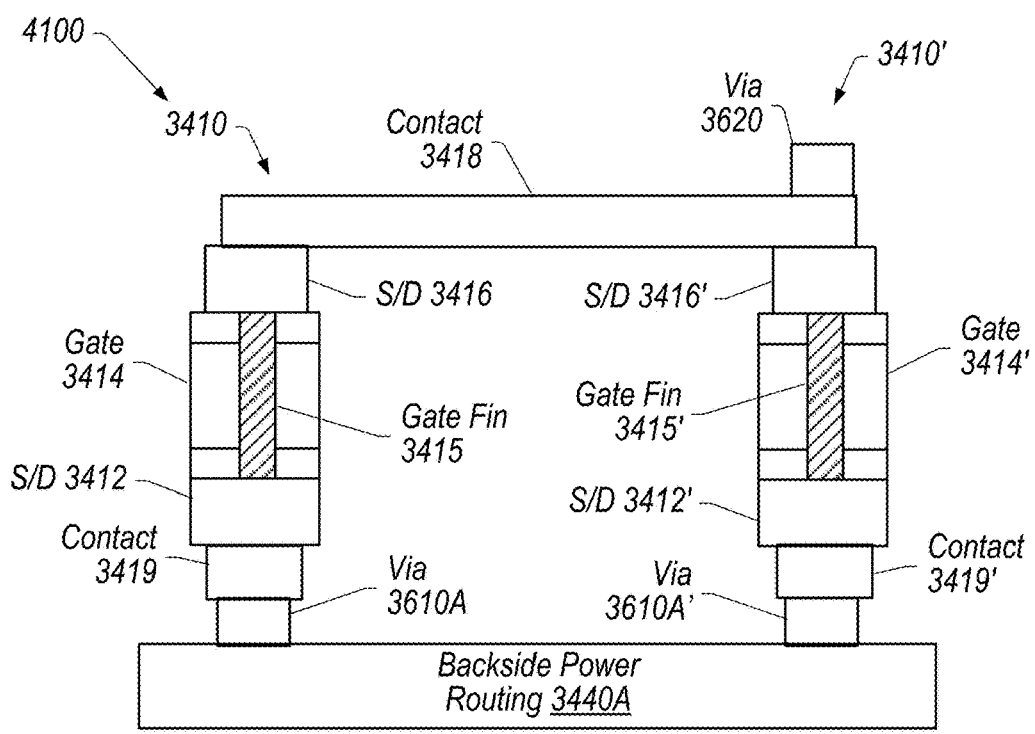
FIG. 47 depicts a cross-sectional representation of a NAND cell construction, according to some embodiments, along line 47-47 shown in FIG. 44.

FIGS. 43-47 depict representations of a NAND cell construction, according to some embodiments. FIG. 43 depicts a perspective view representation of the NAND cell construction, according to some embodiments. FIG. 44 depicts a topside plan view representation of the NAND cell construction, according to some embodiments. FIG. 45 depicts a backside plan view representation of the NAND cell construction, according to some embodiments. FIG. 46 depicts a cross-sectional representation of the NAND cell construction, according to some embodiments, along line 46-46 shown in FIG. 44 (e.g., along gate bridge 3450'). FIG. 47 depicts a cross-sectional representation of the NAND cell construction, according to some embodiments, along line 47-47 shown in FIG. 44 (e.g., perpendicular to the gate fins of transistor 3410 and transistor 3410').

NAND cell device 4100 may be derived from the structure of device 3400, shown in FIG. 36. In the illustrated embodiment of FIGS. 43-47, device 4100 includes vertical transistor 3410, vertical transistor 3420, vertical transistor 3410', and vertical transistor 3420'. Transistor 3410 includes lower source/drain region 3412, gate 3414, and upper source/drain region 3416. Transistor 3420 includes lower source/drain region 3422, gate 3424, and upper source/drain region 3426. Transistor 3410' includes lower source/drain region 3412', gate 3414', and upper source/drain region 3416'. Transistor 3420' includes lower source/drain region 3422', gate 3424', and upper source/drain region 3426'. In the illustrated embodiment of device 4100, transistor 3410 and transistor 3410' are PMOS transistors and transistor 3420 and transistor 3420' are NMOS transistors.

In certain embodiments, route for input signals to transistor 3410, transistor 3410', transistor 3420, and transistor 3420' are provided by route 3430C. As shown in FIGS. 43 and 44, route 3430C is coupled to gate via 3630A, which is coupled to gate bridge 3450, and gate via 3630B, which is coupled to gate bridge 3450'. Thus, gate via 3630A provides connection between route 3430C (e.g., the input signal route) and both gate 3414 in transistor 3410 and gate 3424 in transistor 3420. Gate via 3630B provides connection between route 3430C (e.g., the input signal route) and both gate 3414' in transistor 3410' and gate 3424' in transistor 3420'.

In certain embodiments, upper source/drain region 3416 of transistor 3410 and upper source/drain region 3416' of transistor 3410' are connected by contact 3418. Similarly, upper source/drain region 3426 of transistor 3420 and upper source/drain region 3426' of transistor 3420' are connected by contact 3428. In various embodiments, device 4100 includes topside via 3620 connected to contact 3418. Topside via 3620 may provide connection to route 3430B in the first metal layer above the transistor region of device 4100. In the illustrated embodiment, route 3430B provides a route for output signals from transistor 3410 and transistor 3410'.

In the illustrated embodiment, only transistor 3410, transistor 3410', and transistor 3420 are connected to backside layers. For instance, transistor 3410 is connected to backside power routing 3440A by contact 3419 and backside via 3610A, transistor 3410' is connected to backside power routing 3440A by contact 3419' and backside via 3610A', and transistor 3420 is connected to backside power routing 3440B by contact 3429 and backside via 3610B, as shown in FIGS. 42 and 45. In various embodiments of device 4100, backside power routing 3440A provides power supply (e.g., Vdd) to lower source/drain region 3412 and transistor 3410 and to lower source/drain region 3412' and transistor 3410' while backside power routing 3440B provides ground supply (e.g., Vss) to lower source/drain region 3422 and transistor 3420.

In certain embodiments, lower source/drain region 3422' in transistor 3420' is connected to contact 3429', which is not connected to a backside power routing layer. Contact 3429' extends away from lower source drain region 3422' and towards a boundary of the cell, as shown in FIGS. 43, 45, and 46. Contact 3429' is then coupled to route 3430E by contact via 4110. Route 3430E is a route in the first metal layer above the transistor region. Contact via 4110 is a via that belongs to the cell structure of device 4100 and is not shared with any neighboring cells along the cell boundary. In certain embodiments, route 3430E is a signal route in the first metal layer for signal output from transistor 3420'. Thus, a signal in the NMOS transistors (e.g., transistor 3420 and transistor 3420') routes from lower source/drain region 3422 (connected to ground by backside power routing 3440B), through the transistors, and out through contact via 4110 to route 3430E.

In the illustrated embodiment, route 3430E provides a route for output signals from transistor 3420 and transistor 3420'. The output signals routed through route 3430E may be combined with output signals from route 3430B. For example, a metal layer above the first metal layer may include a strap (or other connector) coupling route 3430B and route 3430E such that the outputs of the transistors are merged together into a single output.

The various routings and connections in device 4100 form the NAND cell device. FIGS. 44 and 45 illustrate gate fins 3415, 3415', 3425, 3425' in gates 3414, 3414', 3424, 3424', respectively. Gate fins 3415' and gate fin 3425' are also shown in the cross-sectional representation of device 4100 in FIG. 46. Gate fin 3415 and gate fin 3415' are shown in the cross-sectional representation of device 4100 in FIG. 47. Note that the cross-section representation of FIG. 47 is perpendicular to the gate fins of transistor 3410 and transistor 3410', which is the direction of route 3430B, shown in FIG. 44.

Figure 48:
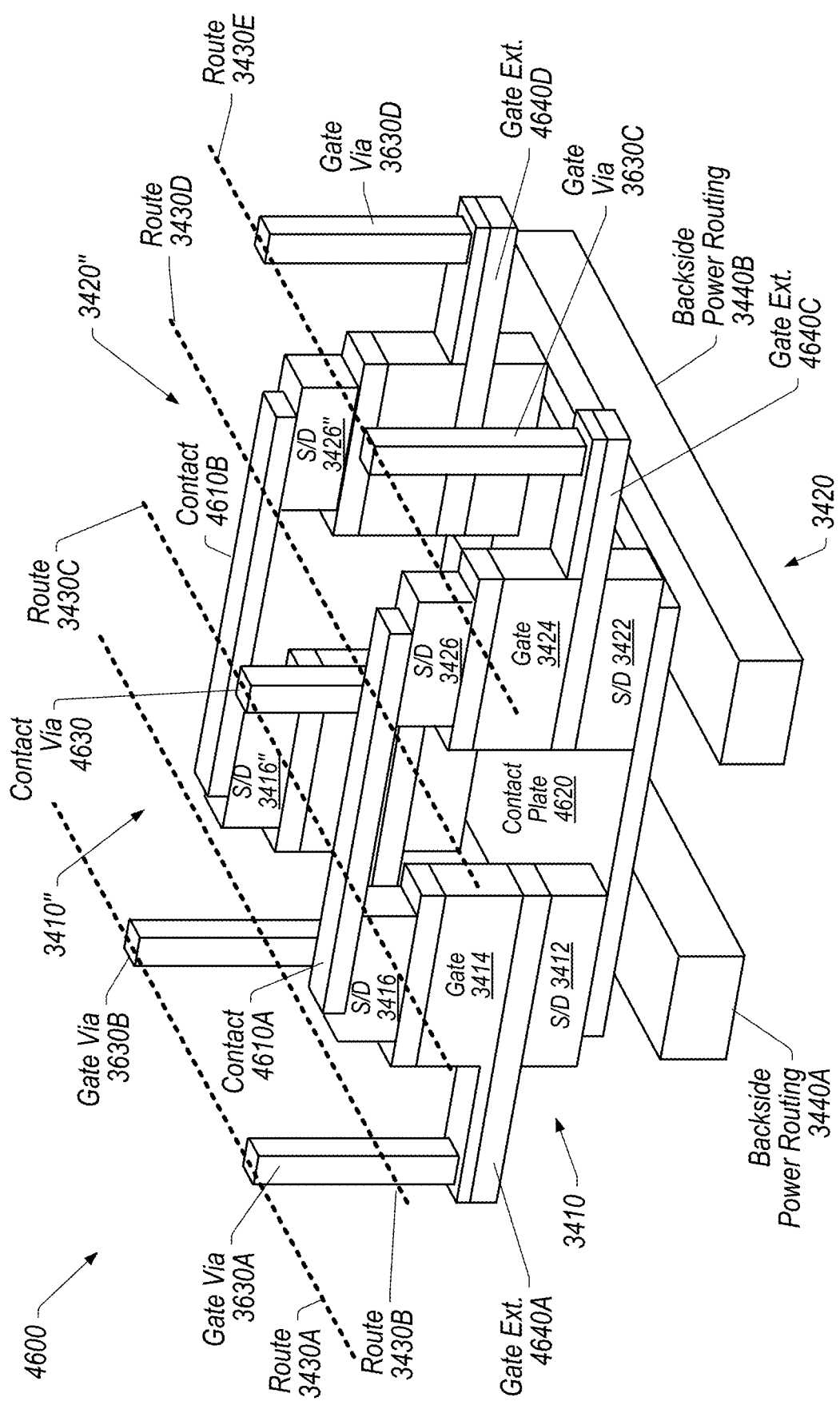
FIG. 48 depicts a perspective view representation of a MUX cell construction, according to some embodiments.
Figure 51:
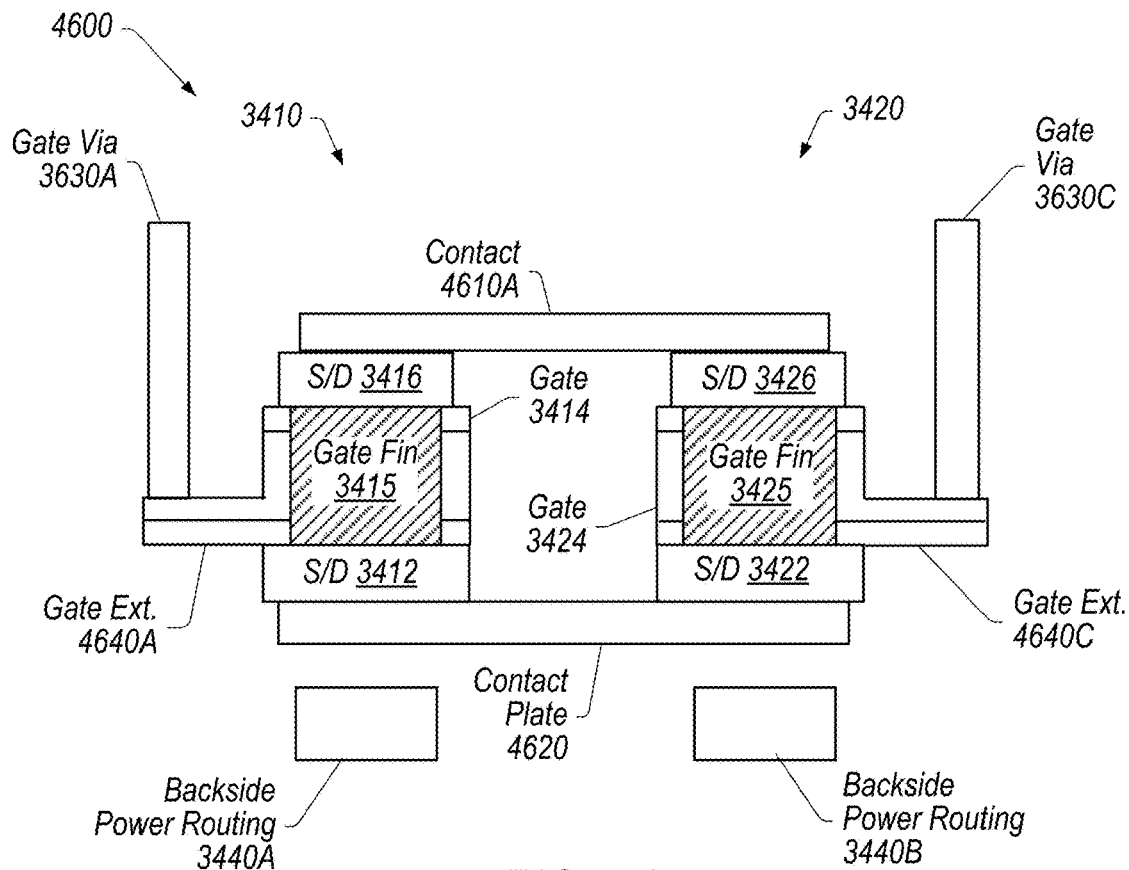
FIG. 51 depicts a cross-sectional representation of a MUX cell construction, according to some embodiments, along line 51-51 shown in FIG. 49.
Figure 52:
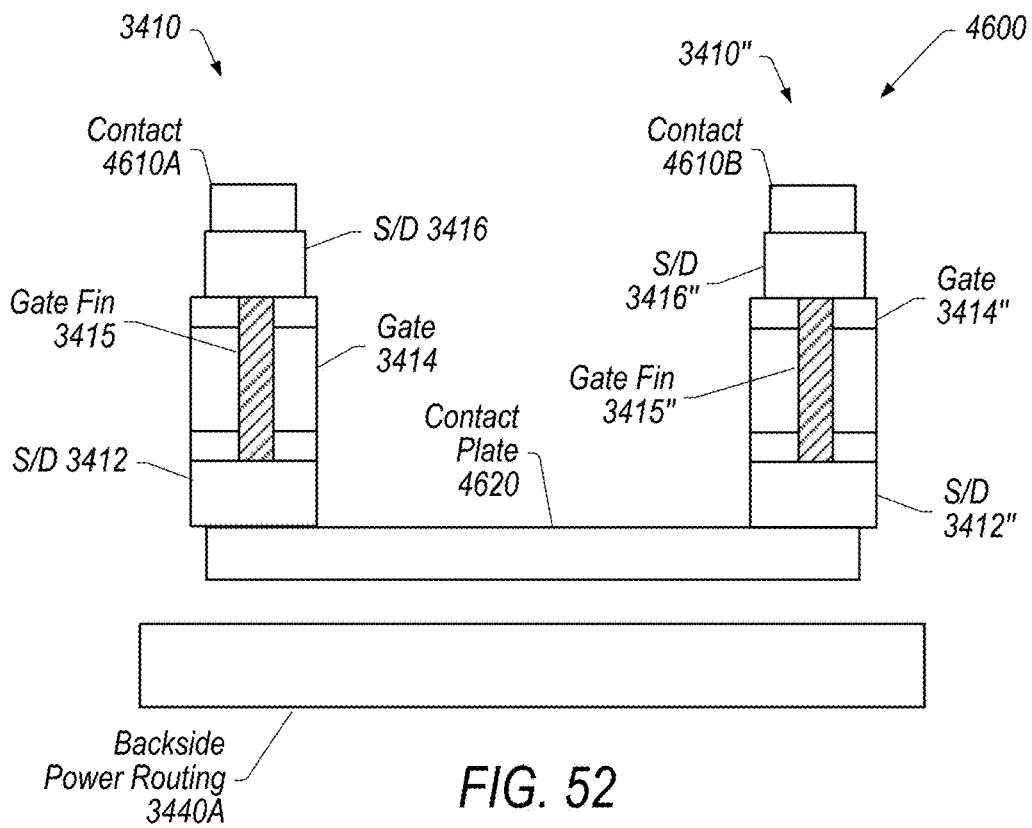
FIG. 52 depicts a cross-sectional representation of a MUX cell construction, according to some embodiments, along line 52-52 shown in FIG. 49.

FIGS. 48-52 depict representations of a MUX (multiplexer) cell construction, according to some embodiments. FIG. 48 depicts a perspective view representation of the MUX cell construction, according to some embodiments. FIG. 49 depicts a topside plan view representation of the MUX cell construction, according to some embodiments. FIG. 50 depicts a backside plan view representation of the MUX cell construction, according to some embodiments. FIG. 51 depicts a cross-sectional representation of the MUX cell construction, according to some embodiments, along line 51-51 shown in FIG. 49 (e.g., along gate fin 3415' and gate fin 3425"). FIG. 52 depicts a cross-sectional representation of the MUX cell construction, according to some embodiments, along line 52-52 shown in FIG. 49 (e.g., perpendicular to the gate fins of transistor 3410 and transistor 3410").

MUX cell device 4600 may be derived from the structure of device 3500, shown in FIG. 37. In the illustrated embodiment of FIGS. 48-52, device 4600 includes vertical transistor 3410, vertical transistor 3420, vertical transistor 3410", and vertical transistor 3420". As in device 3500, there are gate bridges between gates of the transistors in device 4600 so that there are no common gates between complementary type transistors. Transistor 3410 includes lower source/drain region 3412, gate 3414, and upper source/drain region 3416. Transistor 3420 includes lower source/drain region 3422, gate 3424, and upper source/drain region 3426. Transistor 3410" includes lower source/drain region 3412", gate 3414", and upper source/drain region 3416". Transistor 3420" includes lower source/drain region 3422", gate 3424", and upper source/drain region 3426". In the illustrated embodiment of device 4600, transistor 3410 and transistor 3410" are PMOS transistors and transistor 3420 and transistor 3420" are NMOS transistors.

As MUX cell device 4600 is a transmission device, none of transistor 3410 and transistor 3410" and none of transistor 3420 and transistor 3420" are connected to any power in the MUX cell structure. In various embodiments of MUX cell device 4600, the lower source/drain regions of the transistors are connected together (e.g., merged together). For instance, in the illustrated embodiment, contact plate 4620 is connected to lower source/drain region 3412 in transistor 3410, lower source/drain region 3412" in transistor 3410", lower source/drain region 3422 in transistor 3420, and lower source/drain region 3422" in transistor 3420".

In certain embodiments, contact via 4630 is coupled to contact plate 4620. Contact via 4630 may be connected to contact plate 4620 at or near a center of the contact plate. Contact via 4630 then connects to route 3430C in the first metal layer above the transistor region. In various embodiments, route 3430C provides output routing for MUX cell device 4600. Thus, contact via 4630 may be referred to as an output pin of MUX cell device 4600.

In various embodiments, gates 3414, 3414", 3424, 3424" are extended towards the boundary of the cell to provide surfaces for direct vertical connections to the gates from routes in the first metal layer above. For example, as illustrated in FIGS. 48-52, gate 3414 includes gate extension 4640A that extends toward the boundary of the cell (e.g., extends horizontally towards the boundary of the cell). Similarly, gate 3414" includes gate extension 4640B, gate 3424 includes gate extension 4640C, and gate 3424" includes gate extension 4640D. The gate extensions 4640A-D are then connected to routes in the first metal layer above by gate vias 3630A-D, respectively. For example, as shown in FIGS. 48 and 49, gate via 3630A connects gate extension 4640A to route 3430A, gate via 3630B connects gate extension 4640B to route 3430A, gate via 3630C connects gate extension 4640C to route 3430E, and gate via 3630D connects gate extension 4640D to route 3430E. One or both of route 3430A and route 3430E are located at the boundary of the cell and are not shared with neighboring cells. Route 3430A and route 3430E may provide input routes to device 4600.

In certain embodiments, upper source/drain region 3416 in transistor 3410 is connected to upper source/drain region 3426 in transistor 3420 by contact 4610A. This connection merges upper source/drain region 3416 with upper source/drain region 3426. Similarly, upper source/drain region 3416" in transistor 3410" is connected to upper source/drain region 3426" in transistor 3420" by contact 4610B. With the merging of these upper source/drain regions and the common connection between the lower source/drain regions (and single output through contact via 4630), device 4600 may operate as a MUX (multiplexer) where signals are input through gate vias 3630A-D and output through contact via 4630.

FIGS. 49 and 50 illustrate gate fins 3415, 3415", 3425, 3425" in gates 3414, 3414", 3424, 3424", respectively. Gate fins 3415 and gate fin 3425 are also shown in the cross-sectional representation of device 4600 in FIG. 51 and gate fin 3415 and gate fin 3415" are shown in the cross-sectional representation of device 4600 in FIG. 52. Note that the cross-section representation of FIG. 52 is perpendicular to the gate fins of transistor 3410 and transistor 3410", which is the direction of route 3430B, shown in FIG. 49.

Figure 53:
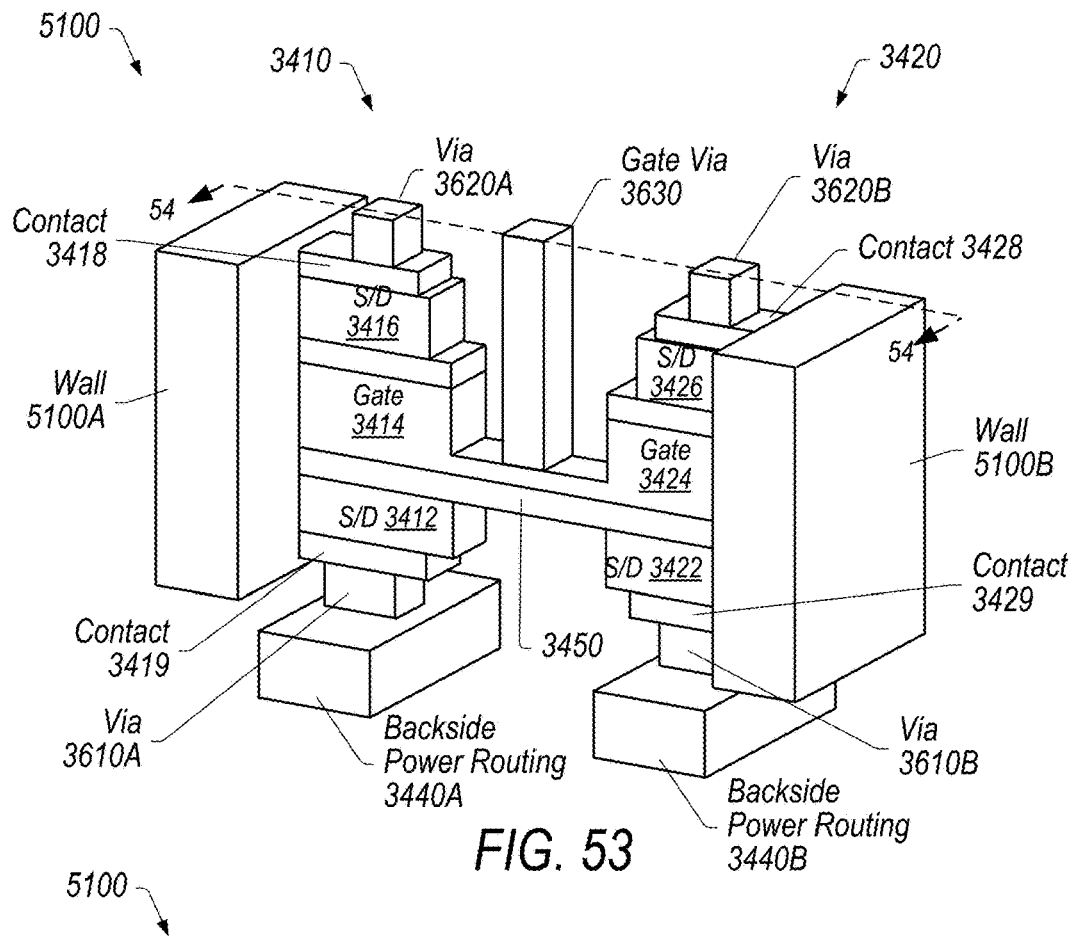
FIG. 53 depicts a perspective view representation of a device, according to some embodiments.
Figure 54:
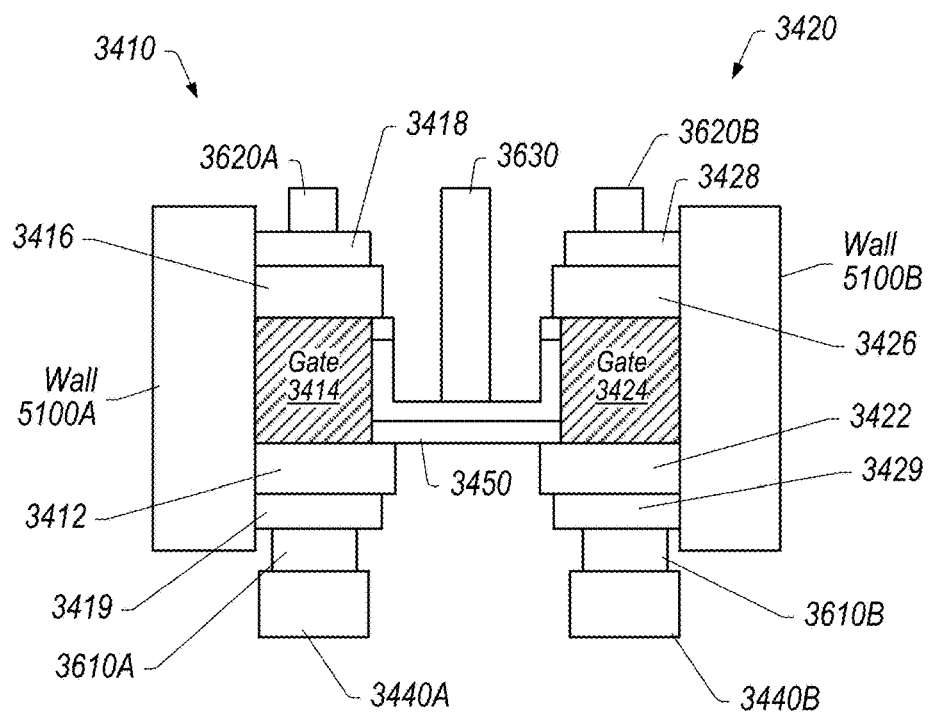
FIG. 54 depicts a cross-sectional representation of a device, according to some embodiments, along line 54-54 shown in FIG. 53.

FIGS. 53 and 54 depict representations of a cell device having dielectric walls, according to some embodiments. FIG. 53 depicts a perspective view representation of device 5100, according to some embodiments. FIG. 54 depicts a cross-sectional representation of device 5100, according to some embodiments, along line 54-54 shown in FIG. 53 (e.g., along gate bridge 3450').

Device 5100 may be derived from the structure of device 3400, shown in FIG. 36. In some embodiments, device 5100 may be similar to the inverter cell device 4100, shown in FIGS. 43-47. In the illustrated embodiment of FIGS. 53 and 54, device 5100 includes vertical transistor 3410 and vertical transistor 3420. Transistor 3410 includes lower source/drain region 3412, gate 3414, and upper source/drain region 3416. Transistor 3420 includes lower source/drain region 3422, gate 3424, and upper source/drain region 3426. In certain embodiments, transistor 3410 is a PMOS transistor and transistor 3420 is an NMOS transistor.

In various embodiments, as shown in FIGS. 53 and 54, wall 5100A may be positioned on one a first side of the cell (e.g., on a side of transistor 3410) and wall 5100B may be positioned on a second side of the cell (e.g., on a side of transistor 3420 opposite transistor 3410). In certain embodiments, wall 5100A and wall 5100B are dielectric walls. Placing dielectric walls on one or both sides of device 5100 may reduce the space needed between device 5100 and another neighboring cell. Accordingly, wall 5100A and wall 5100B may be implemented when reducing in scaling of devices is necessary.

Example Computer System

Figure 55:
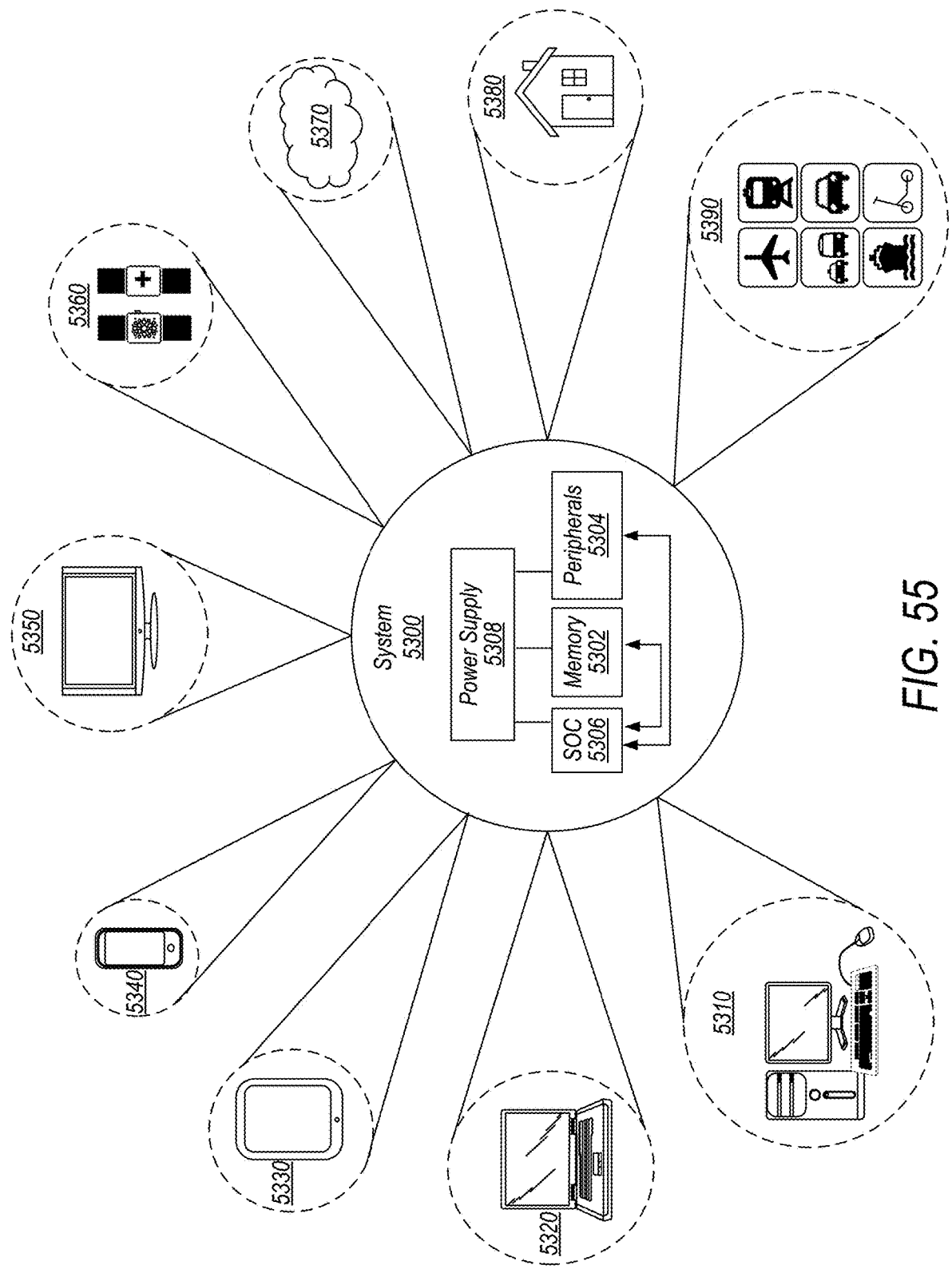
FIG. 55 is a block diagram of one embodiment of an example system.

Turning next to FIG. 55, a block diagram of one embodiment of a system 5300 is shown that may incorporate and/or otherwise utilize the methods and mechanisms described herein. In the illustrated embodiment, the system 5300 includes at least one instance of a system on chip (SoC) 5306 which may include multiple types of processing units, such as a central processing unit (CPU), a graphics processing unit (GPU), or otherwise, a communication fabric, and interfaces to memories and input/output devices. In some embodiments, one or more processors in SoC 5306 includes multiple execution lanes and an instruction issue queue. In various embodiments, SoC 5306 is coupled to external memory 5302, peripherals 5304, and power supply 5308.

A power supply 5308 is also provided which supplies the supply voltages to SoC 5306 as well as one or more supply voltages to the memory 5302 and/or the peripherals 5304. In various embodiments, power supply 5308 represents a battery (e.g., a rechargeable battery in a smart phone, laptop or tablet computer, or other device). In some embodiments, more than one instance of SoC 5306 is included (and more than one external memory 5302 is included as well).

The memory 5302 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 5304 include any desired circuitry, depending on the type of system 5300. For example, in one embodiment, peripherals 5304 includes devices for various types of wireless communication, such as Wi-Fi, Bluetooth, cellular, global positioning system, etc. In some embodiments, the peripherals 5304 also include additional storage, including RAM storage, solid state storage, or disk storage. The peripherals 5304 include user interface devices such as a display screen, including touch display screens or multi-touch display screens, keyboard or other input devices, microphones, speakers, etc.

As illustrated, system 5300 is shown to have application in a wide range of areas. For example, system 5300 may be utilized as part of the chips, circuitry, components, etc., of a desktop computer 5310, laptop computer 5320, tablet computer 5330, cellular or mobile phone 5340, or television 5350 (or set-top box coupled to a television). Also illustrated is a smartwatch and health monitoring device 5360. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 5300 may further be used as part of a cloud-based service(s) 5370. For example, the previously mentioned devices, and/or other devices, may access computing resources in the cloud (i.e., remotely located hardware and/or software resources). Still further, system 5300 may be utilized in one or more devices of a home 5380 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 55 is the application of system 5300 to various modes of transportation 5390. For example, system 5300 may be used in the control and/or entertainment systems of aircraft, trains, buses, cars for hire, private automobiles, waterborne vessels from private boats to cruise liners, scooters (for rent or owned), and so on. In various cases, system 5300 may be used to provide automated guidance (e.g., self-driving vehicles), general systems control, and otherwise. These any many other embodiments are possible and are contemplated. It is noted that the devices and applications illustrated in FIG. 55 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. A memory apparatus, comprising:
a plurality of bit cells, wherein the bit cells include a first set of first transistors formed in a first transistor region and a second set of second transistors formed in a second transistor region, the second transistor region being positioned below the first transistor region in a vertical dimension perpendicular to the plurality of bit cells, wherein the plurality of bit cells are divided into at least a first array of bit cells and a second array of bit cells;
a first metal layer located below the plurality of bit cells in the vertical dimension, wherein the first metal layer includes first routing coupled to bitline outputs of the first array of bit cells;
a second metal layer located above the plurality of bit cells in the vertical dimension, wherein the second metal layer includes second routing coupled to bitline outputs of the second array of bit cells;
a first column input/output logic cell coupled to the bitline outputs of the first array of bit cells by the first routing; and
a second column input/output logic cell coupled to the bitline outputs of the second array of bit cells by the second routing;
wherein the first array of bit cells are positioned further away from the first column input/output logic cell and the second column input/output logic cell than the second array of bit cells.

2. The memory apparatus of claim 1, wherein outputs of the first column input/output logic cell are coupled to outputs of the second column input/output logic cell.

3. The memory apparatus of claim 1, wherein the bitline outputs of the first array of bit cells include outputs from a pair of complementary bitlines coupled to the first array of bit cells.

4. The memory apparatus of claim 1, wherein the bitline outputs of the second array of bit cells include outputs from a pair of complementary bitlines coupled to the second array of bit cells.

5. The memory apparatus of claim 1, wherein the bitline outputs of the first array of bit cells and the bitline outputs of the second array of bit cells are outputs of at least some first transistors.

6. The memory apparatus of claim 1, wherein the bitline outputs of the first array of bit cells are coupled to a pair of bitlines positioned in the second metal layer, the memory apparatus further comprising:
a first pair of connections between the bitlines in the second metal layer and the first routing in the first metal layer near the first array of bit cells.

7. The memory apparatus of claim 6, wherein the first pair of connections are positioned in a pair of first dummy cells near a boundary between the first array of bit cells and the second array of bit cells.

8. The memory apparatus of claim 1, further comprising:
a second pair of connections between the second routing in the second metal layer and inputs of the second column input/output logic cell near the second column input/output logic cell, the inputs of the second column input/output logic cell being positioned in the second transistor region.

9. The memory apparatus of claim 8, wherein the second pair of connections are positioned in a second dummy cell near a boundary between the first column input/output logic cell and the second column input/output logic cell.

10. The memory apparatus of claim 1, wherein the first array of bit cells is adjacent to the second array of bit cells in a horizontal dimension perpendicular to the vertical dimension, and wherein the first column input/output logic cell is adjacent to the second column input/output logic cell in the horizontal dimension.

11. The memory apparatus of claim 1, wherein the first column input/output logic cell includes:
a third set of first transistors formed in the first transistor region; and
a fourth set of second transistors formed in the second transistor region;
wherein inputs of the first transistors and inputs of the second transistors are merged and coupled to the bitline outputs of the first array of bit cells by the first routing.

12. The memory apparatus of claim 11, wherein gates of at least two of the first transistors are coupled by routing in the second metal layer.

13. The memory apparatus of claim 11, wherein the third set of first transistors includes two first transistors, and wherein the fourth set of second transistors includes five second transistors.

14. The memory apparatus of claim 1, wherein at least one of the bit cells includes four first transistors and two second transistors, the bit cell having:
a first pass gate formed by a first one of the first transistors;
a second pass gate formed by a second one of the first transistors;
a first inverter formed by a third one of the first transistors and a first one of the second transistors; and
a second inverter formed by a fourth one of the first transistors and a second one of the second transistors;
wherein an input of the first inverter is cross-coupled with an output of the second inverter, and wherein an input of the second inverter is cross-coupled with an output of the first inverter.

15. An input/output logic cell for a memory apparatus, comprising:
a pair of first transistors formed in a first transistor region, wherein the first transistors include first input source/drain regions, first output source/drain regions, and first gates;
a set of five second transistors formed in a second transistor region, wherein the second transistors include second input source/drain regions, second output source/drain regions, and second gates, and wherein the second transistor region is positioned below the first transistor region in a vertical dimension;
a first metal layer located below the second transistor region in the vertical dimension, wherein the first metal layer includes first routing coupled to bitline outputs of a first array of bit cells; and
a second metal layer located above the first transistor region in the vertical dimension;
wherein the first input source/drain regions of the first transistors and the second input source/drain regions of the second transistors are merged, and wherein the merged source/drain regions are coupled to the bitline outputs of the first array of bit cells by the first routing;
wherein the gates of the pair of first transistors are coupled by routing in the second metal layer, and wherein the gates of at least two of the second transistors are coupled by routing in the first metal layer.

16. The input/output logic cell of claim 15, further comprising a second input/output logic cell for the memory apparatus, the second input/output logic cell comprising:
a second pair of first transistors formed in the first transistor region; and
a second set of five second transistors formed in the second transistor region.

17. The input/output logic cell of claim 16, wherein the second metal layer includes second routing coupled to the bitline outputs of a second array of bit cells, and wherein the merged source/drain regions in the second input/output logic cell are coupled to the bitline outputs of the second array of bit cells by the second routing.

18. A memory apparatus, comprising:
a plurality of bit cells, wherein the bit cells include a first set of first transistors formed in a first transistor region and a second set of second transistors formed in a second transistor region, the second transistor region being positioned below the first transistor region in a vertical dimension perpendicular to the plurality of bit cells, wherein the plurality of bit cells are divided into at least a first array of bit cells and a second array of bit cells;
a first metal layer located below the plurality of bit cells in the vertical dimension, wherein the first metal layer includes first routing;
a second metal layer located above the plurality of bit cells in the vertical dimension, wherein the second metal layer includes second routing coupled to bitline outputs of the second array of bit cells;
a pair of bitlines positioned in the second metal layer, the pair of bitlines being coupled to the bitline outputs of the first array of bit cells; and
a pair of connections between the bitlines in the second metal layer and the first routing in the first metal layer near the first array of bit cells.

19. The memory apparatus of claim 18, wherein the pair of connections are positioned in a pair of dummy cells near a boundary between the first array of bit cells and the second array of bit cells.

20. The memory apparatus of claim 19, wherein the pair of connections include trench metals in the pair of dummy cells.

* * * * *